(12) United States Patent
Mori et al.

(10) Patent No.: US 6,587,975 B2
(45) Date of Patent: *Jul. 1, 2003

(54) SEMICONDUCTOR TEST APPARATUS AND METHOD

(75) Inventors: Hisaya Mori, Hyogo (JP); Teruhiko Funakura, Tokyo (JP)

(73) Assignees: Mitsubishi Denki Kabushiki Kaisha, Tokyo (JP); Ryoden Semiconductor System Engineering Corporation, Itami (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/346,268

(22) Filed: Jul. 1, 1999

(65) Prior Publication Data

US 2003/0070121 A1 Apr. 10, 2003

(30) Foreign Application Priority Data

Jan. 25, 1999 (JP) ............................................. 11-015528

(51) Int. Cl.⁷ ............................. G11C 29/00; G11C 7/00
(52) U.S. Cl. ....................................... 714/423; 365/201
(58) Field of Search ................................ 714/723, 710, 714/711; 365/201, 200

(56) References Cited

U.S. PATENT DOCUMENTS

| | | | | |
|---|---|---|---|---|
| 4,380,066 A | * | 4/1983 | Spencer et al. | 714/6 |
| 4,736,373 A | * | 4/1988 | Schmidt | 714/711 |
| 4,876,685 A | * | 10/1989 | Rich | 714/723 |
| 5,233,614 A | * | 8/1993 | Singh | 714/723 |
| 5,317,573 A | * | 5/1994 | Bula et al. | 714/711 |
| 5,337,318 A | * | 8/1994 | Tsukakoshi et al. | 714/708 |
| 5,539,699 A | * | 7/1996 | Sato et al. | 365/201 |
| 5,544,119 A | * | 8/1996 | Wells et al. | 365/185.11 |
| 5,646,948 A | * | 7/1997 | Kobayashi et al. | 714/719 |
| 5,721,741 A | * | 2/1998 | Deas | 714/724 |
| 5,812,460 A | * | 9/1998 | Kobatake | 365/185.29 |
| 5,896,398 A | * | 4/1999 | Sekine | 714/720 |
| 5,917,764 A | * | 6/1999 | Ohsawa et al. | 365/200 |
| 5,991,206 A | * | 11/1999 | Shin | 365/182.29 |
| 5,991,218 A | * | 11/1999 | Kushiyama | 365/222 |
| 6,115,833 A | * | 9/2000 | Sato et al. | 714/718 |
| 6,161,195 A | * | 12/2000 | Konishi et al. | 714/7 |
| 6,222,772 B1 | * | 4/2001 | Choi et al. | 365/185.22 |
| 6,292,392 B1 | * | 9/2001 | Fukui | 365/185.11 |

FOREIGN PATENT DOCUMENTS

| | | |
|---|---|---|
| JP | 7-130200 | 5/1995 |
| JP | 11-316259 | 11/1999 |

* cited by examiner

Primary Examiner—Albert Decady
Assistant Examiner—Joseph D. Torres
(74) Attorney, Agent, or Firm—Oblon, Spivak, McClelland, Maier & Neustadt, P.C.

(57) ABSTRACT

A semiconductor test apparatus and method for performing a test on a nonvolatile semiconductor memory such as a flash memory while preventing excessive erasing with reliability. In each erase operation, all addresses are scanned to fetch an error address and error data into a catch memory. Then, on the basis of error information (error address and error data), a rewrite operation is performed to write data on all memory cells. The write data varies according to a comparison result between an address signal and an error address signal. If they disagree, a "0" is written on a memory cell at the address. If they agree, a "0" is written on a "pass" memory cell and a "1" is virtually written on a fail memory cell.

13 Claims, 42 Drawing Sheets

FIG. 23

```
    //
 17 // INITIAL SETTING : T0=100ns T1=1us T2=50us LIMITED NUMBER OF MATCHES = 1000
    //       270              271              272
00:( 0000 0000 0000 0000 0000 0000 0000 0000  ,TO CSTPAN         ECWRON  )  ⎤
01:( 0000 0000 0000 0000 0000 0000 0000 0000  ,TO XE=0x07ff  YE=0x03ff   )  │ S250
02:( 0000 0000 0000 0000 0000 0000 0000 0000  ,TO XM=0x0000  YM=0x0000   )  │
03:( 0000 0000 0000 0000 0000 0000 0000 0000  ,TO XCA=0x07ff TCA=0x03ff  )  ⎦
04:( 0000 0000 0000 0000 0000 0000 0000 0000  ,TO DPC 1000               )  ⎤ S61
    //
    // ERASE VERIFICATION :   WRITE ERROR INTO ERROR CATCH MEMORY
    //
05:( SET ERASE MODE                           ,TO REP 2                  )  ⎤ S62
06:( ERASE TIME                               ,T2 REP 200                )  ⎦
07:( 0000 0000 0000 0000 0000 0000 0000 0000  ,TO NGD   ECAINIT ECACLR   )  ⎤ S251
08:( SET ERASE VERIFICATION MODE/ADDRESS      ,TO                        )  ⎤ S64
09:( LATENCY                                  ,T1 REP 10                 )  ⎦
10:( ERASE VERIFICATION JUDGEMENT             ,TO M/CA 8 XM=XM+1 L+1     )  ⎤ S67,S253
11:( 0000 0000 0000 0000 0000 0000 0000 0000  ,T1                        )  ⎦ S73,S74
12:( 0000 0000 0000 0000 0000 0000 0000 0000  ,TO FMAC 15                )     S256,S65
13:( 0000 0000 0000 0000 0000 0000 0000 0000  ,TO NGE                    )     S268
14:( 0000 0000 0000 0000 0000 0000 0000 0000  ,TO STOP                   )  ⎤ S268
    //
    // DATA REWRITING : WRITE DATA = OUTPUT OF ERROR CATCH MEMORY
    //
15:( 0000 0000 0000 0000 0000 0000 0000 0000  ,TO ELASET ERDAON ERADOFF ECACLR ) ⎤ S257,S258
16:( 0000 0000 0000 0000 0000 0000 0000 0000  ,TO                        )  ⎤
17:( SET WRITE MODE                           ,TO MA/EA RRMD RERD        )  │
18:( SET WRITE DATA/ADDRESS                   ,TO                        )  │ S259~
19:( WRITE TIME                               ,T1 REP 10                 )  │ S266
20:( WRITE TIME                               ,T1 M/CA 16 XM=XM+1 L+1 ECAINC ) │
21:( 0000 0000 0000 0000 0000 0000 0000 0000  ,TO                        )  ⎦
    //
    // ERASE VERIFICATION : • TEST ONLY ON ERROR ADDRESS
    //                     *USING OUTPUT ADDRESS OF ERROR ADDRESS CATCH MEMORY
    //                     • WRITE ERROR DATA INTO ERROR CATCH MEMORY
    //
22:( 0000 0000 0000 0000 0000 0000 0000 0000  ,TO CSTPDON     ERADON   ECACLR ) ⎤ S267
23:( SET ERASE MODE                           ,TO REP 2                  )  ⎤ S62
24:( ERASE TIME                               ,T2 REP 200                )  ⎦
25:( 0000 0000 0000 0000 0000 0000 0000 0000  ,TO                        )  ⎤ S64,S252
26:( SET ERASE VERIFICATION MODE/ADDRESS      ,TO                        )  │ S67,S253
27:( LATENCY                                  ,T1 REP 10                 )  │ S254,S255
28:( ERASE VERIFICATION JUDGMENT              ,TO ECA/ELA 25   ECAINC    )  ⎦ S73,S74
29:( 0000 0000 0000 0000 0000 0000 0000 0000  ,T1                        )  ⎤ S256,S65
30:( 0000 0000 0000 0000 0000 0000 0000 0000  ,TO FMAC 15                )  ⎦ S268
31:( 0000 0000 0000 0000 0000 0000 0000 0000  ,TO NGE     GCSRST         )  ⎤ S269
32:( 0000 0000 0000 0000 0000 0000 0000 0000  ,TO STOP                   )  ⎦
```

FIG. 26

```
   //
17 // INITIAL SETTING : T0=100ns T1=1us T2=50us LIMITED NUMBER OF MATCHES = 1000
   //        270                      271                 272
00:( 0000 0000 0000 0000 0000 0000 0000 0000 , TO CSTPAN        ERDAON ERLCON )  ⎫
01:( 0000 0000 0000 0000 0000 0000 0000 0000 , TO XE=0x07ff  YE=0x03ff        )  ⎬ S273
02:( 0000 0000 0000 0000 0000 0000 0000 0000 , TO XM=0x0000  YM=0x0000        )  ⎪
03:( 0000 0000 0000 0000 0000 0000 0000 0000 , TO XCA=0x07ff YCA=0x03ff       )  ⎭
04:( 0000 0000 0000 0000 0000 0000 0000 0000 , TO DPC 999                     )  ⎤ S61
   //
   // ERASE VERIFICATION : LATCH ERROR DATA BY ERROR DATA LATCH FUNCTION
   //
05:( SET ERASE MODE                           , TO REP 2                      )  ⎤ S62
06:( ERASE TIME                               , T2 REP 200                    )  ⎦
07:( 0000 0000 0000 0000 0000 0000 0000 0000 , TO NGD                         )
08:( 0000 0000 0000 0000 0000 0000 0000 0000 , TO            RRMD ECACLR      )  ⎤ S274
09:( SET ERASE VERIFICATION MODE/ADDRESS      , TO                            )  ⎫
10:( LATENCY                                  , T1 REP 10                     )  ⎬ S64
11:( ERASE VERIFICAITON JUDGMENT              , TO                            )  ⎭
12:( 0000 0000 0000 0000 0000 0000 0000 0000 , T1                             )  ⎤ S65, S67,
13:( 0000 0000 0000 0000 0000 0000 0000 0000 , TO FMAC 16                     )  ⎦ S275
14:( 0000 0000 0000 0000 0000 0000 0000 0000 , TO NGE                         )
15:( 0000 0000 0000 0000 0000 0000 0000 0000 , TO STOP                        )  ⎤ S269
   //
   // DATA REWRITING : WRITE DATA = OUTPUT OF ERROR DATA LATCH
   //
16:( 0000 0000 0000 0000 0000 0000 0000 0000 , TO MA/EA RERD RERD             )  ⎫
17:( SET WRITE MODE                           , TO                            )  ⎪
18:( SET WRITE DATA/ADDRESS                   , TO                            )  ⎬ S276, S73,
19:( WRITE TIME                               , T1 REP 10                     )  ⎪  S74
20:( WRITE TIME                               , T1 M/CA 24 XM=XM+1 L+1        )  ⎭
21:( 0000 0000 0000 0000 0000 0000 0000 0000 , TO FMAC 5                      )  ⎤ S256, S279
22:( 0000 0000 0000 0000 0000 0000 0000 0000 , TO NGE                         )  ⎤ S268
23:( 0000 0000 0000 0000 0000 0000 0000 0000 , TO STOP                        )
   //
   // ERASE VERIFICATION : LATCH ERROR DATA BY ERROR DATA LATCH FUNCTION
   //
24:( 0000 0000 0000 0000 0000 0000 0000 0000 , TO            PRMD ECACLR      )  ⎤ S274
26:( LATENCY                                  , TO REP 10                     )  ⎤ S64
27:( ERASE VERIFICATION JUDGMENT              , TO                            )
28:( 0000 0000 0000 0000 0000 0000 0000 0000 , T1                             )  ⎤ S65, S67
29:( 0000 0000 0000 0000 0000 0000 0000 0000 , TO FMAC 16                     )  ⎦ S275
30:( 0000 0000 0000 0000 0000 0000 0000 0000 , TO NGE                         )
31:( 0000 0000 0000 0000 0000 0000 0000 0000 , TO STOP                        )  ⎤ S269
```

FIG. 28

```
//
//ERASE VERIFICATION : • TEST ONLY ON ERROR ADDRESS
//                    *USING OUTPUT ADDRESS OF ERROR ADDRESS CATCH MEMORY
17 //        270      • WRITE ERROR DATA INTO ERROR CATCH MEMORY
 |  //                     271            272
22:( 0000 0000 0000 0000 0000 0000 0000 0000 , TO CSTPAN    ERDAON    ECACLR )   ⎤-S267
23:( SET ERASE MODE                          , TO REP 2                      )   ⎤-S62
24:( ERASE TIME                              , T2 REP 200                    )
25:( 0000 0000 0000 0000 0000 0000 0000 0000 , TO                            )   ⎤-S64, S252,
26:( SET ERASE VERIFICATION MODE/ADDRESS     , TO                            )     S67, S253,
27:( LATENCY                                 , T1 REP 10                     )     S254, S255,
28:( ERASE VERIFICATION JUDGMENT             , TO ECA/ELC 25       ECAINC    )     S73, S74
29:( 0000 0000 0000 0000 0000 0000 0000 0000 , T1                            )   ⎤-S256, S65,
30:( 0000 0000 0000 0000 0000 0000 0000 0000 , TO FMAC 15                    )     S268
//
// MGM TEST
//
31:( 0000 0000 0000 0000 0000 0000 0000 0000 , TO ECL 500 CSTPDON ECACHG ECACLR) ⎤-S280
32:( 0000 0000 0000 0000 0000 0000 0000 0000 , TO                            )   ⎤-S281, S282
33:( 0000 0000 0000 0000 0000 0000 0000 0000 , TO ECA/ELA 36                 )     S285
34:( 0000 0000 0000 0000 0000 0000 0000 0000 , TO NGE      GCSRST            )   ⎤-S286
35:( 0000 0000 0000 0000 0000 0000 0000 0000 , TO STOP                       )
36:( 0000 0000 0000 0000 0000 0000 0000 0000 , TO ECA/ELC 32                 )   ⎤-S283, S284
37:( 0000 0000 0000 0000 0000 0000 0000 0000 , TO NGE                        )   ⎤-S287
38:( 0000 0000 0000 0000 0000 0000 0000 0000 , TO STOP                       )
```

FIG. 30

```
//
// ERASE VERIFICATION : • TEST ONLY ON ERROR ADDRESS
//                      *USING OUTPUT ADDRESS OF ERROR ADDRESS CATCH MEMORY
//                      • WRITE ERROR DATA INTO ERROR CATCH MEMORY
17//        270                      271          272
 //
22:( 0000 0000 0000 0000 0000 0000 0000 0000  , TO CSTPAN     ERDAON    ECACLR )    ⎤-S267
23:( SET ERASE MODE                           , TO REP 2                       )    ⎤-S62
24:( ERASE TIME                               , T2 REP 200                     )
25:( 0000 0000 0000 0000 0000 0000 0000 0000  , TO                             )    ⎤-S64, S252,
26:( SET ERASE VERIFICATION MODE/ADDRESS      , TO                             )     S67, S253,
27:( LATENCY                                  , T1 REP 10                      )     S254, S255,
28:( ERASE VERIFICATION JUDGMENT              , TO ECA/ELA 25       ECAINC     )     S73, S74
29:( 0000 0000 0000 0000 0000 0000 0000 0000  , T1                             )    ⎤-S256, S65,
30:( 0000 0000 0000 0000 0000 0000 0000 0000  , TO FMAC 15                     )    ⎦ S268
//
// MGM TEST
//
31:( 0000 0000 0000 0000 0000 0000 0000 0000  , TO ECL 500 CSTPDON ECACHG ECACLR)   ⎤-S280
32:( 0000 0000 0000 0000 0000 0000 0000 0000  , TO ELA/ELC                     )   ⎤-S288
37:( 0000 0000 0000 0000 0000 0000 0000 0000  , TO NGE                         )
38:( 0000 0000 0000 0000 0000 0000 0000 0000  , TO STOP                        )
```

FIG. 33

```
//
17 // INITIAL SETTING : T0=100ns T1=1us T2=50us LIMITED NUMBER OF MATCHES = 1000
 // 270          271            272
00:( 0000 0000 0000 0000 0000 0000 0000 0000 , T0           ERDAON RRMD ERWRON )  ⎤
01:( 0000 0000 0000 0000 0000 0000 0000 0000 , T0 XE=0x03ff YE=0x01ff            )  ├─S289
02:( 0000 0000 0000 0000 0000 0000 0000 0000 , T0 XM=0x0000 YM=0x01ff            )  │
03:( 0000 0000 0000 0000 0000 0000 0000 0000 , T0 XCA=0x3ff YCA=0x01ff           )  ⎦
//
// WRITING (PROGRAM) : FETCH ERROR SECTOR ADDRESS INTO ERROR CATCH MEMORY
//
04:( 0000 0000 0000 0000 0000 0000 0000 0000 , T0 NGD                            )  ⎤─S290
05:( SET AUTOMATIC WRITE MODE                , T0                                )  ⎦
06:( AUTOMATIC WRITE DATA/ADDRESS             , T0                                )  ⎤─S291
07:( AUTOMATIC WRITE TIME                     , T2  100                          )  ⎦
08:( STATUS PALLING JUDGMENT                  , T0                                )  ─S292
09:( 0000 0000 0000 0000 0000 0000 0000 0000 , T1                                )  ⎤─S293,
10:( 0000 0000 0000 0000 0000 0000 0000 0000 , T0 M/CA 5 XM=XM+1                 )  ⎦ S294
//
// CHECKING THE NUMBER OF ERROR SECTORS:ELA/ELC(CLOCK STOP OF "FAIL" DUT
//                                        ACCORDING TO COMPARISON RESULT)
//
11:( 0000 0000 0000 0000 0000 0000 0000 0000 , T0 ELC 16000    ELASET            )─S295
12:( 0000 0000 0000 0000 0000 0000 0000 0000 , T0 ELA/ELC                        )─S296,
//                                                                                  S297
// WRITING ERROR FLAG : WRITE ERROR FLAG INTO ERROR SECTOR OF "PASS" DUT
//                     (SCAN ONLY ERROR SECTORS)
//
13:( 0000 0000 0000 0000 0000 0000 0000 0000 , T0 ERDADON ERDAOFF ECACHG ECACLR )─S298
14:( 0000 0000 0000 0000 0000 0000 0000 0000 , T0                                )  ⎤─S299,
15:( WRITING ERROR FLAG CODE                  , T0 ECA/ELA 14    ECAING          )  │ S300,
16:( 0000 0000 0000 0000 0000 0000 0000 0000 , T0                                )  │ S301
17:( 0000 0000 0000 0000 0000 0000 0000 0000 , T0 NGE                            )  │
18:( 0000 0000 0000 0000 0000 0000 0000 0000 , T0 STOP                           )  ⎦
```

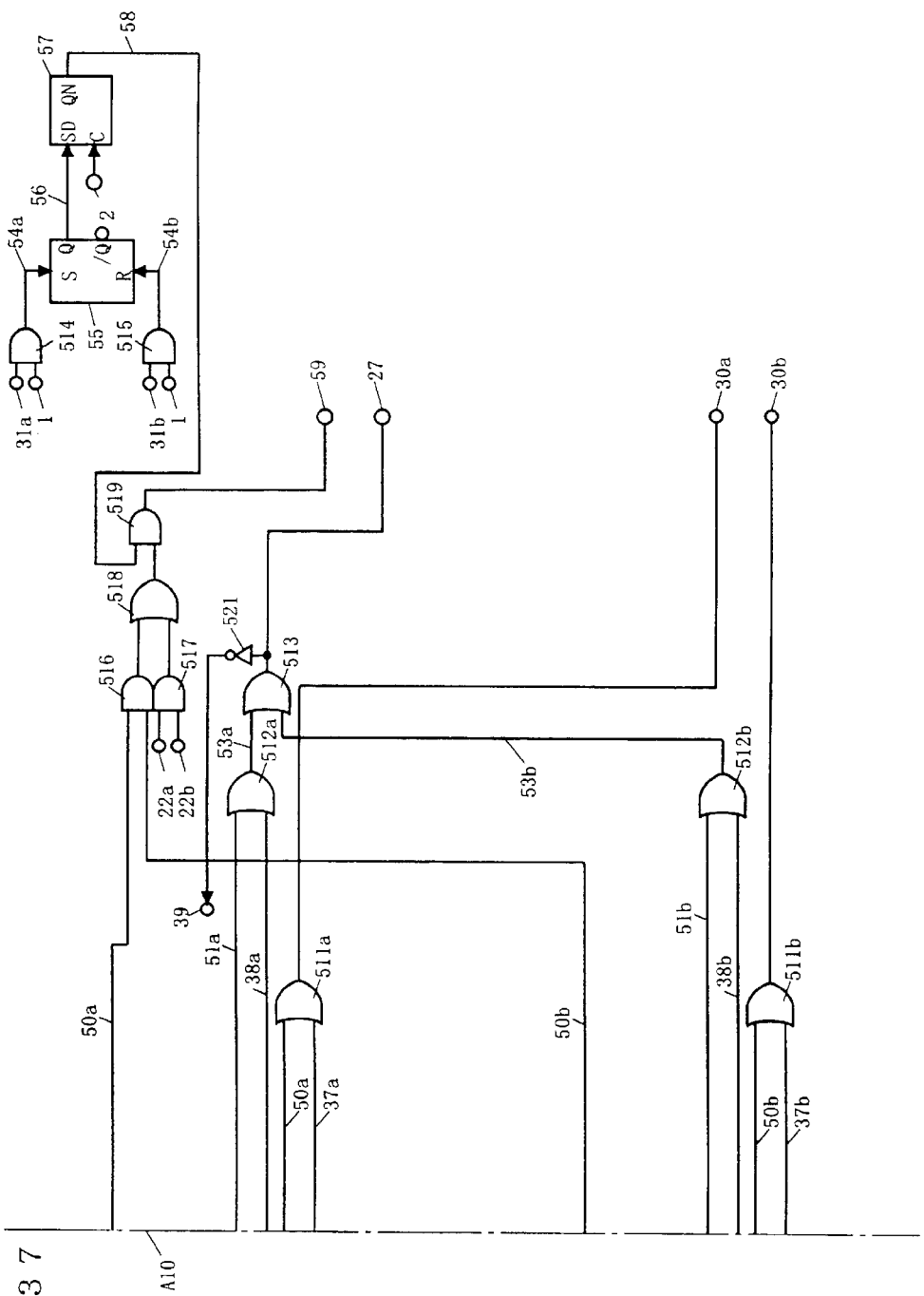
F I G. 37

SEMICONDUCTOR TEST APPARATUS AND METHOD

BACKGROUND OF THE INVENTION

1. Field of the Invention

The present invention relates to a test method for effectively performing a test on a semiconductor memory which requires rewriting of data or a semiconductor memory which is provided with some error memory cells but regarded as acceptable since the number of normal memory cells is not less than a predetermined number (hereinafter referred to as "MGM (Mostly Good Memory)"). The present invention also relates to an semiconductor test apparatus which comprises circuits for the above test method.

2. Description of the Background Art

<Characteristics of Flash Memory>

A flash memory is one of so-called nonvolatile memories which hold stored data even if power is lost. It is capable of electrically erasing the stored data.

The flash memory stores either "0" or "1" in each memory cell by varying the threshold values of those cells. Erasing such data is performed not by one erase operation but by repetitions of the operation to gradually lower the threshold value. Since there is a restriction on the number of times the erase operation can be repeated (hereinafter referred to as "the number of retries"), it is necessary in the erase test to check whether all cells have been erased within a predetermined limitation of times or not. The principle and operating mechanism of an NOR type flash memory are, for example, disclosed in Mitsubishi Semiconductor Data Book 1997, Mitsubishi Application Note, p4–8–p4–15 issued by the semiconductor business planning department of Mitsubishi Electric Corporation (prior art reference (1)).

To erase data stored in the NOR type flash memory, a method for erasing data by one operation is employed. This is not to erase data of a specific cell but to erase all cells in the memory. Thus, it is necessary not only to check at each address of the memory whether the erasing has been completed or not, but also to check the total number of erase retries during test irrespective of the addresses. The procedure (hereinafter referred to as "test flow") of the erase test is, for example, disclosed in Mitsubishi Semiconductor Data Book 1997, Mitsubishi Application Note, p4–18, 19 (prior art reference (2)). Similarly, a write test flow is disclosed in Mitsubishi Semiconductor Data Book 1997, Mitsubishi Application Note, p4–16, 17 (prior art reference (3)).

<Conventional Test Apparatus and Method>

Conventional circuitry for the flash memory test is approximately configured as shown in FIGS. 34 and 35, which includes a test pattern generating portion and a controller portion for controlling write and erase retry operations. In the structure of FIGS. 34 and 35, there are two memories under test 8 (8a, 8b). FIG. 47 shows connection between FIGS. 34 and 35.

A semiconductor test apparatus comprises a clock generator 6 for generating a periodic clock signal 1 which is test periodic timing, a synchronizing clock signal 2 for synchronization with signals, a delay clock signal 3 for delaying signals, an event clock signal 4 which is timing of test pattern changes, and a strobe signal 5 which is judgement timing; an instruction memory 7 for storing a program which describes test patterns generated during operation; and an address generator 10 for decoding the program from the instruction memory 7 and generating address patterns 9 (9a, 9b) to have access to the memories under test 8 (8a, 8b).

The semiconductor test apparatus further comprises a data generator 14 for decoding the program from the instruction memory 7 and generating data patterns 11 (11a, 11b) to be applied to the memories under test 8 and data patterns 13 (13a, 13b) to be compared with data 12 (12a, 12b) from the memories under test 8; control signal generators 16 (16a, 16b) for generating control patterns 15 (15a, 15b) to be applied to the memories under test 8; and a program counter 18 for generating an address 17 to have access to the instruction memory 7.

In addition, the semiconductor test apparatus comprises signal waveform forming circuits 20 (20a, 20b) for generating input signals 19 (19a, 19b) to be applied to the memories under test 8 with timings of the event clock signal 4 from the clock generator 6 and various patterns from the address generator 10; the data generator 14; and the control signal generators 16 (16a, 16b).

The test apparatus is further provided with judging circuits 25 for comparing the output data 12 from the memories under test 8 with the data patterns 13 from the data generator 14 with timing of the strobe signal 5 from the clock generator 6, applying error signals 21 (21a, 21b) and 22 (22a, 22b), or comparison result, to a match controller portion 23P, and canceling the error signals 21, 22 on receipt of reset signals 24 (24a, 24b) from the match controller portion 23P. On receipt of a match control signal 26 from the instruction memory 7, the match controller portion 23P performs retry operations in synchronization with the clocks signals 1, 2. Signals 27 through 31 will be described later with reference to FIGS. 36 and 37.

FIGS. 36 and 37 show the circuit configuration of the match controller portion 23P. As a matter of convenience, some of external input signals in FIGS. 36 and 37 are not shown in FIGS. 34 and 35, but they exist in practice. FIG. 48 shows connection between FIGS. 36 and 37.

A periodic delay circuit 33 in the match controller portion 23P is composed of a D flip-flop 501 and an AND gate 502. It generates a control delay clock signal 32 by delaying the match control signal 26 for a single one period by the periodic clock signal 1 as shown in FIG. 41. A pipeline circuit 34 receives the output signal 32 of the periodic delay circuit 33 and outputs a signal 35, which is delayed with the synchronizing clock signal 2 as a trigger, to one input of an AND gate 503. Receiving the synchronizing clock signal 2 at its other input, the AND gate 503 outputs a signal 36 which is pulse-converted by the synchronizing clock signal 2. For reference, a correlation between the control delay clock signal 32 and the signal 36 is shown in FIG. 42. The match controller portion 23P operates in synchronization with this signal 36, so that match control by the match controller portion 23P is enabled after a delay of a single period.

A clock stop latch circuit 45 (45a, 45b) receives at its set input S the output of an AND gate 508 (508a, 508b) which receives the error signal 21(21a, 21b) and the signal 36. If the error signal 21 is "1 (pass)", the circuit 45 sets a temporary clock stop signal 37 (37a, 37b) to "1" and a signal 38 (38a, 38b), which is to be a switching signal 27 for the execution address 17 indicated by the program counter 18, to "0"

The clock stop latch circuit 45 further receives at its reset input R an output signal 44 (44a, 44b) of an AND gate 507. If a signal 39 and the match control signal 26 are both "1", a periodic delay circuit 40 (composed of an AND gate 504, a D flip-flop 505, and an AND gate 506) outputs a control delay clock signal 41 which is "1" in synchronization with the periodic clock signal 1. A signal 43 obtained by delaying the control delay clock signal 41 in a pipeline circuit 42 is given to one input of the AND gate 507. Since the AND gate 507 receives at its other input the synchronizing clock signal 2, the signal 43 is pulse-converted by the synchronizing clock signal 2 to be the reset signal 44 (44a, 44b). By this reset signal 44, the clock stop latch circuit 45 cancels a temporary clock stop condition.

A loop counter 49 (49a, 49b) increments the number of retries with the output of an AND gate 510 (510a, 510b) as a synchronizing signal. The AND gate 510 receives the signal 36 and a signal obtained from the error signal 21 through an inverter 509. A register circuit 46, on the other hand, holds a limited number of retries 29 from the instruction memory 7 in synchronization with the periodic clock signal 1.

If the error signal 21 is "0 (fail)", the loop counter 49 increments the number of retries in synchronization with the signal 36. If the count agrees with an output value 47 of the register circuit 46, an counter error signal 48 (48a, 48b) is set to "1".

If the counter error signal 48 is "1", an error latch circuit 52 (52a, 52b) which receives the signal 48 at its set input S sets a clock stop signal 50 (50a, 50b) to "1" and a signal 51 (51a, 51b), which is to be the switching signal 27 for the execution address 17, to "0".

An AND gate 520 (520a, 520b) inputs the signals 50 (50a, 50b), 36 and outputs the reset signal 24 (24a, 24b). An inverter 521 outputs the signal 39 which is obtained by inverting the execution address switching signal 27.

Accordingly, if the signal 50 is "0" and the signal 36 is "1", the error signal 21 held in the judging circuit 25 (cf. FIGS. 34, 35) is reset since the reset signal 24 (24a, 24b) becomes "1". If the signal 50 is "1", the reset is disabled since the reset signal 24 becomes "0".

The output of an OR gate 511 (511a, 511b) which receives the signals 37 and 50 becomes a clock stop signal 30 (30a, 30n), and the output of an OR gate 512 (512a, 512b) which receives the signals 38 and 51 becomes a signal 53 (53a, 53b). Then, the output of an OR gate 513 which receives the outputs of the OR gates 512a, 512b becomes the execution address switching signal 27.

Thus, if the signals 53 of all memories under test are "0" (i.e., signals 38 and 51 are both "0"), the execution address switching signal 27 is asserted (="0"). It performs switching between the address from the program counter 18 and an address 28 from the instruction memory 7 under control of the mach control signal 26.

The (temporary) clock stop signal 30 is a signal to disable the generation of the input signal 19 and the judging operation of the judging circuit 25. This signal 30 is asserted (="1") when either the signal 37 or the signal 50 is "1". "Temporary clock stop" means that in simultaneous tests on a plurality of flash memories, for example, the generation of the input signals and the operation of the judging circuit for a memory under test which has passed during the retry operation are temporarily disabled until the retry operations for the other memories under test are completed. "Clock stop" means that the generation of the input signals and the operation of the judging circuit for a memory under test which exceeds the limited number of retries are completely disabled until the end of the test. A (temporary) clock stop function includes a function to disable all signals of each memory under test or a function to disable a specific control signal.

A signal 31 includes a test stop seizing signal 31a and a stop signal 31b. An AND gate 514 inputs the test stop seizing signal 31a and the periodic clock signal 1, whereas an AND gate 515 inputs the stop signal 31b and the periodic clock signal 1. The outputs of the AND gates 514 and 515 enter at the set input S and reset input R of a status holding circuit (RS flip-flop) 55, respectively. A Q-output signal 56 of the status holding circuit 55 becomes a signal 58 via a pipeline circuit 57 using the synchronizing clock signal 2 as a synchronizing signal, and enters at one input of an AND gate 519.

An AND gate 516 inputs the signals 50a and 50b, whereas an AND gate 517 inputs the error signals 22a and 22b. The outputs of the AND gates 516 and 517 enter at an OR gate 518 and the output of the OR gate 518 enters at the other input of the AND gate 519. The output of the AND gate 519 becomes a stop signal 59.

Now, consider forced termination of the test when all memories under test fails the test. If the test stop seizing signal 31a from the instruction memory 7 is "1" and the stop signal 31b is "0", the signal 54a becomes "1" and the signal 54b becomes "0" in synchronization with the periodic clock signal 1. The output signal 56 of the status holding circuit 55 is thus asserted (="1") and the signal 58 obtained by delaying the signal 56 in the pipeline circuit 57 becomes "1". Accordingly, if the signals 22 or 50 of all the memories under test are "1", the stop signal 59 is asserted (="1") and terminates the test. The signal 59 serves as an operation inhibiting signal for the clock generator 6. If the signal 31a is "0" and the signal 31b is "1", this stop function is disabled.

FIG. 38 is a flow chart showing a test flow of the erase test on the NOR type flash memories (simultaneous test on a plurality of memories under test); and FIG. 39 is a flow chart showing a write test flow under the same conditions. The flows of FIGS. 38 and 39 are obtained by adding the processing of the test apparatus (step S68 in FIG. 38 and step S84 in FIG. 39) to the aforementioned test flows of the prior art references (2) and (3).

Referring now to FIG. 38, a header address is set in step S60; a loop counter X of each DUT (Device (semiconductor memory) Under Test) is initialized to zero in step S61; and an erase mode such as erase time is set in step S62. Then, the loop counter of each DUT is incremented (X=X+1) in step S63; and an erase verification mode such as address and latency is set in step S64.

The next step S65 is to check the number of retries (1000 times) for each DUT. If the number of retries reaches to 1000, a "fail" DUT is excepted from the test in step S66. The clock of the "fail" DUT will be stopped until the end of the test, and the "fail" DUT is passed as a dummy without error reset. If the number of retries is less than 1000, whether the erasing has been completed or not is checked in step S67. If it has not been completed yet, the flow returns to step S62. The processing of steps S62 through S66 is repeated until the completion of the erasing. If the erasing has been completed, the flow goes to step S68.

In step S68, whether all the DUTs under test have passed the test or not is verified. If all of them have passed, the flow goes to step S70. If any one of them failed to pass, on the other hand, the clock of a "pass" DUT is temporarily stopped in step S69, and the flow returns to step S62. The processing of steps S62 through S69 is repeated until all the DUTs under test pass in step S68.

After excepting the "fail" DUT(s) from the test in step S70 as in step S66, whether all the DUTs have been excepted or not is verified in step S71. If all of them have been excepted, the processing is immediately terminated. If not, the temporary clock stop is canceled in step S72 and whether the present address is the last address or not is checked in step S73. If it is the last address, the processing is terminated. If not, the address is incremented in step S74 and the flow returns to step S64. This is the erase test flow.

Referring next to FIG. 39, a header address is set in step S80; a loop counter X of each DUT (Device (semiconductor memory) Under Test) is initialized to zero in step S81; a write mode is set in step S82; and write data, write address, and write time are set in step S83. Then, the loop counter of each DUT is incremented (X=X+1) in step S84; and a write verification mode such as latency is set in step S85.

The next step S86 is to check the number of retries (25 times) for each DUT. If the number of retries reaches to 25, the flow goes to step S87. If not, the flow goes to step S88. If all DUTs are judged as "fail" in step S87, the processing is immediately terminated. If not, the flow goes to step S91.

Step S88 is to check whether the writing has been completed or not. If it has not been completed yet, the flows returns to step S82 and repeats steps S82 through S86 until the writing is completed. If it has been completed, the flow goes to step S89.

In step S89, whether all the DUTs under test have passed or not is verified. If all of them have passed, the flow goes to step S92. If any one of them failed to pass, the clock of the "pass" DUT is temporarily stopped in step S90 and the flow returns to step S82. The processing of steps S82 through S90 is repeated until all the DUTs under test pass in step S89.

In step S91, the "fail" DUT is excepted from the test. The clock of the "fail" DUT will be stopped until the end of the test, and the "fail" DUT is passed as a dummy without error reset. The temporary clock stop is then canceled in step S92.

Next, whether the present address is the last address or not is checked in step S93. If it is the last address, the processing is terminated. If not, the address is incremented in step S94 and the flow returns to step S81.

Main circuits provided for the processing of each step in the above erase or write test flow are as follows: the address generator 10 for steps S60, S73, S74, S80, S93, S94; the register circuit 46 and the loop counter 47 for steps S61, S63, S65, S81, S84, S86; the control signal generator 16 for steps S62, S64, S82, S85; the data generator 14 for step S73; and the judging circuit 25, the clock stop latch circuit 43, and the error latch circuit 50 for the remaining steps.

<Problems with Flash Memory Test>

In the NOR type flash memory, it is necessary to write "0" on all cells before erasing data in order to increase the threshold value. Otherwise, the threshold value of those memory cells becomes too low after the erase operation and the memory may fall into an unrecoverable excessive erase condition. Failure due to this excessive erasing has been one of the factors causing reduction in yield of the flash memory.

In the above mentioned erase test on the flash memory, it is also necessary to run a test while preventing in each erase operation excessive erasing of a cell (with a low threshold value) which has already been erased. This is because an already-erased memory cell and an yet-to-be-erased memory cell are mixed in a single memory under test during the erase retry operation since the speed of erasing each memory cell is different and because erasing of the flash memory is performed by one operation. The conventional flash memory, however, does not have a function to prevent excessive erasing of the already-erased memory cell(s). In addition, although the conventional test apparatus has an inhibiting function to temporarily stop the clock of the already-erased memory under test as shown in FIGS. 34 and 35 or 36 and 37, this function is to disable the entire memory under test so that a specific memory cell cannot be disabled.

<MGM Test>

Concept of MGM

The MGM is a semiconductor memory which is provided with some error cells but regarded as acceptable since the number of normal cells is not less than a predetermined number. It is employed as a flash memory in a hard disk.

Hard disks have employed a sector method for data storage management, so that the flash memory to be applied needs to employ the same method for data management. FIG. 40 shows an internal structure of an AND type flash memory. In this memory, pass/fail information on each sector is written into a control region of the sector so that available sectors can be selected from that information. Thus, when the flash memory is the MGM, the numbers of good sectors and bad sectors are counted to check whether the number of good sectors is not less than a predetermined number or not.

<Problems with MGM Test>

As means for the above mentioned test, the conventional semiconductor memory test apparatus fetches error information on each address into a failure bit memory device (built-in device or external device of the semiconductor memory test apparatus) during test. Then, after the test, it counts the number of errors by utilizing an analysis function of the failure bit memory device, generates error information on each memory under test, and combines that information with the error information therein.

In this case, the error information in the failure bit memory device is not immediately reflected during test on the semiconductor memory test apparatus. This results in an increase in overhead time of the MGM test.

SUMMARY OF THE INVENTION

A first aspect of the present invention is directed to a semiconductor test apparatus comprising: a control signal generating unit for supplying a control signal which indicates the execution of a predetermined operation to a semiconductor memory under test; a judging unit capable of making a pass/fail judgement on each address of the semiconductor memory under test after the execution of the predetermined operation; and an error information storage unit for sequentially giving a test address to the semiconductor memory under test and storing error address information including an error address which corresponds to the test address when an address is judged as "fail" by the judging unit, and error data outputted at that time.

According to a second aspect of the present invention, the semiconductor test apparatus according to the first aspect further comprises: an address generating unit for sequentially generating a generated address, wherein the error information storage unit includes: a test address selecting portion for selecting either the generated address or the error address as a test address given to the semiconductor memory under test.

According to a third aspect of the present invention, in the semiconductor test apparatus according to the second aspect, the semiconductor memory under test includes a plurality of semiconductor memories under test; the error address information contains total error information indicating the number of fetched error addresses, the error address information including a plural pieces of error address information corresponding to the plurality of semiconductor memories under test; and the error information storage unit includes a plurality of error information storage portions for storing the plural pieces of error address information, respectively, each of the plurality of error information storage portions having a total error information storage function of storing the total error information and a control signal output function of determining the end of the output of the test address on the basis of the total error information and generating a test operation stop signal indicating stop/nonstop of a test operation and a test content switching signal indicating switching of the contents of a test at the output of the test address. The semiconductor test apparatus further comprises: a test control unit for stopping a test on a semiconductor memory under test out of the plurality of semiconductor memories under test which corresponds to the test operation stop signal indicating stop of the test operation; and a test data generating unit for generating test data for the semiconductor memory under test on the basis of the indication contents of the test content switching signal.

According to a fourth aspect of the present invention, in the semiconductor test apparatus according to the second aspect, the semiconductor memory under test includes a plurality of semiconductor memories under test; the error address information contains total error information indicating the number of fetched error addresses, the error address information including a plural pieces of error address information corresponding to the plurality of semiconductor memories under test; and the error information storage unit includes a plurality of error information storage portions for storing the plural pieces of error address information, respectively, each of the plurality of error address storage portions having a control signal output function of generating a test operation stop signal indicating stop/nonstop of a test operation and a test content switching signal indicating switching of the contents of a test, at the output of the test address on the basis of a comparison result between the generated address and the error address. The semiconductor test apparatus further comprises: a test control unit for stopping a test on a semiconductor memory under test out of the plurality of memories under test which corresponds to the test operation stop signal indicating stop of the test operation; and a test data generating unit for generating test data for the semiconductor memory under test on the basis of the indication contents of the test content switching signal.

According to a fifth aspect of the present invention, the semiconductor test apparatus according to the first aspect further comprises: a first data generating unit for generating first data for each address, wherein the error information storage unit includes: a data arithmetic portion for processing the first data with the error data to obtain second data for test, for each error address; and a test data supplying portion for supplying either the first data or the second data to the semiconductor memory under test as test data.

According to a sixth aspect of the present invention, in the semiconductor test apparatus according to the fifth aspect, the error information storage unit further includes: a selection signal output portion for outputting a selection signal on the basis of a comparison result between the generated address and the error address, wherein the data arithmetic portion obtains the second data by an operation based on the selection signal.

According to a seventh aspect of the present invention, in the semiconductor test apparatus according to the first aspect, the semiconductor memory under test includes a plurality of semiconductor memories under test; the error address information contains total error information indicating the number of fetched error addresses, the error address information including a plural pieces of error address information corresponding to the plurality of semiconductor memories under test; and the error information storage unit includes a plurality of error information storage portions for storing the plural pieces of address information, respectively, each of the plurality of error information storage portions having a total error information storage function of storing the total error information and a forced control signal output function of receiving the total error information and error limit information defining the limited number of errors, and if the number of error addresses is not less than the limited number of errors, generating a test operation forced stop signal indicating forced stop of a test operation. The semiconductor test apparatus further compares: a test control unit for stopping tests on all of the plurality of semiconductor memories under test if the test operation forced stop signal indicates forced stop of the test operation.

An eighth aspect of the present invention is directed to a semiconductor test method for performing a test operation on a semiconductor memory under test by using the semiconductor test apparatus according to the first aspect. The semiconductor test method comprises the steps of: (a) setting an erase operation as the predetermined operation and performing an erase operation whereby to set all addresses of the semiconductor memory under test to "1"; and (b) immediately after the step (a), storing the error address information as to the semiconductor memory under test into the error information storage unit, whereas setting a write operation as the predetermined operation and performing a rewrite operation whereby to write a "0" to all addresses. If a write address is the error address in the rewrite operation, a "0" is exceptionally not written to an erase failure bit on the basis of the error data.

According to a ninth aspect of the present invention, in the semiconductor test method according to the eight aspect, the step (b) includes the steps of: (b-1) immediately after the step (a), storing the error address information as to the semiconductor memory under test into the error information storage unit; (b-2) setting a write operation as the predetermined operation and performing the rewrite operation on all addresses; and (b-3) immediately after the step (b-1), checking whether erasing of all addresses of the semiconductor memory under test has been normally completed or not, and terminating an erase test if it has been completed or performing the step (a) again if not. The first execution of the step (b-1) is performed on all addresses of the semiconductor memory under test; and the second and later executions of the step (b-1) are performed only on the error address indicated by the last error address information, out of all addresses of the semiconductor memory under test.

According to a tenth aspect of the present invention, in the semiconductor test method according to the ninth aspect, in the step (b-3), the erase test is also terminated if the number of times that erasing of all addresses of the semiconductor memory under test has not been normally completed exceeds a predetermined number of times.

According to an eleventh aspect of the present invention, in the semiconductor test method according to the tenth aspect, the semiconductor memory under test includes a plurality of semiconductor memories under test; the error address information contains total error information indicating the number of fetched error addresses, the error address information including a plural pieces of error address information corresponding to the plurality of semiconductor memories under test; and the steps (a) and (b) of the erase test are independently performed for each of the plurality of semiconductor memories under test. The semiconductor test method further comprises the step of: (c) making a pass/fail judgement on a corresponding semiconductor memory under test out of the plurality of semiconductor memories under test on the basis of the total error information, and if the corresponding semiconductor memory under test is judged as "fail", forcefully stopping every processing of the erase tests on the plurality of semiconductor memories under test, the step (c) being performed after the erase test of the step (b-3) on each of the plurality of memories under test.

According to a twelfth aspect of the present invention, in the semiconductor test method according to the eighth aspect, the step (b) further includes the steps of: (b-1) obtaining a specified address; (b-2) determining if the specified address of the semiconductor memory under test agrees with the error address or not, and if it agrees with the error address, obtaining the error data from the error information storage unit; (b-3) setting a write operation as the predetermined operation and performing a rewrite operation whereby to write a "0" to the specified address, the steps (b-1) through (b-3) being repeated while the specified address is incremented, for each address; and (b-4) immediately after the repeating process of the steps (b-1) through (b-3) is completed, terminating the test if erasing of all addresses of the semiconductor memory under test has been normally completed or performing the step (a) again if not.

A thirteenth aspect of the present invention is directed to a semiconductor test method for performing a test operation on a semiconductor memory under test by using the semiconductor test apparatus according to the first aspect, wherein the error address information includes total error information indicating the number of fetched error addresses; and the semiconductor test apparatus further has a function of performing an error address information memory write operation whereby to write the error address to the semiconductor memory under test itself. The semiconductor test method comprises the steps of: (a) setting a write operation as the predetermined operation and performing a write operation whereby to write predetermined data to all addresses of the semiconductor memory under test; (b) immediately after the step (a), storing the error address information as to the semiconductor memory under test into the error information storage unit; and (c) making a pass/fail judgement on the semiconductor memory under test on the basis of the total error information, and if the memory is judged as "pass", performing the error address information memory write operation.

In the semiconductor test apparatus of the first aspect, since the error information storage unit stores the error address information including the error address and the error data, the peculiar operation can be performed for each error address of the semiconductor memory under test on the basis of the error address information.

If the predetermined operation corresponds to a rewrite operation after the erase operation, for example, the peculiar rewrite operation can be performed for each error address of the semiconductor memory under test.

When a memory cell is allotted according to the number of bits of input/output data at the error address of the semiconductor memory under test, since the error address information includes the error data, the bits of the I/O data share the error address and which bit has an error can be accurately determined on the basis of the error data.

In the semiconductor test apparatus of the second aspect, the error information storage unit includes the test address selecting portion for selecting either the generated address or the error address as a test address given to the semiconductor memory under test. Accordingly, the predetermined operation can be performed only for the error address if necessary.

If the predetermined operation corresponds to a further erase operation after the erase and rewrite operations, the judging unit can make a pass/fail judgement only on the error address of the semiconductor memory under test found in the last erase operation.

In the semiconductor test apparatus of the third aspect, each of the plurality of error information storage portions has the total error information storage function of storing the total error information and the control signal output function of determining the end of the output of the test address on the basis of the total error information and generating the test operation stop signal indicating stop/nonstop of the test operation and the test content switching signal indicating switching of the contents of the test. The semiconductor test apparatus further comprises the test control unit for stopping the test on the semiconductor memory under test out of the plurality of semiconductor memories under test which corresponds to the test operation stop signal indicating stop of the test operation, and the test data generating unit for generating test data for the semiconductor memory under test on the basis of the indication contents of the test content switching signal.

Accordingly, for each of the plurality of memories under test, it is possible to suspend a test or to alter the contents of the test data depending on whether the output of the test address has been finished or not.

In the semiconductor test apparatus of the fourth aspect, each of the error information storage portions has the control signal output function of generating the test operation stop signal indicating stop/nonstop of the test operation and the test content switching signal indicating switching of the contents of the test, at the output of the test addresses on the basis of the comparison result between the generated address and the error address. The semiconductor test apparatus further comprises the test control unit for stopping the test on the semiconductor memory under test out of the plurality of memories under test which corresponds to the test operation stop signal indicating stop of the test operation, and the test data generating unit for generating test data for the semiconductor memory under test on the basis of the indication contents of the test content switching signal.

Accordingly, for each of the plurality of memories under test, it is possible to suspend the test or to alter the contents of the test data depending on the comparison result between the generated address and the error address.

In the semiconductor test apparatus of the fifth aspect, the test data supplying portion supplies either the first data produced in the first data generating portion or the second data obtained in the data arithmetic portion to the semiconductor memory under test as test data. For test, accordingly, various test data can be supplied to the semiconductor memory under test.

In the semiconductor test apparatus of the sixth aspect, the data arithmetic portion outputs the second data for test by performing an operation on the basis of the selection signal determined by the comparison result between the generated address and the error address. Thus, the second data for test varies according to the comparison result between the generated address and the error address.

In the semiconductor test apparatus, each of the plurality of error information storage portions has the total error information storage function of storing the total error information and the forced control signal output function of receiving the total error information and the error control information defining the limited number of errors, and if the number of error addresses is not less than the limited number of errors, generating the test operation forced stop signal indicating forced stop of the test operation. The semiconductor test apparatus further comprises the test control unit for stopping the tests on all of the plurality of semiconductor memories under test when the test operation forced stop signal indicates the forced stop of the test operation.

Accordingly, if the number of error addresses of any one of the plurality of memories under test exceeds the limited number of errors, the tests on all the semiconductor memories under test are forcefully terminated.

In the semiconductor test method of the eighth aspect, if a write address corresponds to the error address in the rewrite operation, a "0" is exceptionally not written to the erase failure bit on the basis of the error data while it is rewritten to the remaining bits. This surely prevents excessive erasing of the bit which has been normally erased while improving yield of the semiconductor memory under test.

In the semiconductor test method of the ninth aspect, the second and later executions of the step (b-1) are performed only on the error address indicated by the latest error address information out of all addresses of the semiconductor memory under test. That is, the addresses to be tested are narrowed down, which shortens the test time.

In the semiconductor test method of the tenth aspect, in the step (b-3), the erase test is also terminated if the number of times the erasing of all addresses of the semiconductor memory under test has not been normally completed exceeds a predetermined number of times. Accordingly, at the termination of the erase test, the semiconductor memory under test which includes the error address erased improperly can be recognized.

In the semiconductor test method of the eleventh aspect, the step (c) which is performed after the erase test of the step (b-3) for all the semiconductor memories under test is to make a pass/fail judgement on a corresponding semiconductor memory under test out of the plurality of semiconductor memories under test on the basis of the total error information. If the memory is judged as "fail", the processing of the erase tests on all the semiconductor memories under test is forcefully terminated.

This speedy termination of the erase test on the other semiconductor memories under test allows effective conduct of the test, when the plurality of semiconductor memories under test become inoperable even with one error semiconductor memory under test.

In the semiconductor test method of the twelfth aspect, the error address judgment of the step (b-1) and the rewriting of the step (b-2) are repeated for each address while sequentially incrementing the specified address. Thus, the error information storage unit only has to store the error address information as to a single address. This simplifies the circuit configuration.

In the semiconductor test method of the thirteenth aspect, in the step (c), a pass/fail judgment on the semiconductor memory under test is made on the basis of the total error information, and if the memory is judged as "pass", the error address information memory write operation is performed whereby to write the error address information to the semiconductor memory under test. This writing allows normal utilization of the semiconductor memory under test only with good addresses.

It is therefore an object of the present to provide semiconductor test apparatus which conducts a test on a nonvolatile semiconductor storage device such as a flash memory while preventing excessive erasing of data with reliability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 23 is an illustration of a program for the test method of the first preferred embodiment.

FIG. 26 is an illustration of a program for the test method of the second preferred embodiment.

FIG. 28 is an illustration of a program for the test method of the third preferred embodiment.

FIG. 30 is an illustration of a program for the test method of the fourth preferred embodiment.

FIG. 33 is an illustration of a program for the test method of the fifth preferred embodiment.

FIGS. 36 and 37 are schematic circuit diagrams showing the details of a conventional match controller portion.

DESCRIPTION OF THE PREFERRED EMBODIMENTS

1. Principle of the Invention

Figure 1:
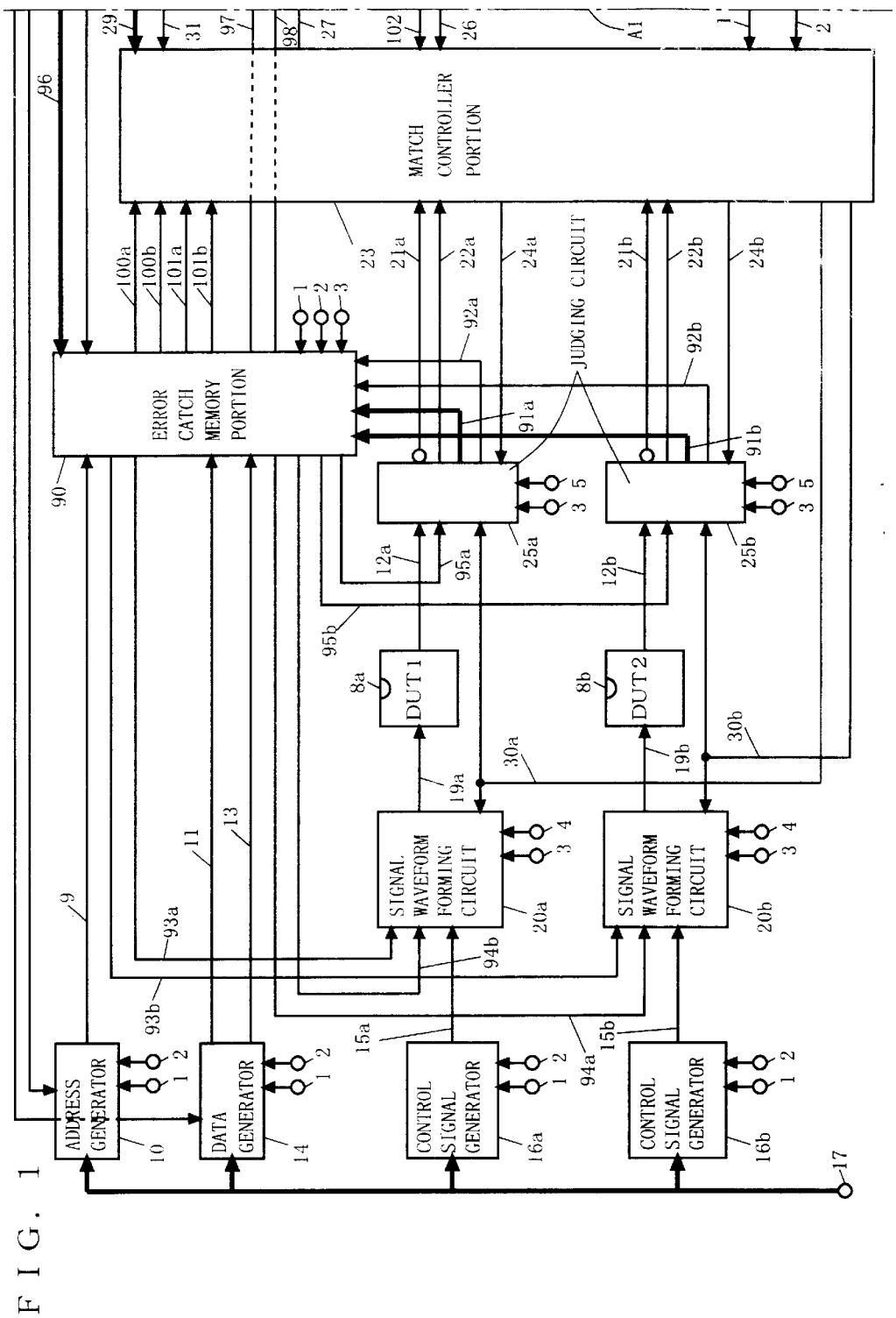
FIGS. 1 and 2 are schematic circuit diagrams showing a general structure of a semiconductor test apparatus according to preferred embodiments of the present invention.

The principle or point of the present invention will be described below.

1-1. Prevention of Excessive Erasure in Flash Memory Test (1) Prior to an erase operation to write data "1" on all cells, a memory cell which has already been erased is rewritten so that it has a higher threshold value. This prevents excessive erasing due to batch erasing.

<Rewriting of Data>

(A) On a memory cell which has already been erased, data "0" is written. This rewriting is, however, not performed at a normal VPP voltage (about 12 V) because if data "0" is fully written, erasing may not be completed during the erase retry operation and the cell may be judged as "fail". Thus, in writing data "0" on the memory cell which has already been erased, it is necessary to suppress the threshold value to such a level that it becomes slightly higher than that in the erased condition and erasing can surely be completed by one operation. This can be handled by setting the VPP voltage lower than that in the normal write operation or reducing the writing speed. Such method is well-known so that the detailed description will be omitted.

(B) On a memory cell which has not been erased yet, data "1" (indicating the erase condition) is written. However, this rewriting is performed only for convenience's sake, so that in practice, data "1" is not written. This operation is performed to write data "0" without affecting the memory cell.

(2) As means for the above (1), there is provided a storage means for fetching and storing information about errors found in the erase verification at each address (including error address and error data for each data I/O (bit) of the memory under test). Output data of this storage means is used to generate rewrite data. Further, write data on an already-erased memory cell and that on an yet-to-be-erased memory cell are switched according to a comparison result between a test address pattern from an address generator and the error address.

1-2. MGM Test (1) The error information is generated by counting the number of errors and comparing that number with a predetermined value.

(2) This error information is given to the aforementioned match controller portion and used for generation of control signals indicating functions such as clock stop and forced termination of a test.

Referring now to the drawings, we will describe a circuit configuration according to a first preferred embodiment of the present invention. In the following drawings, like or equivalent parts to those in FIGS. 34 through 37 are denoted by the same reference numerals or characters and description thereof will be omitted.

2. First Preferred Embodiment

FIGS. 1 through 18 show a circuit configuration of a semiconductor test apparatus according to the first preferred embodiment of the present invention. This configuration is shown on the assumption that there are two memories under test 8 (8a, 8b).

2-1. Explanation for FIGS. 1, 2

Figure 2:
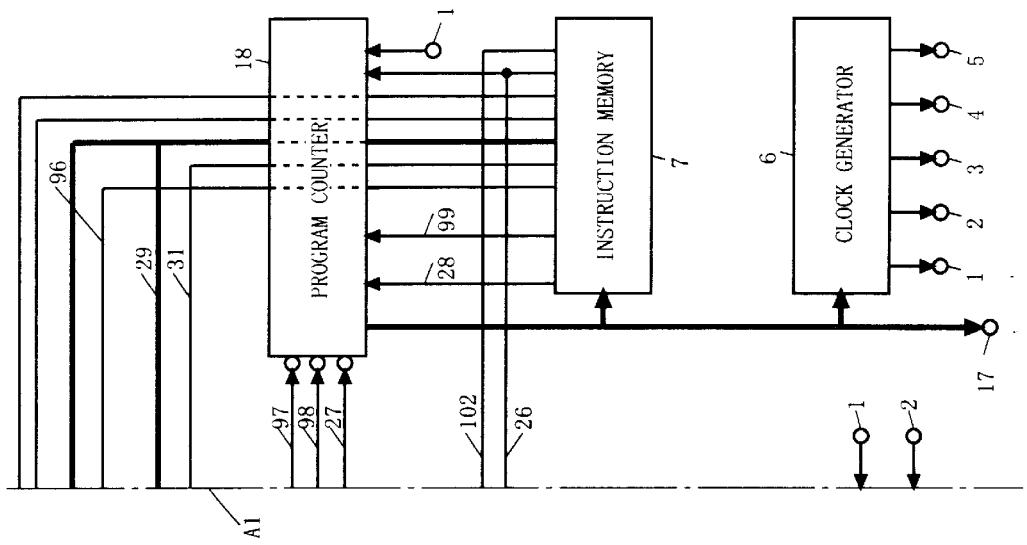
Figure 43:
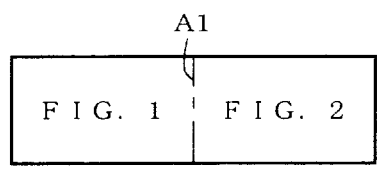
FIGS. 43 to 48 are explanation diagrams showing connection between FIGS. 1 and 2, FIGS. 3 and 4, FIGS. 6 to 9, FIGS. 13 to 18, FIGS. 34 and 35, and FIGS. 36 and 37.

In FIGS. 1 and 2, an error catch memory portion 90 performs various processing by fetching an error signal 91 of each memory under test regarding each data I/O (bit) 8 from a judging circuit 25 and an error signal 92 of each memory under test 8 which is obtained by degenerating the error signal 91, in synchronization with a periodic clock signal 1, a synchronizing clock signal 2, and a delay clock signal 3 all from a clock generator 6. FIG. 43 shows connection between FIGS. 1 and 2.

The error catch memory portion 90 fetches a test address pattern 9 from an address generator 10 with the error signal 92 as a trigger, and sequentially stores an error address for each memory under test 8. This error address can be used as a test address pattern of the memory under test 8 (address signal 93 (93a, 93b)). Further, error information fetched by the error signal 91 with the error signal 92 as a trigger is processed with a test data pattern 11 from a data generator 14. Data produced by the arithmetic function can be used as a test input data pattern (data signal 94 (94a, 94b)) and a test check data pattern (data signal 95 (95a, 95b)) for the memory under test 8. A signal 13 can be used as a test check data pattern as in the conventional technique.

Under the control of a control signal group 96 from an instruction memory 7, the error catch memory portion 90 outputs to a program counter 18 a signal 97 which is generated at the end of the output of all error information in an internal storage means when the error information is used as test patterns, or outputs a signal 98 which is generated when the number of errors is not less than a predetermined value.

The program counter 18 performs switching between an address counted therein and an address 28 from the instruction memory 7 by the signals 97, 98 and a control signal group 99.

An error signal 100 (100a, 100b) and a temporary clock stop signal 101 (101a, 101b) which are generated also when the number of errors is not less than a predetermined value are fed to a match controller portion 23 as control signals. A (temporary) clock stop function of the match controller portion 23 is enabled or disabled by control signals 102 (clock stop seizing control signal 102a, stop signal 102b) from the instruction memory 7. The circuit configuration of the match controller portion 23 is shown in FIGS. 3 and 4.

2-2. Explanation for FIGS. 3, 4

Figure 3:
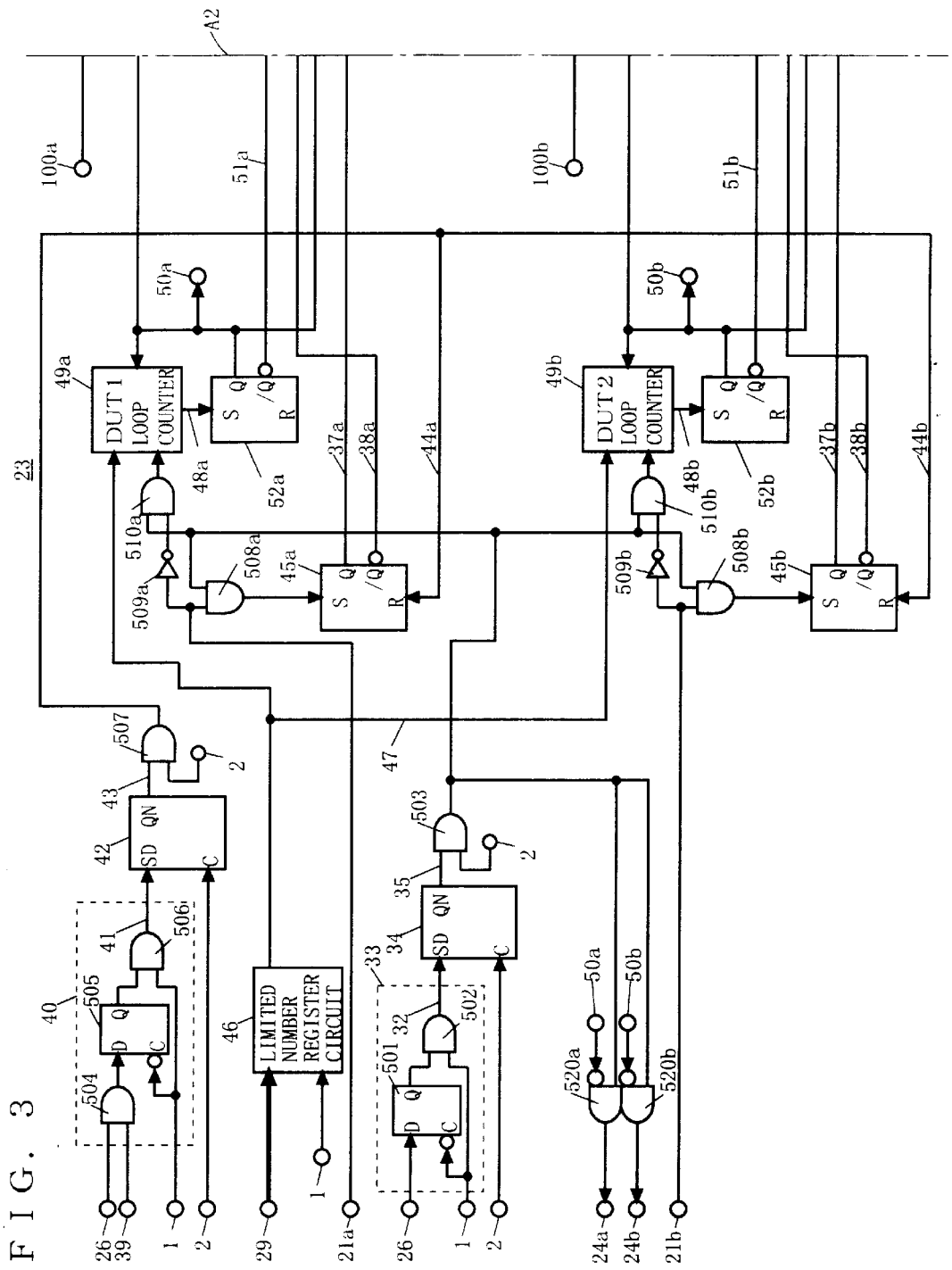
FIGS. 3 and 4 are schematic circuit diagrams showing the details of a match controller portion.
Figure 4:
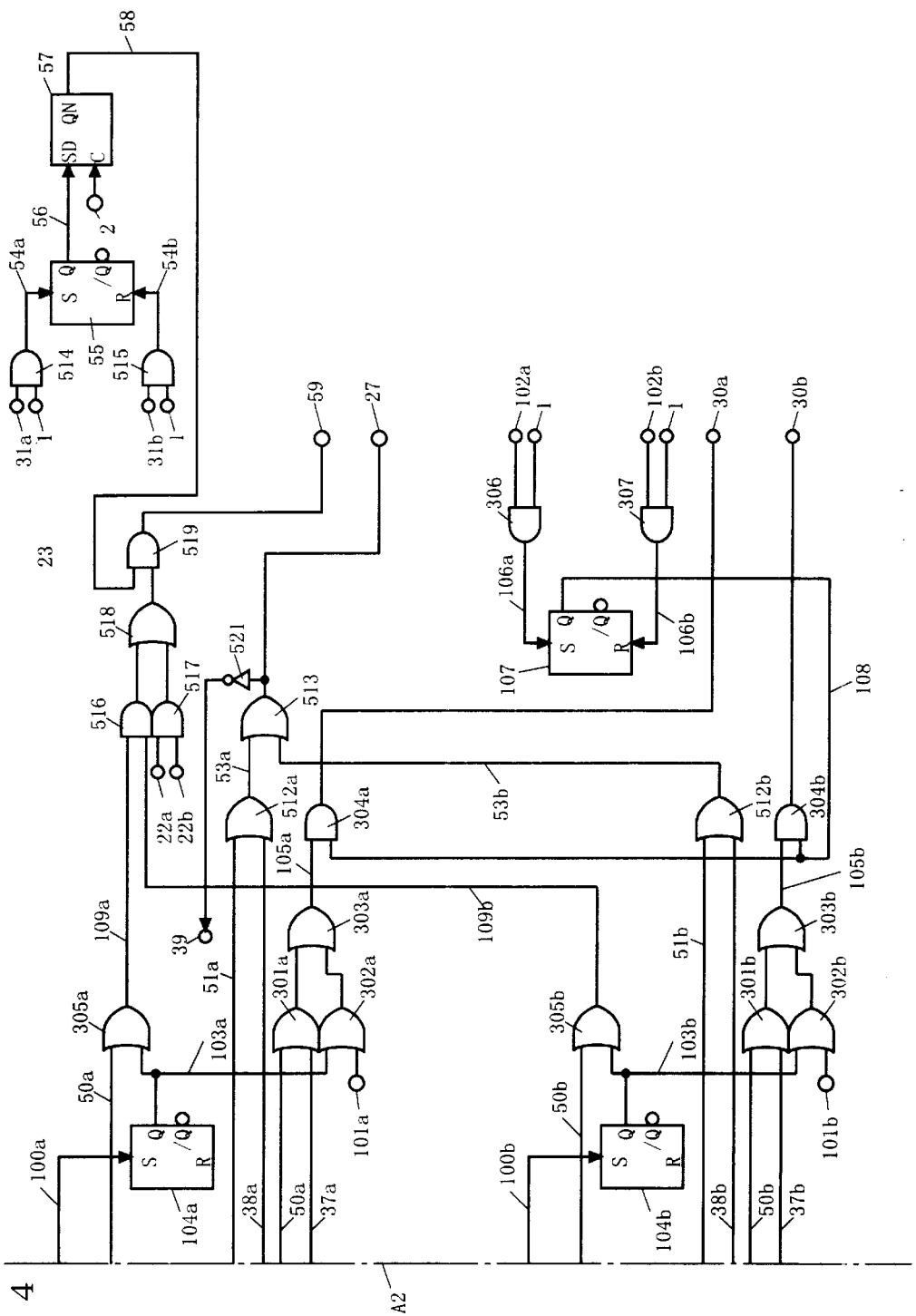
Figure 44:
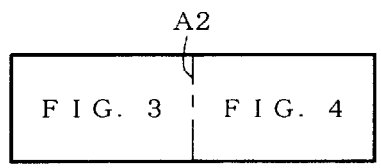

The match controller portion 23 of FIGS. 3 and 4 is characterized as follows. FIG. 44 shows connection between FIGS. 3 and 4. If the error signal 100 is "1", an error latch circuit 104 (104a, 104b) which receives the error signal 100 at its set input S asserts (="1") an error signal 103 (103a, 103b).

The Q output of the error latch circuit 104 enters at one input of an OR gate 305 (305a, 305b). The other input of the OR gate 305 inputs a signal 50 (50a, 50b). Then, an output signal 109 (109a, 109b) of the OR gate 305 enters at one input of an AND gate 516.

An OR gate 301 (301a, 301b) inputs the signals 50 and 37 (37a, 37b), while an OR gate 302 (302a, 302b) inputs the error signal 103 and the temporary clock stop signal 101 (101a, 101b). An OR gate 303 (303a, 303b) inputs the outputs of the OR gates 301 and 302, and outputs a signal 105 (105a, 105b) to one input of an AND gate 304 (304a, 304b).

An AND gate 306 inputs the clock stop seizing control signal 102a and the periodic clock signal 1, whereas an AND gate 307 inputs the stop signal 102b and the periodic clock signal 1. Then, output signals 106 (106a, 106b) of the AND gates 306 and 307 enter at the set input S and reset input R of a status holding circuit (RS flip-flop) 107, respectively, and a Q output signal 108 of the circuit 107 enters at the other input of the AND gate 304.

Thus, if the error signal 103 is "1", a clock stop signal 30 (30a, 30b) is asserted (="1") since the output signal 105 of the OR gate 303 is forced to be "1". The same can be said of the case where the temporary clock stop signal 101 from the error catch memory portion 90 is "1".

If the clock stop seizing control signals 102a is "1" and the stop signal 102b is "0", the signals 106a and 106b become "1" and "0", respectively, in synchronization with the periodic clock signal 1, and the output signal 108 of the status holding circuit 107 is asserted (="1"). In this case, the clock stop signal 30 becomes "1" and the clock stop function is activated. If the signal 106a is "0" and the signal 106b is "1", the clock stop function is disabled. If the error signal 103 is "1" and the signals 109 of all the memories under test 8 is "1", a signal 59 is asserted (="1") and a test stop function is activated.

Figure 36:
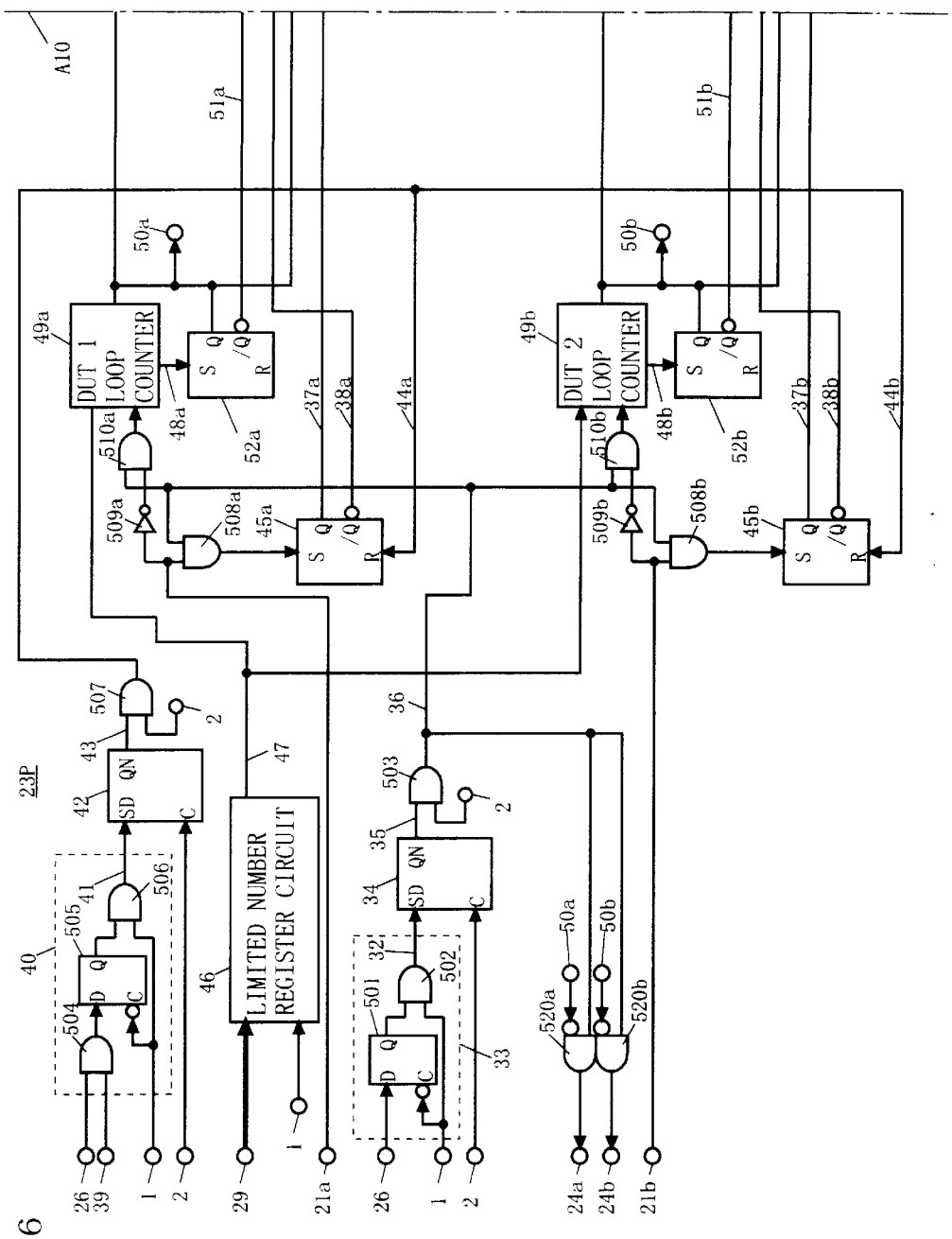
Figure 38:
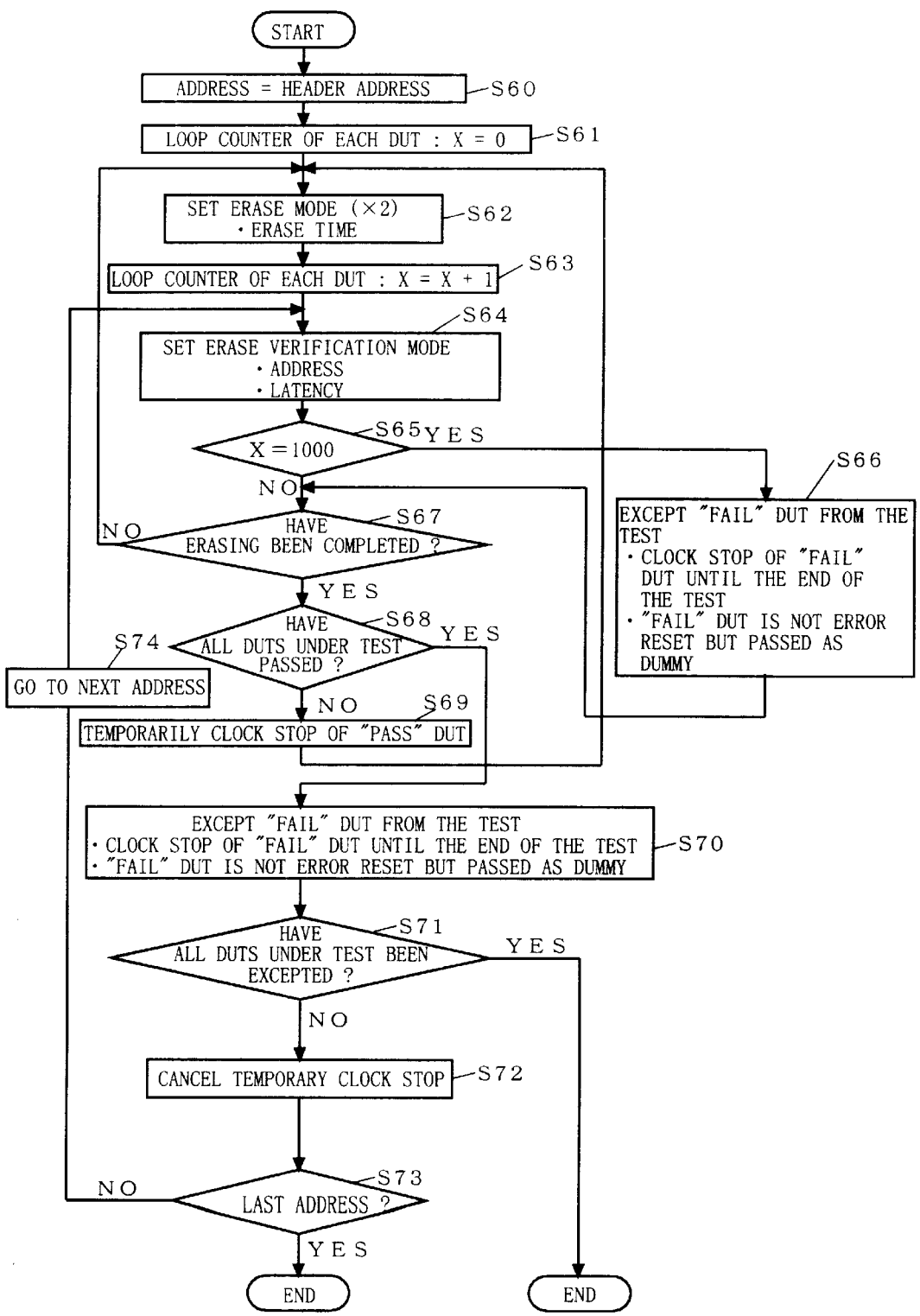
FIG. 38 is a flow chart of a test method of a conventional flash memory.
Figure 39:
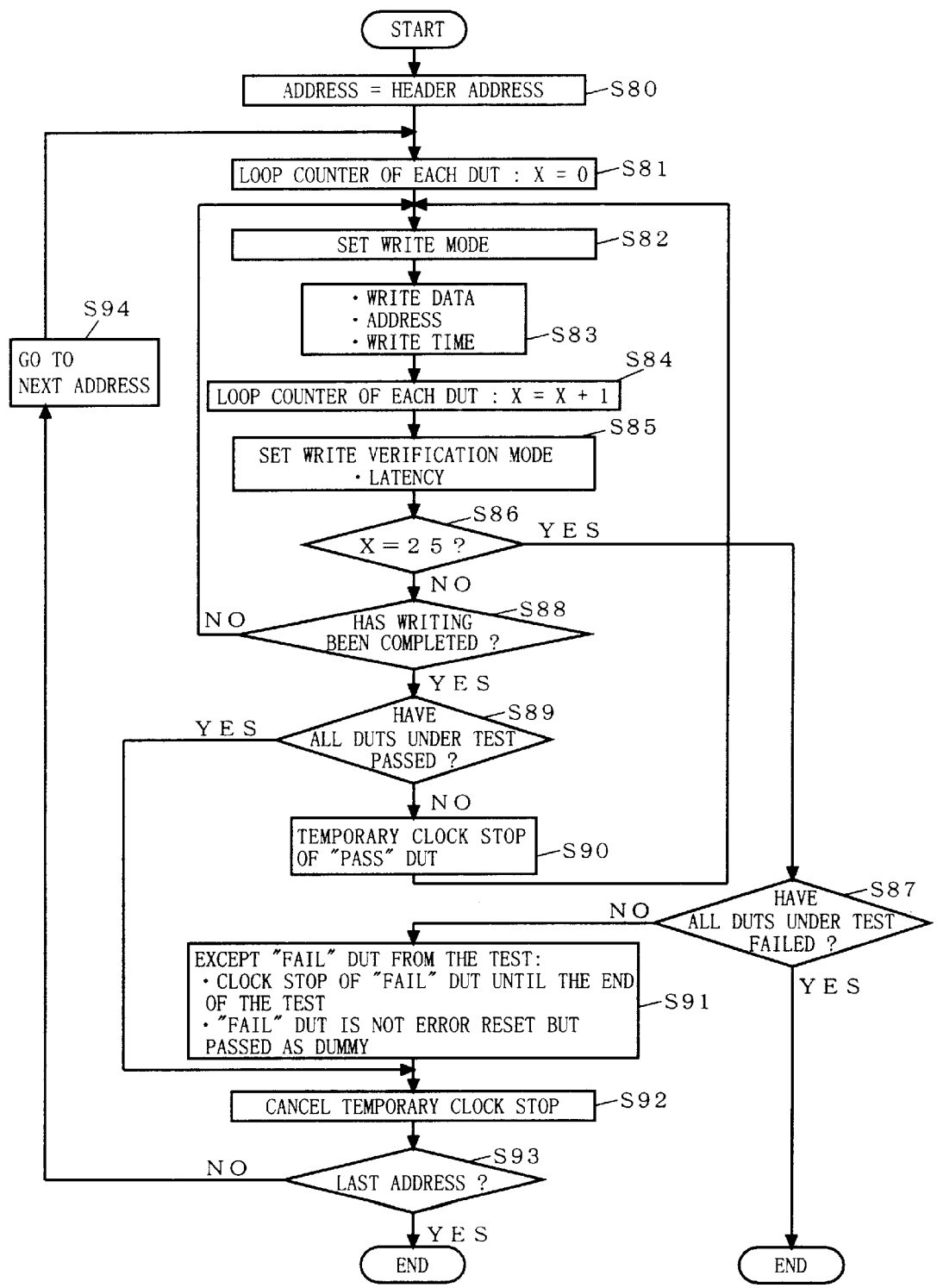
FIG. 39 is a flow chart of a write method of the conventional flash memory.

The remaining structure is the same as the corresponding structure of the conventional match controller portion 23P of FIGS. 36 and 37.

2-3. Explanation for FIG. 5

Figure 5:
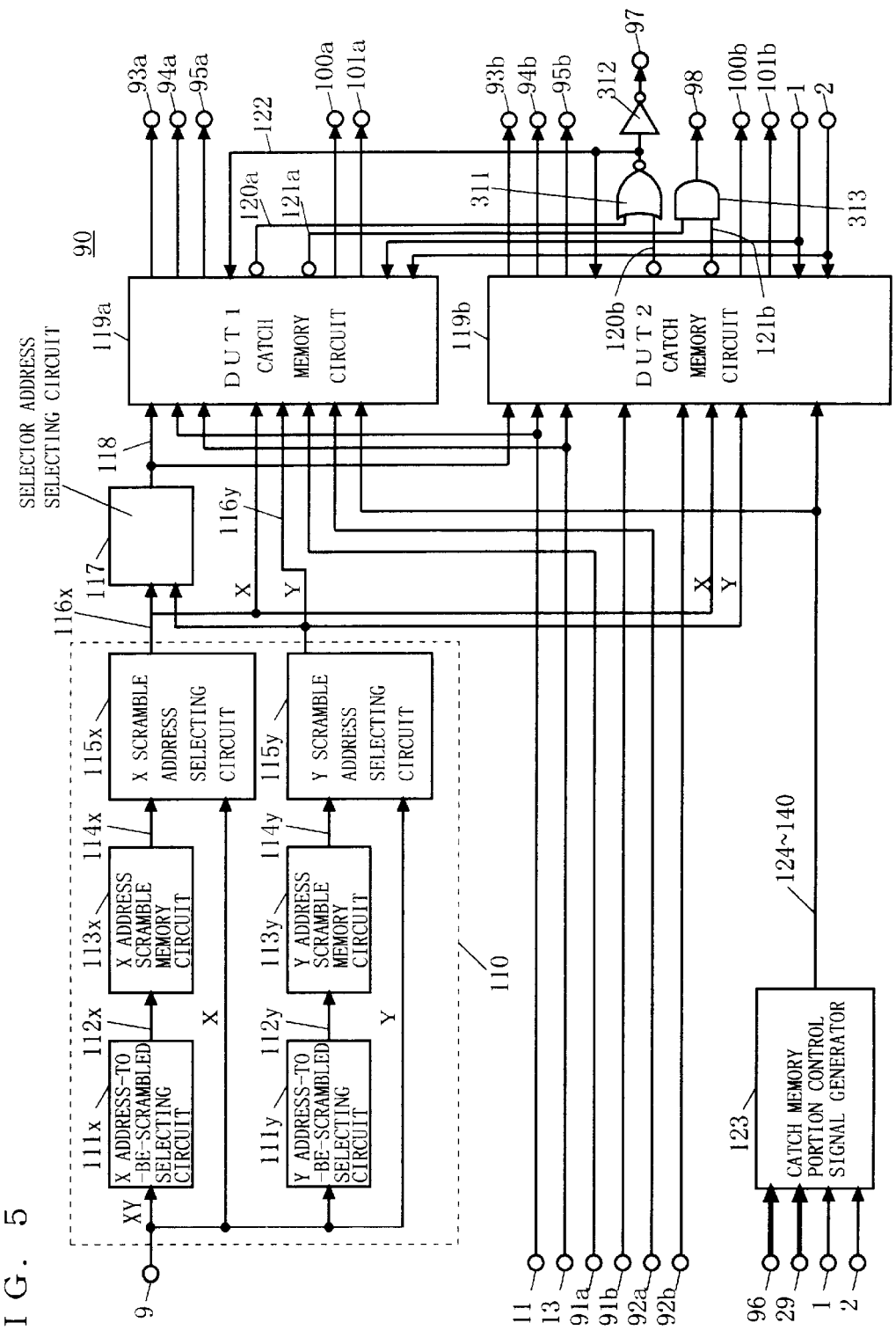
FIG. 5 is a schematic circuit diagram showing the details of an error catch memory portion.
Figure 6:
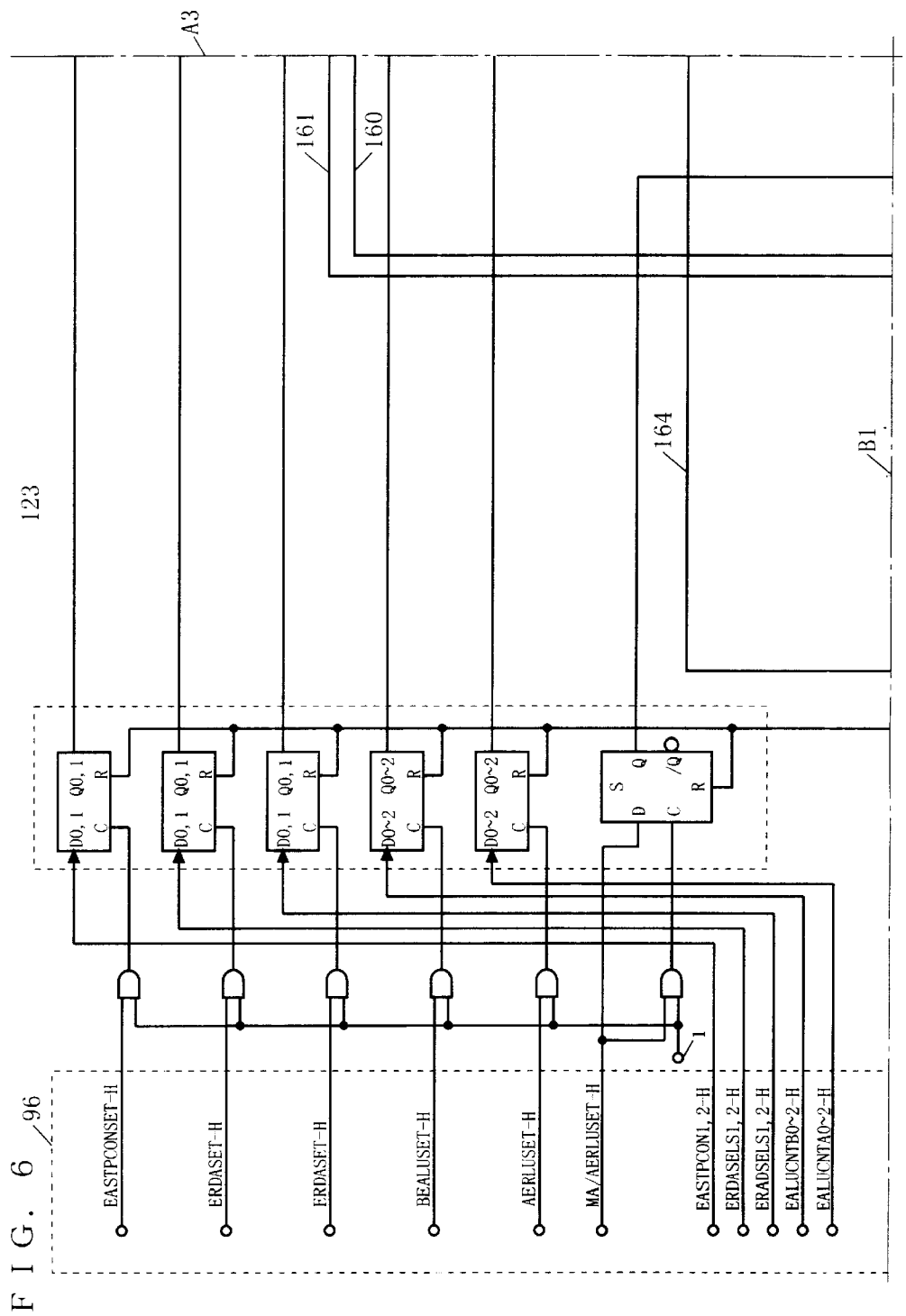
FIGS. 6 through 9 are schematic circuit diagrams showing the details of a control signal generator.
Figure 7:
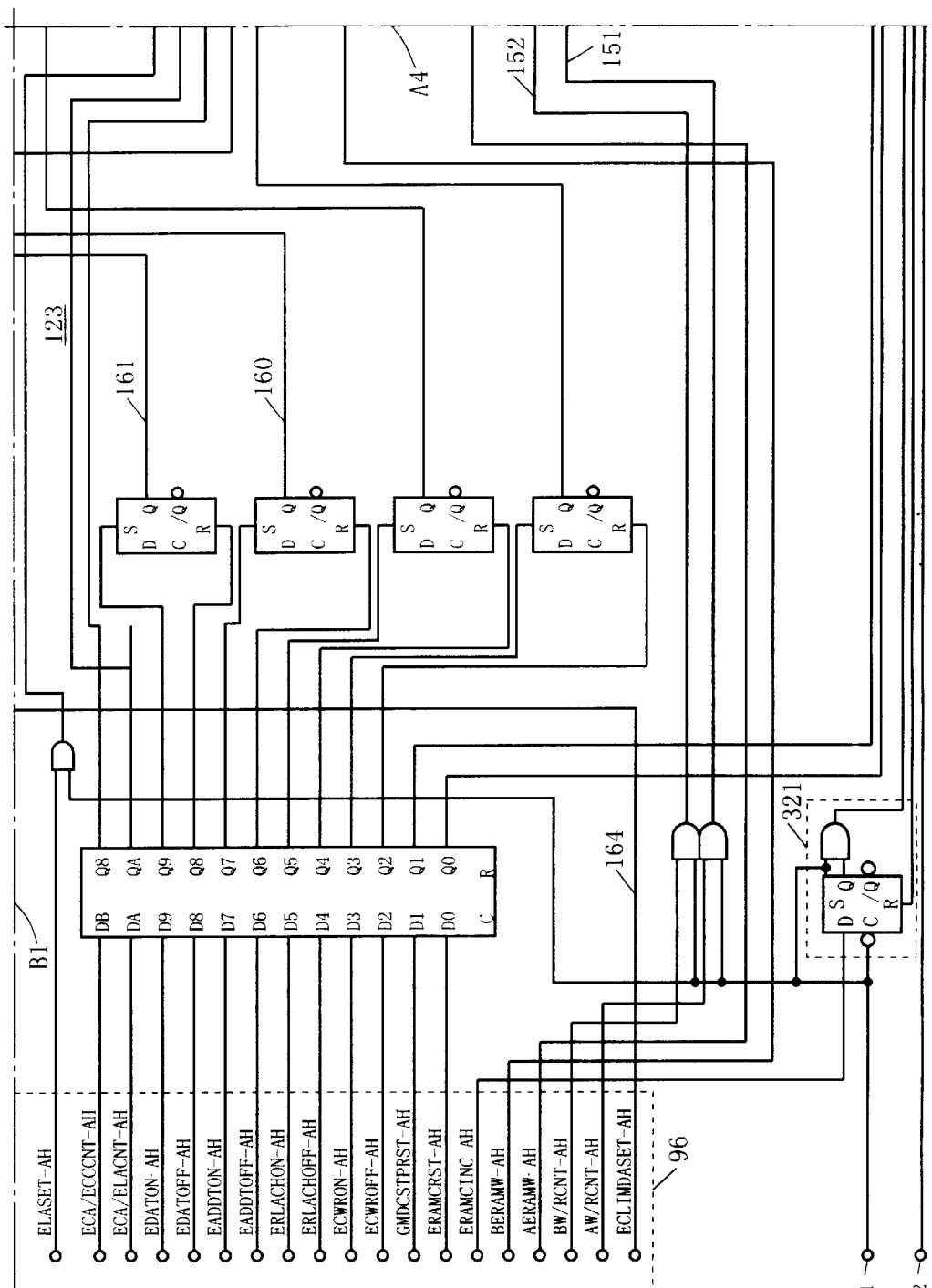
Figure 8:
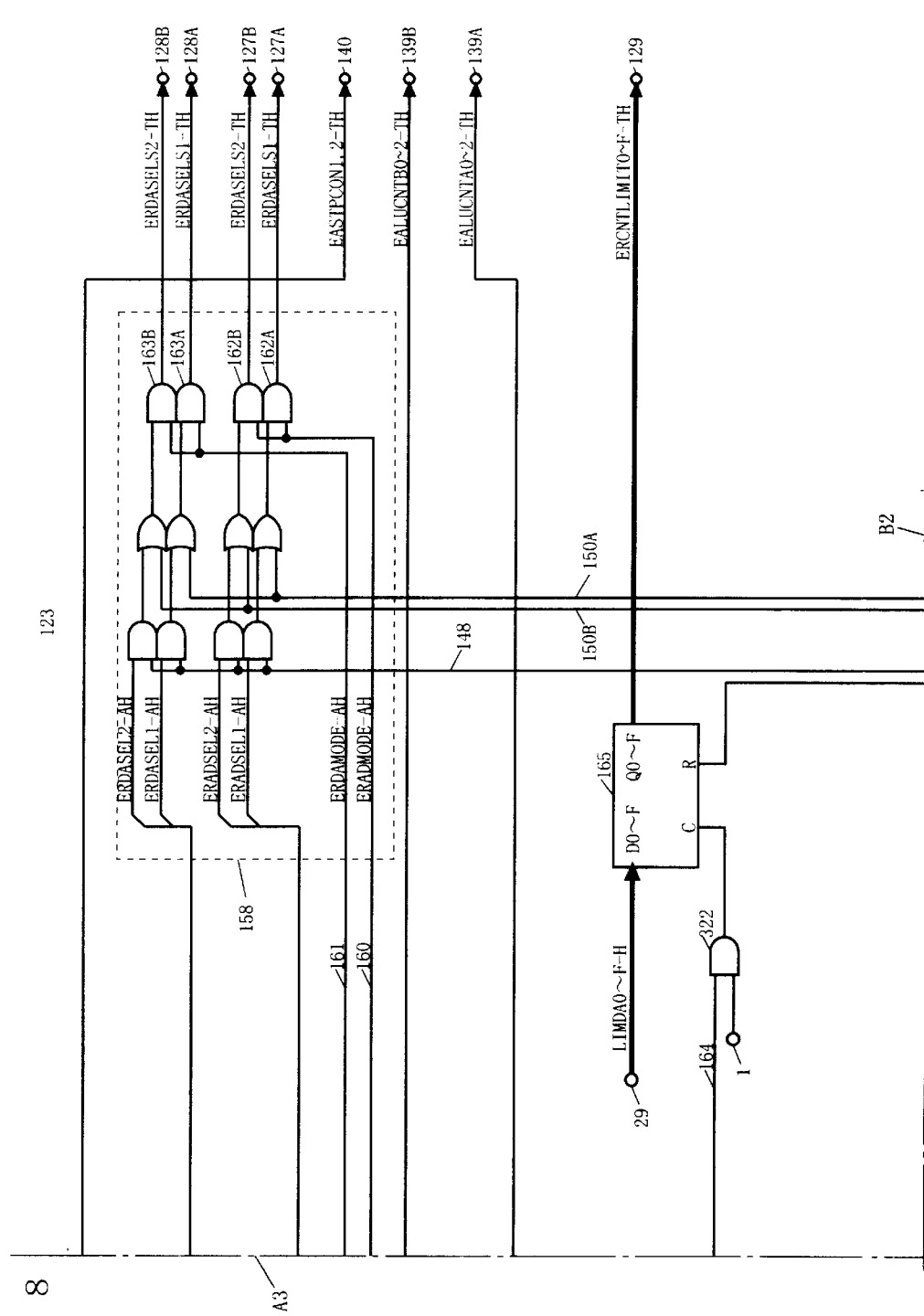
Figure 9:
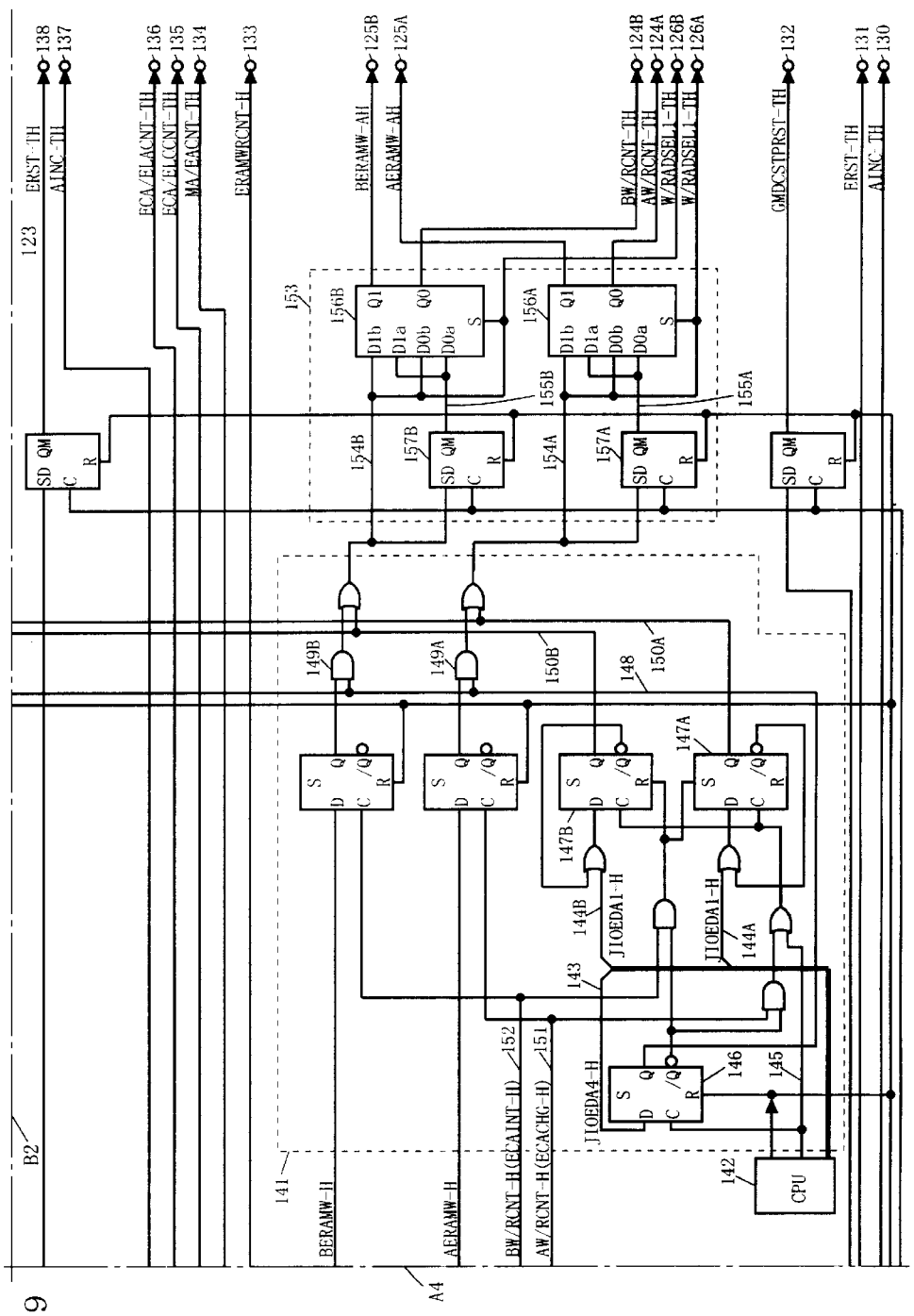

FIG. 5 shows an internal circuit configuration of the error catch memory portion 90. The error catch memory portion 90 of FIG. 5 comprises an address scrambling circuit 110 for translating the logical test address pattern 9 from the address generator 10 into a test pattern corresponding to a physical address of the memory under test 8. This scrambling circuit 110 includes an address-to-be-scrambled selecting circuit 111 (111x for address X, 111y for address Y) for selecting an address signal 112 (112x for address X, 112y for address Y) to be translated into a physical address out of the logical test address pattern 9; a scramble memory circuit 113 (113x for address X, 113y for address Y) for translating the selected address signal 112 into a memory address and storing the translated data; and a scramble address selecting circuit 115 (115x for address X, 115y for address Y) for selecting either a physically converted address signal 114 (114x for address X, 114y for address Y) or the logical address signal 9 in bits of the address. The address scrambling circuit 110 may be provided in the address generator 10.

The address scrambling circuit 110 makes it possible to fetch an error address in testing a memory under test by a physical address pattern for verification of memory cell interference.

Figure 40:
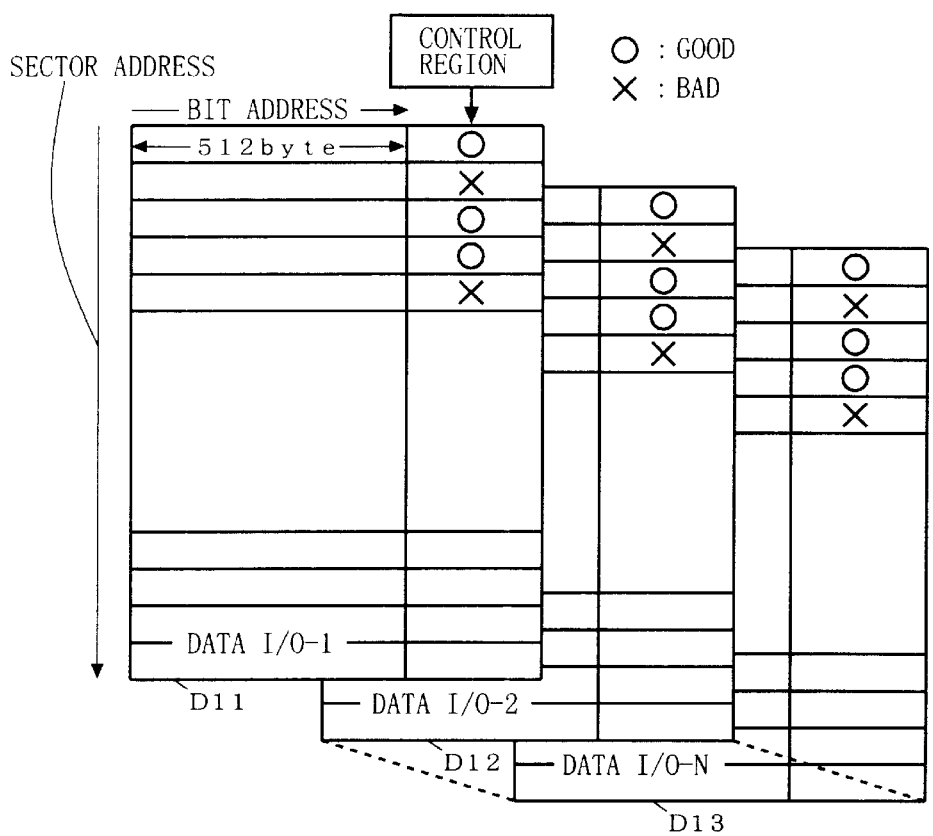
FIG. 40 is an illustration of a sector method.
Figure 41:
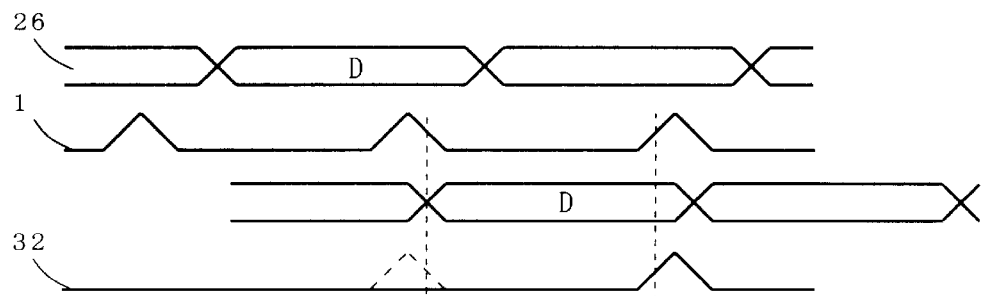
FIG. 41 is a timing chart showing generation of a control delay clock signal.
Figure 42:
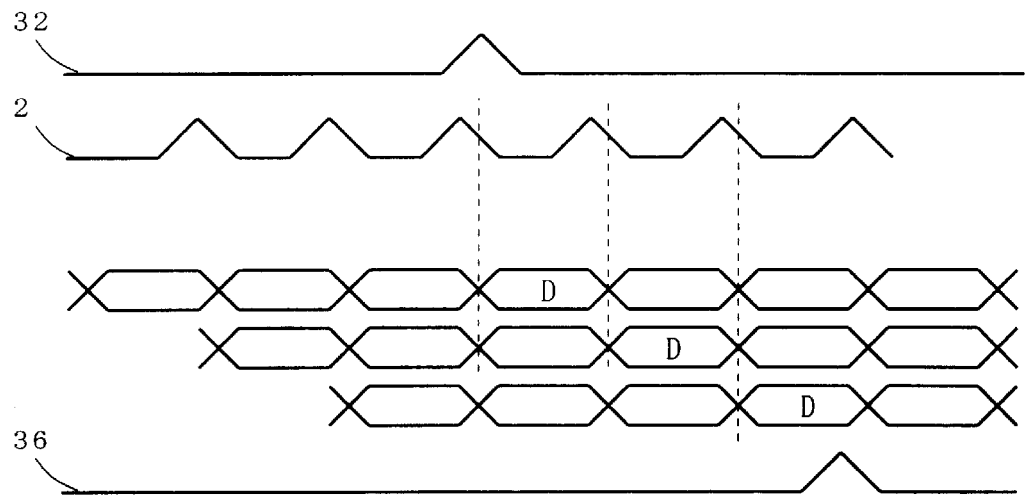
FIG. 42 is a timing chart showing signal generation based on the control delay clock signal.

FIG. 40 is an illustration of the concept of a sector method. As shown, tables DT11 through DT13 showing the data I/O in bits include a pass/fail judgment (○×) on each sector (512 bytes) allotted for each sector address. When all bit addresses of a sector address are normal, the corresponding sector is regarded as available.

In accordance with the sector method of the AND type flash memory shown in FIG. 40, a sector address selecting circuit 117 is provided for selecting an sector address out of an output address signal 116 (116x, 116y) of the circuit 110.

Since the AND type flash memory makes a pass/fail judgment by the sector address irrespective of the bit address, the sector address selecting circuit 117 selects only the sector address from the test pattern. When an error occurs, the circuit 117 outputs this selected address signal 118 to a catch memory circuit 119 (119a, 119b) as an error address.

The catch memory circuit 119 is a main circuit of the present invention which performs various processing on the basis of the error signals 91, 92, the test address signal 118, the test input data signal 11, the test check data signal 13, and control signals 124–140 of the catch memory from a control signal generator 123. The control signal generator 123 outputs these control signals on the basis of the control signal group 96 from the instruction memory 7.

An output signal 122 of an NOR gate 311 which receives output signals 120a, 120b of the catch memory circuits 119a, 119b returns to the catch memory circuits 119a, 119b. It is also outputted as the signal 97 via an inverter 312. The output of an AND gate 313 which receives output signals 121a, 121b of the catch memory circuits 119a, 119b becomes the signal 98. The input/output signals 120, 121, 122 of the catch memory circuit 119 will be described later.

2-4. Explanation for FIGS. 6–9

Figure 45:
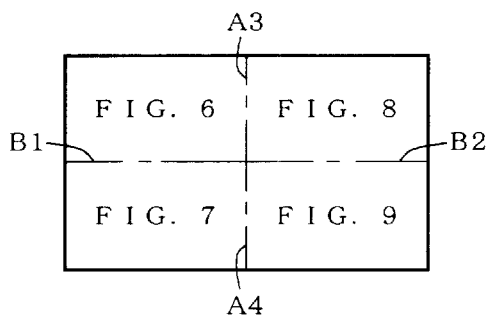

FIGS. 6 through 9 show a circuit configuration of the control signal generator 123 in the catch memory circuit 119. FIG. 45 shows connection between FIGS. 6 through 9. In the drawings, a periodic delay circuit 321 performs a periodic delay operation by the clock signals 1 and 2, like the periodic delay circuit 33 (cf. FIG. 33). Fine components which are not directly connected with the features of the present invention will not be described in the specification.

The catch memory circuit 119 comprises two catch-memory-circuit banks as means for simultaneously performing a fetch of error information and an output of the previously fetched error information. The circuit 123 thus generates a signal for controlling selection of those banks for fetching and outputting.

A bank switching circuit 141 uses a write signal 145 to hold bank switching mode information 143 and bank switching initial information 144A, 144B from a CPU 142 in latch circuits 146, 147A, and 147B, respectively. If the bank switching mode information 143 is "0", a signal 148 becomes "0" and individual bank control by the control signal group 96 is disabled at AND gates 149 (149A, 149B). At this time, if the bank switching initial information 144A is "1" and 144B is "0", an output signal 150A of the latch circuit 147A becomes "1" and an output signal 150B of the latch circuit 147B becomes "0". This initially sets the banks A and B for fetching and for outputting, respectively, and vice versa. In this initial setting, the status of the signal 150 alters during test in such a manner as "1"→"0"→"1"→"0" (or "0"→"1"→"0"→"1") every time a bank switching control signal 151 in the control signal group 96 is asserted (="1"). That is, automatic bank switching is available.

A signal 152 is a control signal for selecting the bank A as a write bank. In a catch memory portion write signal generator 153, if a bank switching signal 154A (or 154B) from the circuit 141 is "1", a selecting circuit 156A (or 156B) selects a signal 155A (or 155B) as a fetch mode and asserts (="1") memory write signals 124A, 125A (or 124B, 125B) of the bank A (or B) and an address-counter switching signal 126A (or 126B) of the catch memory circuit. If the bank swathing signal 154A (or 154B) is "0", on the other hand, the selecting circuit 156A selects the signal 154A (or 154B) as a read mode and negates (="0") the memory write signals 124A, 125A (or 124B, 125B) of the bank A (or B) and the address-counter switching signal 126A (or 126B) of the catch memory circuit.

A circuit 157 (157A, 157B) is a pipeline circuit provided to time a write signal given to the memory circuit to the input of the error signals. Similarly, a circuit 158 is also controlled by the signals 148 and 150. This circuit 158 has the function of selecting either the address signal 118 or the error address stored in the catch memory circuit 119 as an output address of the catch memory circuit 119. A selecting method when the signal 148 is "0" is described below. At this time, individual bank control by the control signal group 96 is disabled.

(1) If a control signal 160 is "0", AND gates 162 (162A, 162B) which receive the control signal 160 set both address selection signals 127A, 127B to "0". Accordingly, the address signal 11 is selected.

(2) If the control signal 160 is "1", address selection is made by the value of the signal 150:

If the signal 150A is "1" and 150B is "0", the address selection signals 127A and 127B become "1" and "0", respectively. Accordingly, an error address from the bank A is selected;

If the signal 150A is "0" and 150B is "1", the address selection signals 127A and 127B become "0" and "1", respectively. Accordingly, an error address from the bank B is selected.

The circuit 158 also has the function of selecting either the error data held in the data latch circuit or the error data stored in the catch memory circuit as error data for data operation in the catch memory circuit 119. A selecting method when the signal 148 is "0" is described below. At this time, individual bank control by the control signal group 96 is disabled.

(1) If a control signal 161 is "0", AND gates 163 (163A, 163B) which receive the control signal 161 set both error data selection signals 128A and 128B to "0". Accordingly, the output data of the error latch circuit is selected.

(2) If the control signal 161 is "1", error data selection is made by the value of the signal 150:

If the signal 150A is "1" and 150B is "0", the error data selection signals 128A and 128B become "1" and "0", respectively. Accordingly, error data from the bank A is selected;

If the signal 150A is "0" and 150B is "1", the error data selection signals 128A and 128B become "0" and "1", respectively. Accordingly, error data from the bank B is selected.

The control signal generator 123 further receives a control signal 164 in the control signal group 96 and the periodic clock signal 1 at its AND gate 322. Receiving the output of the AND gate 322 at its clock input C, a limited number latch circuit 165 holds and outputs limited number data 129 in synchronization with the output of the AND gate 322. The circuit 123 also generates signals 130–140. The detail of those signals will be described later with reference to FIGS. 10 through 12.

2-5. Explanation for FIG. 10

Figure 10:
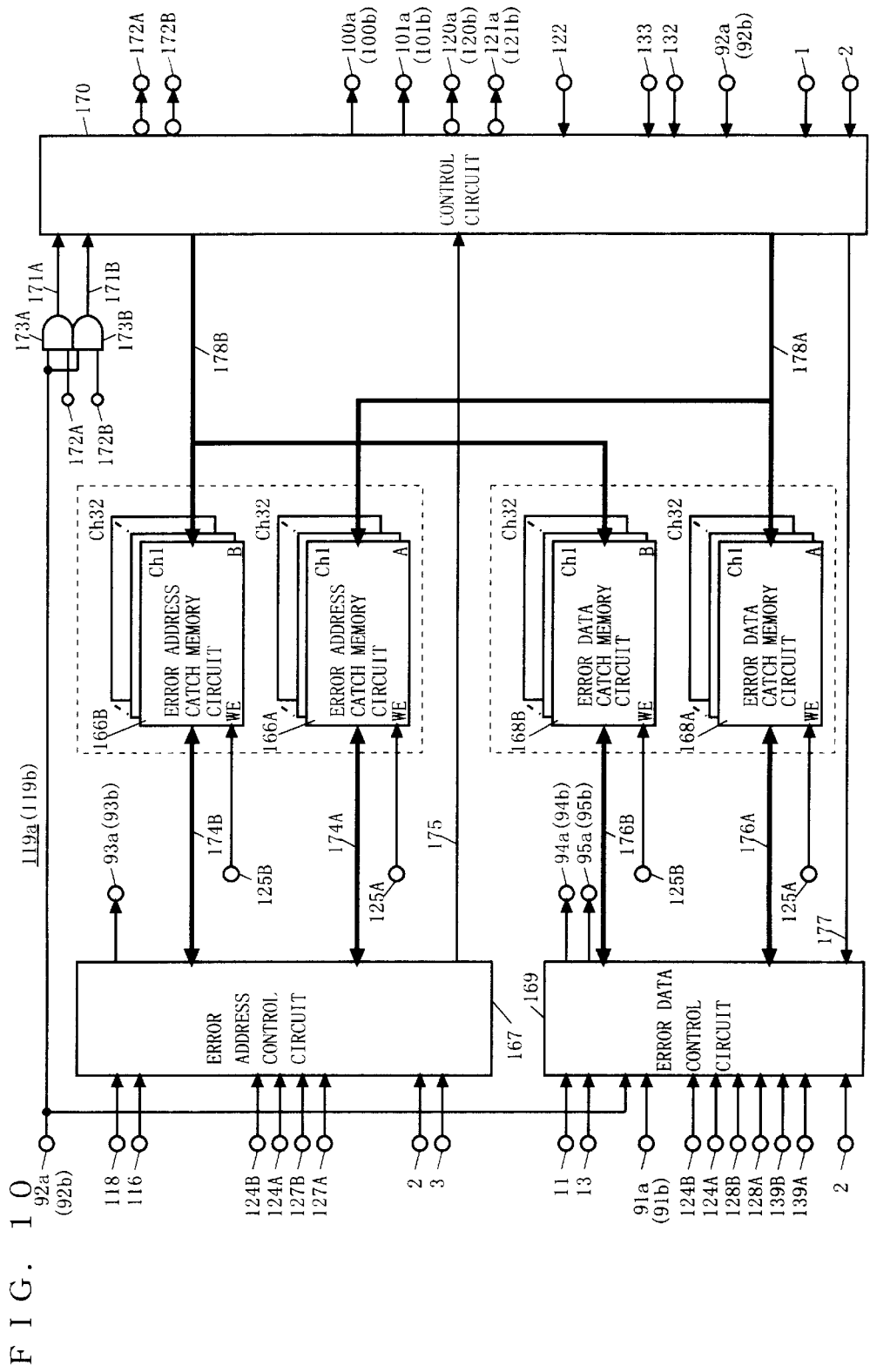
FIG. 10 is a schematic circuit diagram showing the details of a catch memory portion.

FIG. 10 show an internal circuit configuration of the catch memory circuit 119 (119a, 119b). The catch memory circuit 119 comprises an error address catch memory circuit 166 (166A, 166B) for fetching the address signal 118 when an error occurs (i.e., the error signal 92 (92a, 92b) is in its active state); an error address control circuit 167 for controlling the circuit 166; an error data catch memory circuit 168 (168A, 168B) for fetching the error signal 91 when an error occurs; an error data control circuit 169 for controlling the circuit 168; and a control circuit 170 including circuits for counting memory address counters of the circuits 166, 168 controlling (temporary) clock stop, and altering the execution address 17 in the program counter 18 under certain conditions. Each of the error address catch memory circuit 166 and the error data catch memory circuit 168 comprises two memory banks A and B in order to perform writing and reading simultaneously as previously described. The error signal 92 (error signal 171 (171A, 171B)) applied to each circuit is disabled through AND gates 173 (173A, 173B) when error mask signals 172 (172A, 172B) from the circuit 170 are "0". The remaining signals will be described with reference to FIGS. 11 through 18.

2-6. Explanation for FIG. 11

Figure 11:
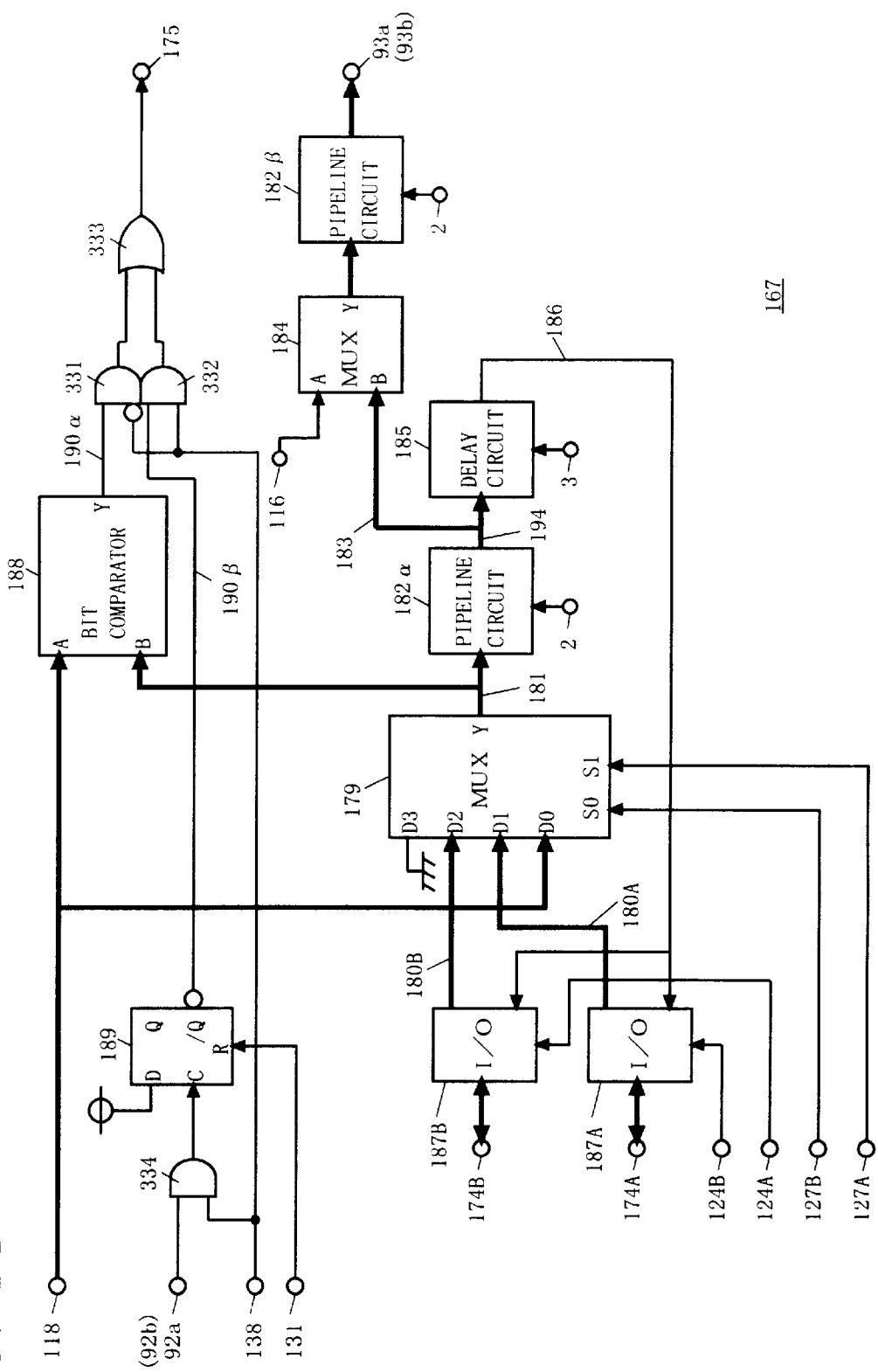
FIG. 11 is a schematic circuit diagram showing the details of an error address control circuit.

FIG. 11 is a schematic circuit diagram showing an internal configuration of the error address control circuit 167. The circuit 167 operates with the bank switching signals 124 and the address selection signals 127 of FIGS. 6 through 9 as control signals. A selecting method when the signal 148 (cf. FIGS. 6–9) is "0" is described below. Here an address selecting circuit 179 outputs, as its output Y (output address signal 181), data input D0 when its control inputs (S0, S1) is (0, 0), or data input D1 when (1,0), or data input D2 when (0, 1), or data input D3 when (1, 1).

(1) If the control signal 160 (cf. FIGS. 6–9) is "0", the address selection signals 127A and 127B both become "0". Thus, the address selecting circuit 179 selects the address 118.

(2) If the control signal 160 is "1":

If the signal 127A is "1" and 127B is "0", an error address signal 180A (174A) from the bank A is selected;

If the signal 127A is "0" and 127B is "1", an error address signal 180B (174B) from the bank B is selected.

The output address signal 181 of the address selecting circuit 179 is synchronized with the synchronizing clock signal 2 in a pipeline circuit 182α. Then, a selecting circuit 184 selects either an output signal 183 of the pipeline circuit 182α or the address signal 116 from the address scrambling circuit 110 (cf. FIG. 5) as a test address signal. The selected test address signal is further synchronized with the synchronizing clock signal 2 in a pipeline circuit 182β and outputted as the test address signal 93 of the memory under test 8.

At this time, as an address signal to fetch the test address signal 93 into the error address catch memory circuit 166, an address signal 186 is used. The signal 186 is obtained by timing the address signal 93 to the input of the error mask signal 172 by the delay clock signal 3 in a delay circuit 185.

This address signal 186 is passed through either of circuits 187 (187A or 187B) which inputs the control signal 124 (124A, 124B) taking on the value "1", and then written to the error address catch memory circuit 166. The other circuit 187 which inputs the bank switching signals 124 taking on the value "0", on the other hand, fetches the error address signal 174 from the error address catch memory circuit 166.

The error address control circuits 167 further comprises a bit comparator 188 for performing clock stop processing by comparing the address signal 118 with the error address signal 181 and for generating a bit comparison coincident signal 175 for test data signal switching. An output signal 190α of the circuit 188 enters at one input of an AND gate 331, while a signal 190β enters at one input of an AND gate 332. The other inputs of the AND gates 331 and 332 receive a control signal 138. An OR gate 333 inputs the outputs of the AND gates 331 and 332 and outputs the bit comparison coincident signal 175.

The output of an AND gate 334 which receives the error signal 92a and the control signal 138 enters at the clock input C of a switching circuit (D flip-flop) 189, and a signal from the inverted Q output $\overline{Q}$ of the switching circuit 189 becomes the signal 190β. The data input D of the switching circuit 189 is fixed to "1", and the reset input R thereof inputs a control signal 131.

Accordingly, the output signal 190α of the circuit 188 is valid when the control signal 138 is "0" and invalid when "1". When the control signal 138 is "1", the inverted output of the switching circuit 189, namely signal 190β, is selected. The circuit 189 holds error information in synchronization with the error signal 92a.

The status of the circuit 189 is initialized by the control signal 131 at its reset input R (i.e., the signal 190β becomes "1"). The control signal 131 is a signal which is outputted from the address generator 10 and asserted when the address changes.

2-7. Explanation for FIG. 12

Figure 12:
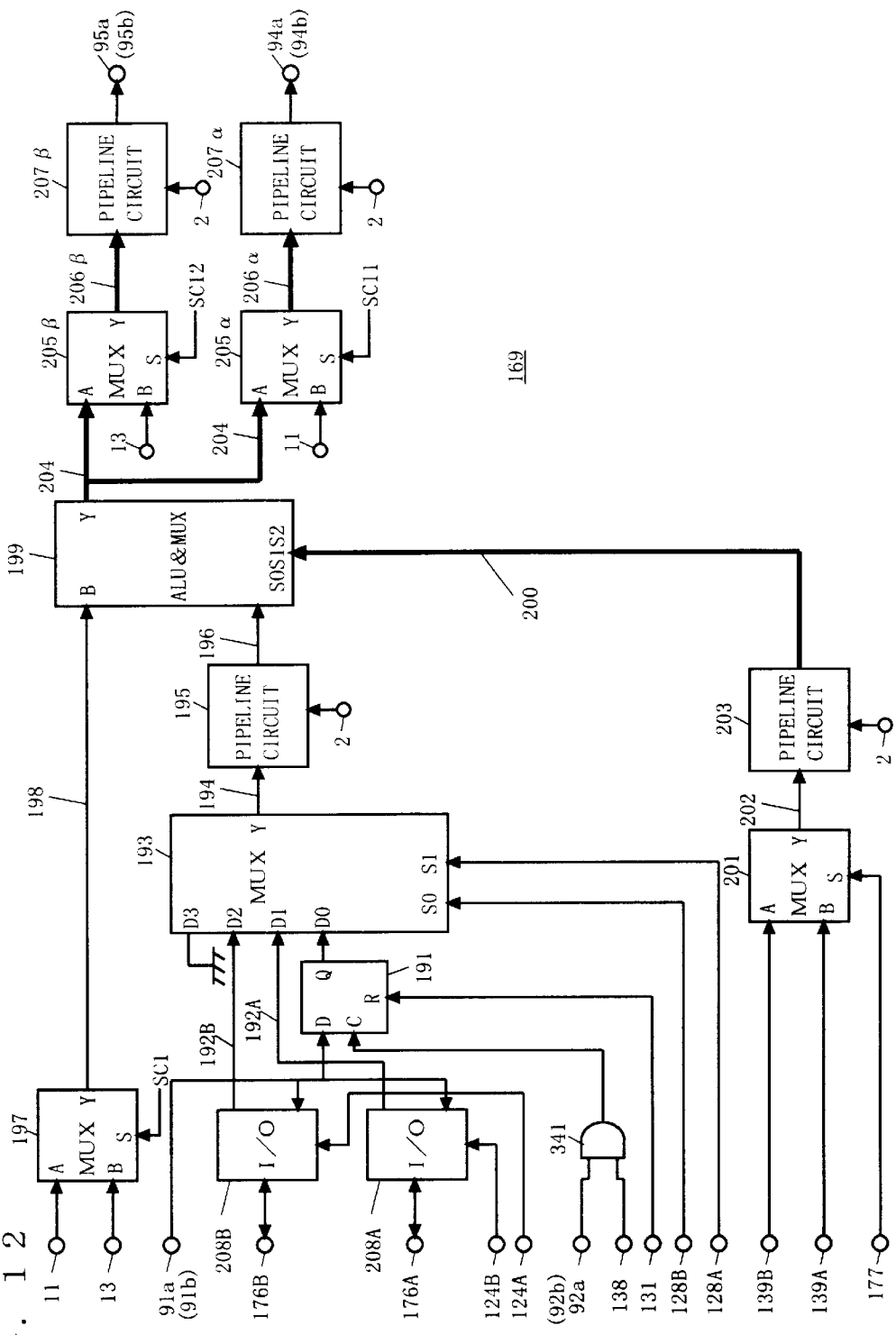
FIG. 12 is a schematic circuit diagram showing the details of an error data control circuit.
Figure 13:
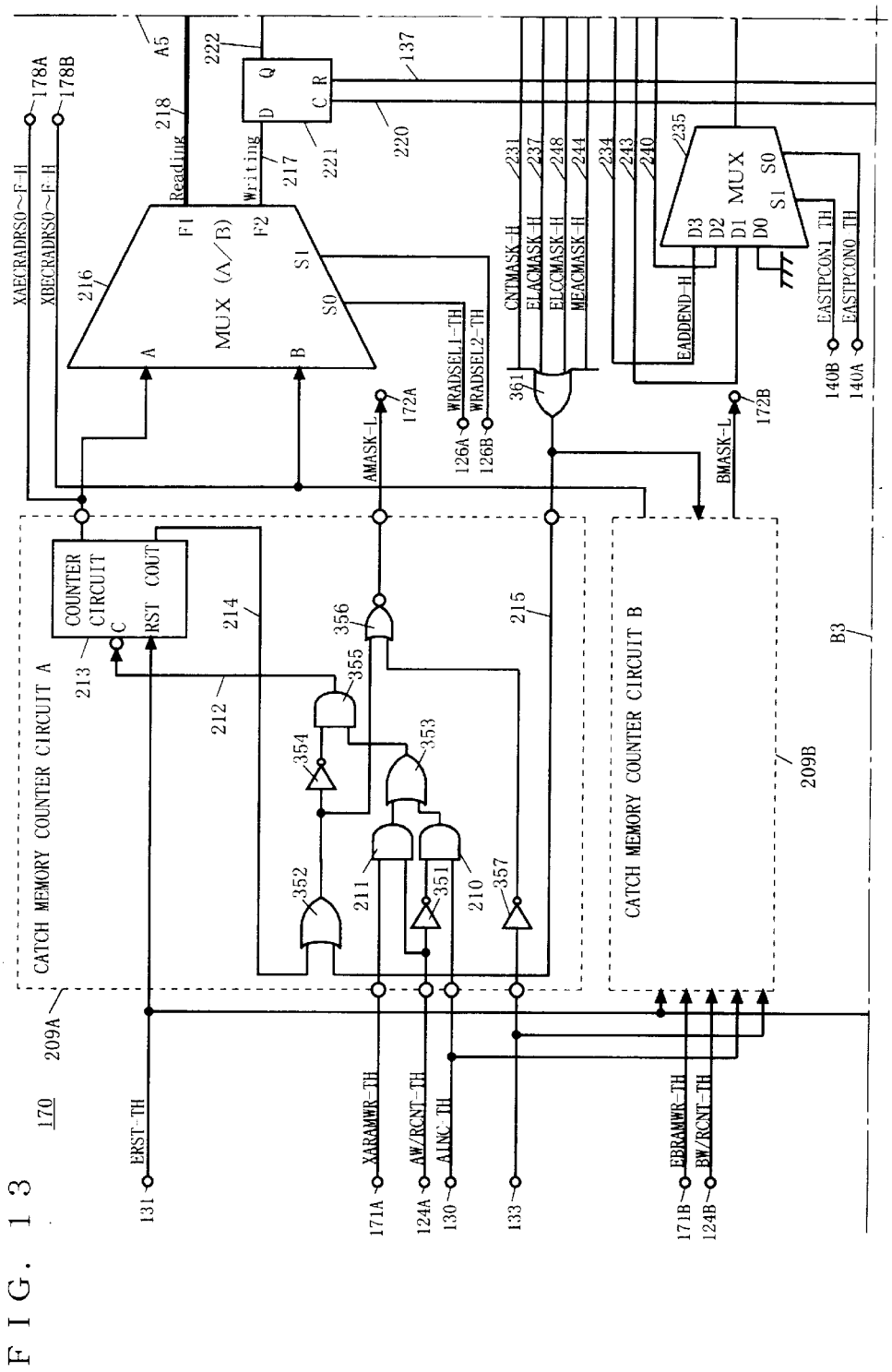
FIGS. 13 through 18 are schematic circuit diagrams showing the details of a control circuit.
Figure 14:
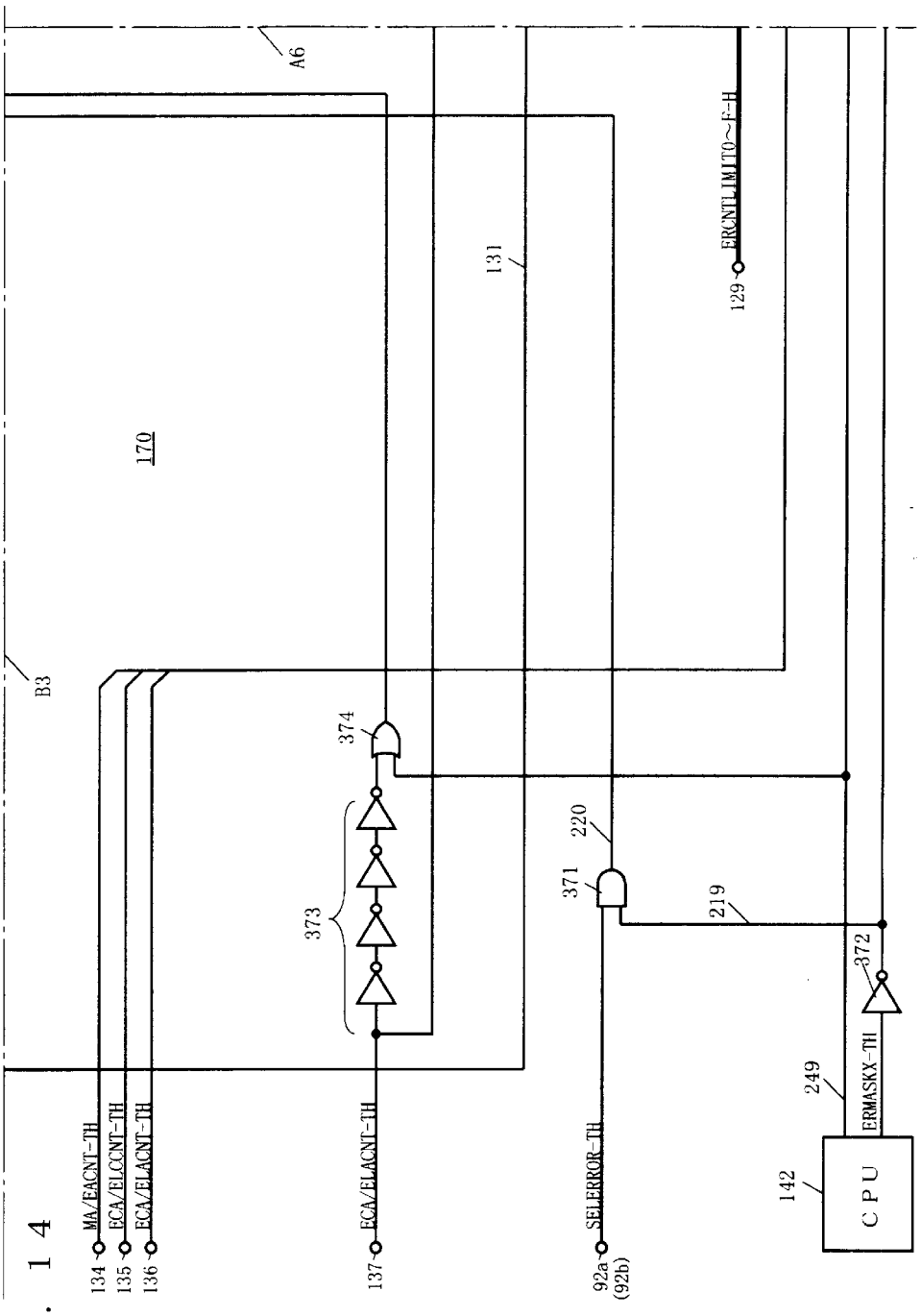
Figure 15:
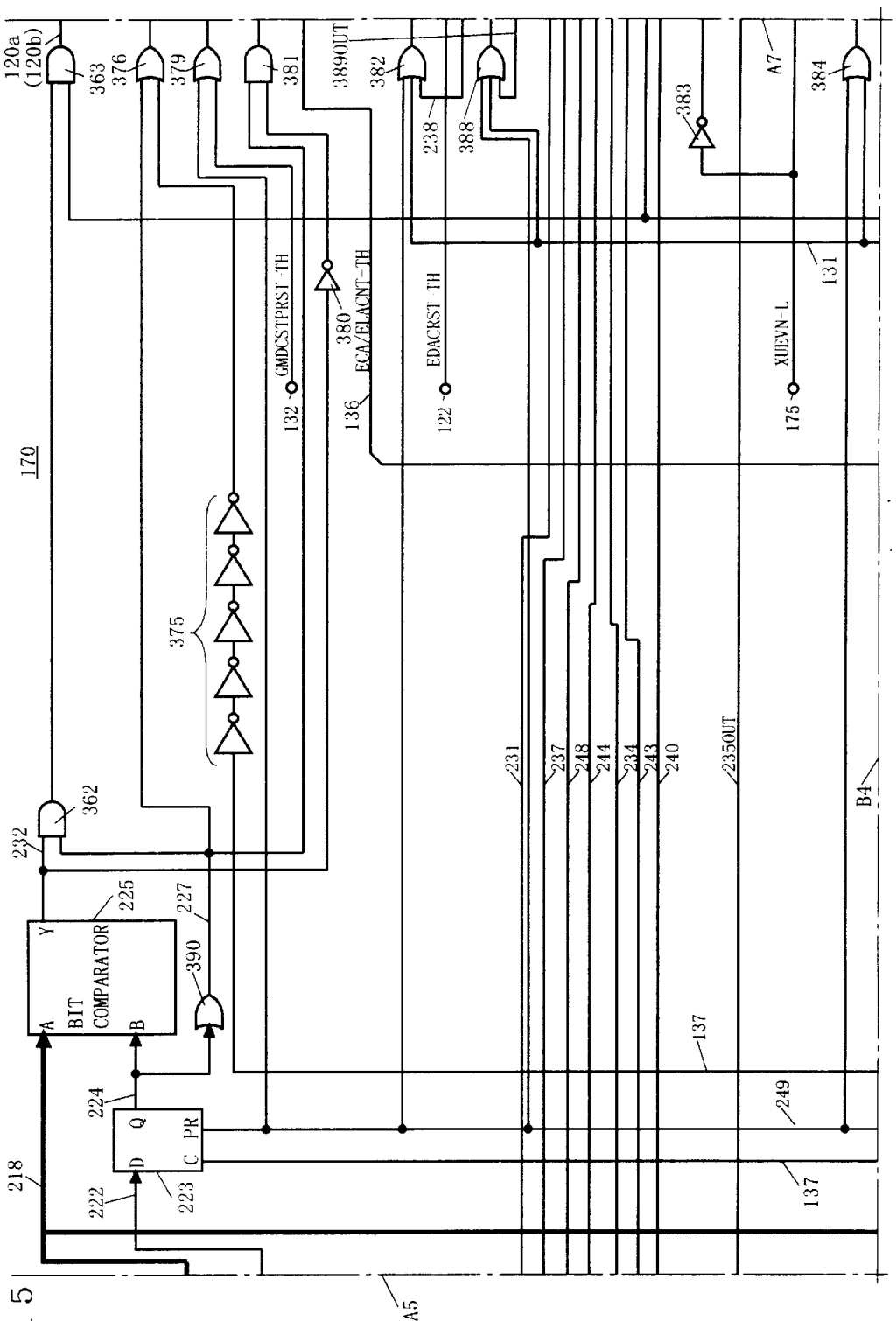
Figure 16:
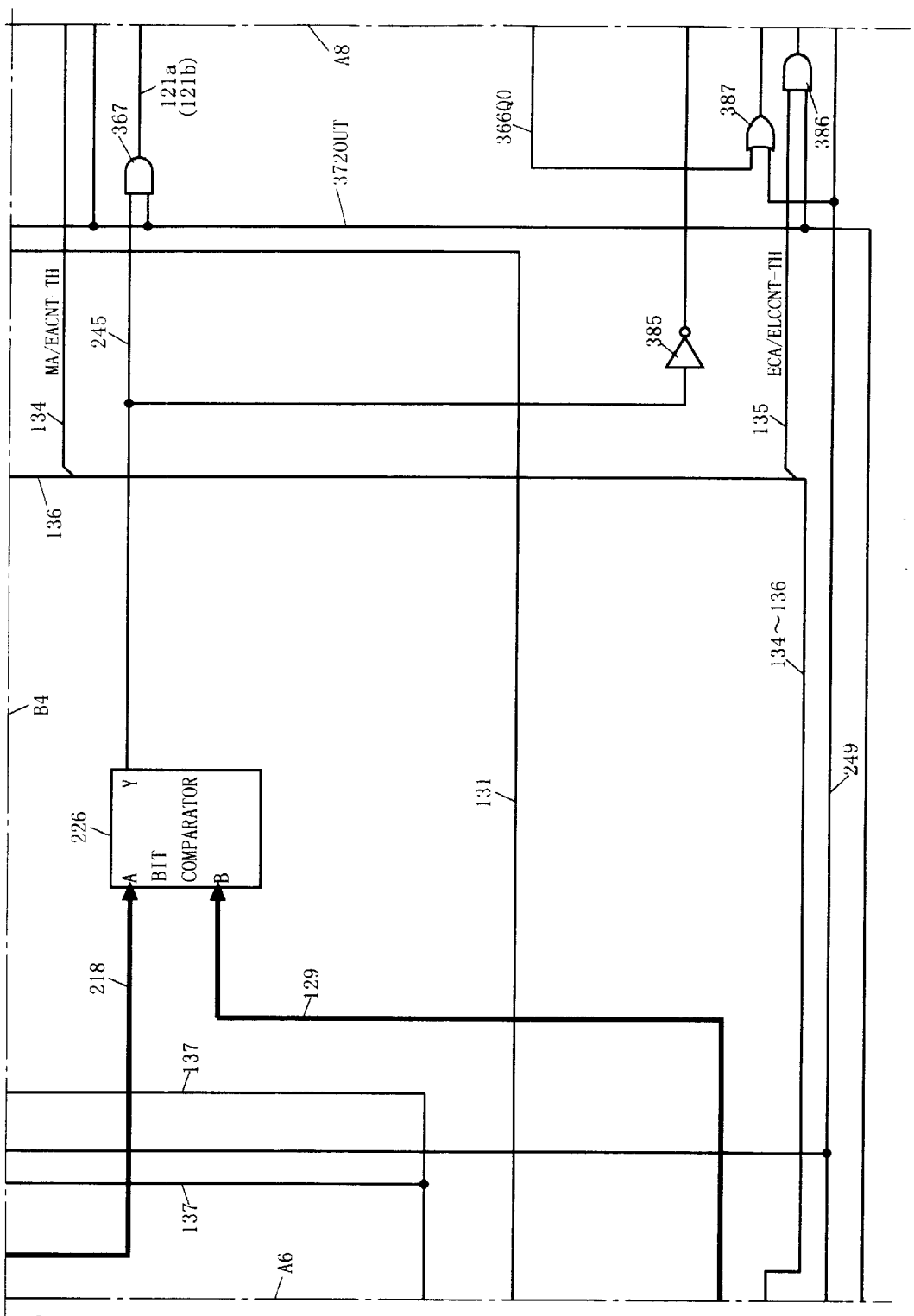
Figure 17:
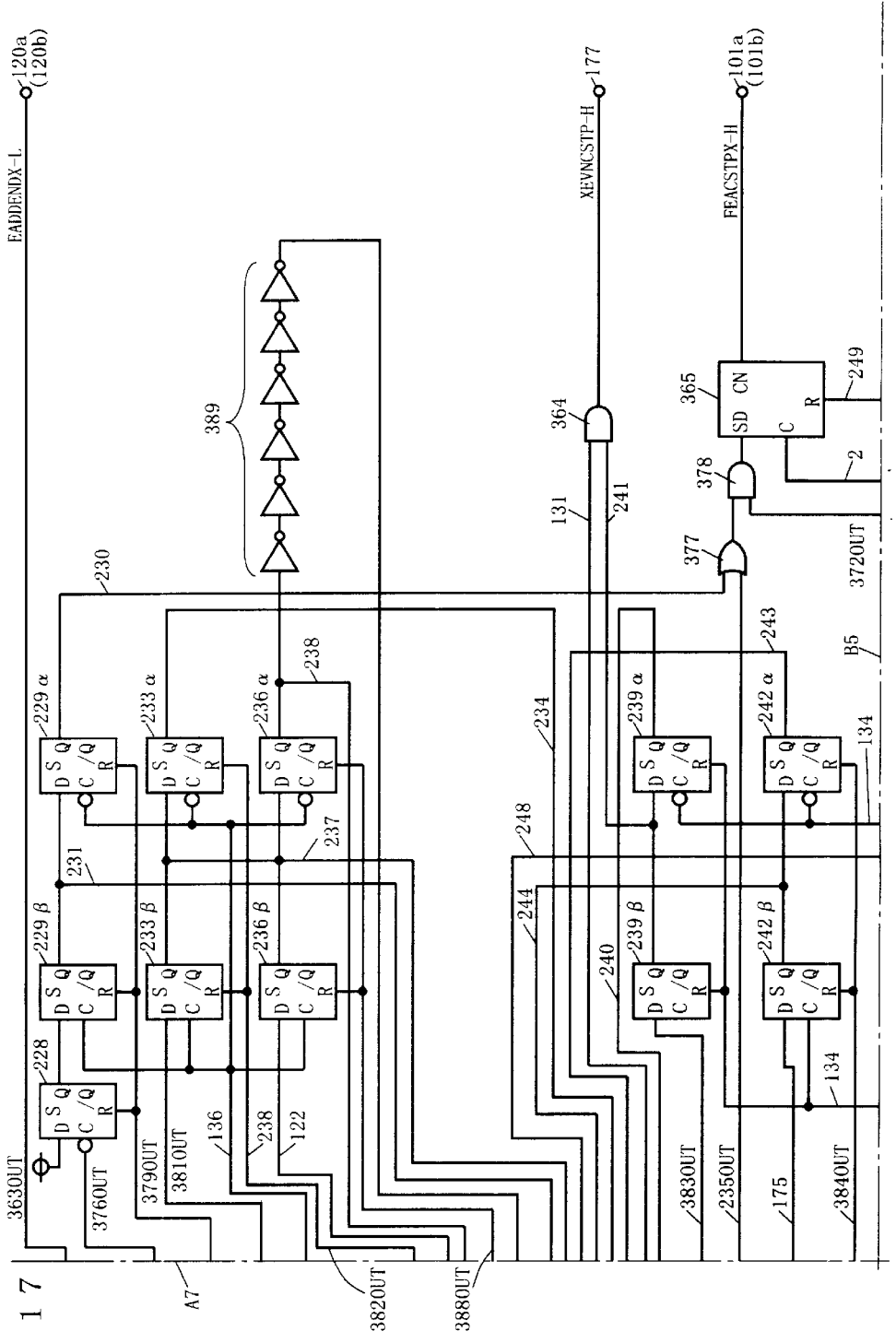
Figure 18:
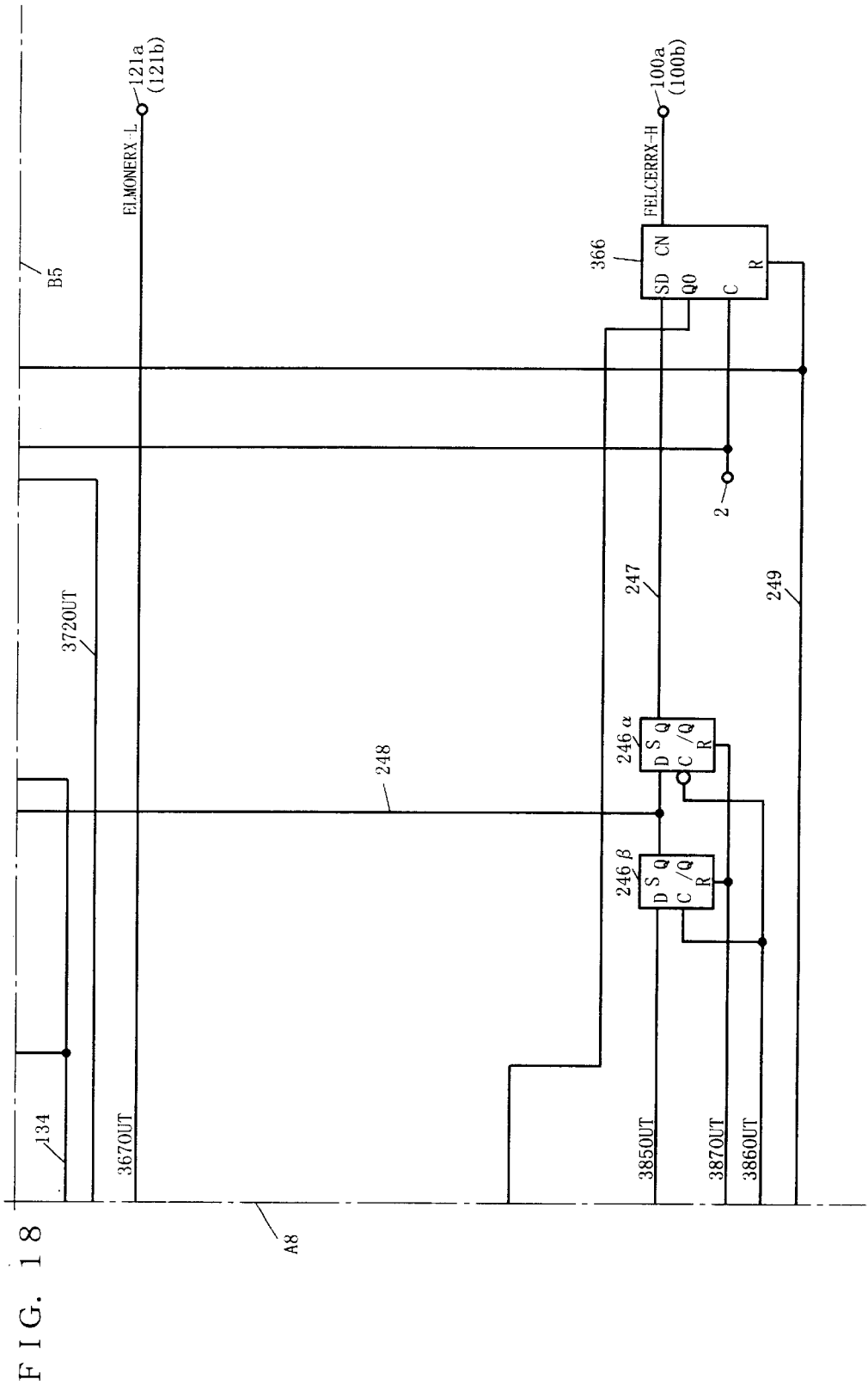

FIG. 12 shows a circuit configuration of the error data control circuit 169. The circuit 169 operates with the bank switching signal 124 and the error data selection signal 128 of FIGS. 6 through 9 as control signals. A selecting method when the signal 148 (cf. FIGS. 6–9) is "0" is described below. Here an error data selecting circuit 193 outputs, as its output Y (output data signal 194), data input D0 when its control inputs (S0, S1) are (0, 0), or data input D1 when (1, 0), or data input D2 when (0, 1), or data input D3 when (1, 1).

(1) If the control signal 161 (cf. FIGS. 6–9) is "0", the error data selection signals 128A and 128B both become "0". Accordingly, output data of an error latch circuit 191 is selected. The circuit 191 receives at its clock input C the output of an AND gate 341 which receives the error signal 92a and the control signal 138. When the control signal 138 is "1", the circuit 191 latches the error signal 91 in synchronization with the error signal 92a (this function is disabled when the control signal 138 is "0"). The status of the circuit 191 is initialized (="0") by the control signal 131 at its reset input R.

(2) If the control signal 161 is "1":

If the signal 128A is "1" and 128B is "0", an error data signal 192A from the bank A (i.e., output of an I/O buffer 208A receiving a signal 176A) is selected;

If the signal 128A is "0" and 128B is "1", an error data signal 192B from the bank B (i.e., output of an I/O buffer 208B receiving a signal 176B) is selected.

The output data signal 194 of the error data selecting circuit 193 is synchronized in a pipeline circuit 195 (output signal 196). A selecting circuit 197 selects either the test input data signal 11 or the test check data signal 13 on the basis of a selection control signal SC1 and outputs it as an output data signal 198. This output data signal 198 of the selecting circuit 197 and the signal 196 are processed by an arithmetic selecting circuit 199 which can perform arithmetic operations by the bit.

When a data switching signal 177 is "0", a selecting circuit 201 selects an arithmetic selection signal 139A as its output signal 202. When "1", on the other hand, the circuit 201 selects an arithmetic selection signal 139B. The arithmetic selection signals 139A and 139B are both three-bit signals corresponding to "a", "b" in the instruction "MA/EA a, b". The output signal 202 of the selecting circuit 201 is then synchronized with the signals 196 and 198 in a pipeline circuit 203 and outputted as a selection signal 200 to the arithmetic selecting circuit 199. The operations of the arithmetic selecting circuit 199 based on the selection signal 200 is shown in Table 1:

TABLE 1

| Y | S0 | S1 | S2 |
|---|----|----|----|
| A | 0 | 0 | 0 |
| B | 1 | 0 | 0 |
| Inverted A | 0 | 1 | 0 |
| Inverted B | 1 | 1 | 0 |

TABLE 1-continued

| Y | S0 | S1 | S2 |
|---|----|----|----|
| A AND B | X | 0 | 1 |
| A EXOR B | X | 1 | 1 |

X = Don't Care

In this fashion, the arithmetic selecting circuit 199 has arithmetic and selecting functions, so that it can process data for various specifications.

A selecting circuit 205 α selects either the test input data signal 11 or an output data signal 204 on the basis of a selection control signal SC11 and outputs it as an output signal 206α. The output signal 206α is synchronized in a pipeline 207α and outputted as the test input data signal 94a.

A selecting circuit 205β, on the other hand, selects either the test check data signal 13 or the output data signal 204 on the basis of a selection control signal SC12 and outputs it as an output signal 206β. The output signal 206β is synchronized in a pipeline circuit 207β and outputted as the test check data signal 95a.

Here the selection control signals SC1, SC11, SC12 are, for example, latch data of a latch which is previously addressed so that the CPU 142 can have access thereto. By appropriate writing on such latch, the CPU 142 can control switching of the selecting circuits 197, 201α, and 201β.

2-8. Explanation for FIGS. 13–18

Figure 46:
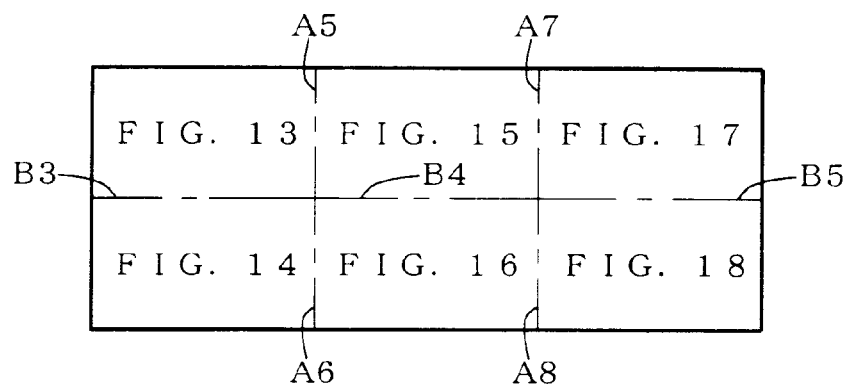
Figure 47:
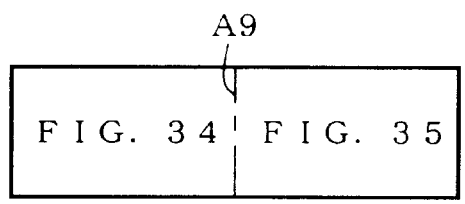
Figure 48:
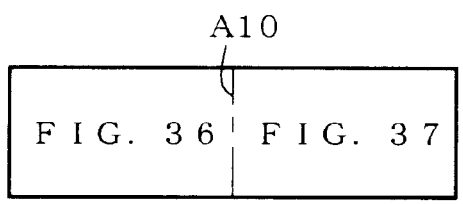

FIGS. 13 through 18 are schematic circuit diagrams showing an internal configuration of the control circuit 170. FIG. 46 shows connection between FIGS. 13 through 18. In the control circuit 170, catch memory address counter circuits 209 (209A, 209B) are circuits for generating the memory address signals 178 (178A, 178B) of the error address catch memory circuit 166 and the error data catch memory circuit 168. The circuit 209A corresponds to the bank A (circuits 166A, 168A) and the circuit 209B corresponds to the bank B (circuits 166B, 168B). The operation of the circuits 209 is as follows:

(1) If the bank switching signal 124A is "1" and 124B is "0":

(1-1) In the catch memory address counter circuit 209A:

The bank switching signal 124A taking on the value "1" disables control of a read counter add signal 130 at an AND gate 210 which receives the bank switching signal 124A via an inverter 351. Accordingly, the error signal 171A becomes valid at an AND gate 211. Receiving the outputs of the AND gates 210 and 211 via an OR gate 353, an AND gate 355 outputs an address count signal 212. Accordingly, when an error occurs, a counter circuit 213 increments (+1) the number of errors. This count becomes the memory address signal 178A to be a write memory address signal.

Further, if a carry output signal 214 when the count of the counter circuit 213 is maximum or a counter mask signal 215 from other circuits is "1", the address count signal 212 is fixed to "0" and the count is disabled since the output of an OR gate 352 which receives the signals 214 and 215 enters at the AND gate 355 via an inverter 354. At this time, the output of the OR gate 352 is also given to an NOR gate 356. Thus, the output of the NOR gate 356, namely the error mask signal 172A, becomes "0" and the error signal 171A is disabled at the AND gate 173A (cf. FIG. 10).

A control signal 133 enters at the NOR gate 356 via an inverter. Thus, if the signal 133 is "0", the signal 172A or output of the NOR gate 356 is forced to be "0".

(1-2) In the catch memory address counter circuit 209B:

The bank switching signal 124B taking on the value "0" disables control of the error signal 171B at the AND gate 211, and the read counter add signal 130 at the AND gate 210 becomes the count signal 212. Accordingly, at every rising edge of the signal 130, the counter circuit 213 is incremented (+1). This count becomes the memory address signal 178B to be a read memory address signal.

Further, if the carry signal 214 when the count of the counter circuit 213 is maximum or the counter mask signal 215 is "1", the count is disabled. At this time, the error mask signal 172B becomes "1" and the error signal 171B is disabled at the AND gate 173B (cf. FIG. 10).

If the control signal 133 is "0", the signal 172B is forced to be "1".

When the control signal 124A is "1" and 124B is "0", the control signals 126A and 126B become "1" and "0", respectively. Accordingly, a selecting circuit 216 selects the signal 178A as a write address signal 217 and the signal 178B as a read address signal 218. The counter circuit 213 is reset by a control signal 131.

(2) If the control signal 124A is "0" and 124B is "1":

In a similar fashion to the above (1), the selecting circuit 216 selects the signal 178A as the read address signal 218 and the signal 178B as the write address signal 217.

Next, we will describe the output signals 217 and 218 of the selecting circuit 216. An AND gate 371 receives at its one input the error signal 92*a* and at its other input a mask signal 219 which is obtained by passing a predetermined output of the CPU 142 through an inverter 372. In synchronization with the output of this AND gate 371, namely latch synchronizing signal 220, the write address signal 217 is fetched into a status holding circuit 221 (the mask signal 219 is to disable operations of control circuits on memories not under test and thus fixed during the test).

The status holding circuit 221 holds the status of the signal 217 every time an error occurs, so that it can hold a write memory address (the number of errors) when the last error occurs. After writing, an output signal 222 of the circuit 221 is held in a last address holding circuit 223 which is located at the post stage of the status holding circuit 221, by a control signal 137 (one of the control signal group 96). The status holding circuit 221 is then initialized. Here the control signal 137 is given to the reset input R of the status holding circuit 221 via an inverter group 373 and an OR gate 374. The OR gate 374 receives at its other input a forced reset signal 249 from the CPU 142.

When the last write catch memory circuit is used as a read catch memory circuit, a last address signal 224 held in the last address holding circuit 223 corresponds to the number of errors stored in that catch memory circuit. Therefore, address addition performed by that catch memory circuit can be controlled by comparing the signal 224 with the signal 218 in a bit comparator 225. Similarly, when a pass/fail judgment according to the number of errors is made simultaneously with reading error information from the catch memory circuit, the test can be controlled by comparing the limited number data 129 with the signal 218 in a bit comparator 226.

The control circuit 170 further controls various functions by fetching the coincident signal 175 that is obtained from the bit comparison between the address signal 118 and the error address signal 181 as described with FIG. 11. Now, we will describe circuits relating to the comparison.

(1) Circuit Relating to Coincident Signal 227

A coincident signal 227 is a signal that is asserted (="0") through an OR gate 390 when the last address signal 224 is "0". If the signal 227 is "0" after the write operation of the error information, it may be considered that no error occurs.

If the coincident signal 227 is "0" at the rising edge of the control signal 137, a status holding circuit 228 holds a "1". Here the control signal 137 is given to the inverted clock input C of the status holding circuit 228 via an inverter group 375 and an OR gate 376. The other input of the OR gate 376 receives the coincident signal 227.

At the rising and falling edges of the control signal 136 (delay of one period), the status of the circuit 228 is outputted to a status holding circuit 229α via a status holding circuit 229β, and a signal 230 becomes "1". This finally asserts (="1") the temporary clock stop signal 101*a* which is obtained through an OR gate 377, an AND gate 378, and a pipeline circuit 365, whereby the clock stop operation is performed in the match controller portion 23. In addition, since an output signal 231 of the status holding circuit 229β becomes "1" at the rising edge of the control signal 136, the circuit 209 is disabled by the counter mask signal 215 obtained through an OR gate 361.

The status of the signal 230 is initialized (="0") at the rising edge of a control signal 132 which is obtained through an OR gate 379.

(2) Circuits relating to Coincident Signal 232

A coincident signal 232 becomes "0" when the signal 218 agrees with the signal 224. It enters at one input of an AND gate 381 via an inverter 380. The other input of the AND gate 381 receives the coincident signal 227 and the output of the AND gate 381 is then latched into a status holding circuit 233β. Accordingly, the coincident signal 232 is valid only when the coincident signal 227 is "1" (i.e., the signal 224 is not "0" after the write operation of error information).

If the coincident signal 232 is "0" at the rising and falling edges of the control signal 136, the inverted value of the signal 232 is outputted from a status holding circuit 233α and a signal 234 becomes "1". At this time, if signals 140A and 140B are both "1", a clock stop selecting circuit 235 selects the signal 234. This finally asserts (="1") the temporary clock stop signal 101 which is obtained through the OR gate 377, the AND gate 378, and the pipeline 365, whereby the temporary clock stop operation is performed in the match controller portion 23.

In addition, since an output signal 237 of the status holding circuit 233β becomes "1" at the rising edge of the control signal 136, the circuit 209 is disabled by the counter mask signal 215 obtained through the OR gate 361.

If the signal 122 is "1" at the rising and falling edges of the control signal 136 (delay of one period), an output signal 238 of a status holding circuit 236α becomes "1" and is given to the reset inputs R of the status holding circuits 233α and 233β via an OR gate 382. This initializes (="0") the signal 234. The signal 234 is also initialized when the control signal 131 is "1" since the signal 131 is given to the reset inputs R of the status holding circuits 233α, 233β. The status holding circuits 236α and 236β receives at their reset inputs R the output of an OR gate 388. The OR gate 388 inputs the forced reset signal 249, the control signal 131, and an output signal of an inverter group 389 which receives the Q output of the status holding circuit 236α.

The coincident signal 232 is finally outputted through AND gates 362 and 363 as the execution address switching signal 120 of the program counter 18. If the signals 120 of all the memories under test are "0", the signal 97 becomes "0" (cf. FIG. 5). At this time, if the control signal 136 is "1", the execution address 17 is altered. A signal corresponding to the control signal 136 is also included in the control signal group 99 of the program counter 18. Thus, assertion of the control signal 136 results in assertion of the signal in the signal control group 99 corresponding to the control signal 136. That is, the signal corresponding to the signal 136 is fed to the error catch memory portion 90 and the program counter 18.

(3-1) Circuits relating to Coincident Signal 175 (cf. FIG. 11)

If the address signal 118 agrees with the error address signal 181, the coincident signal 175 becomes "0".

If the coincident signal 175 is "0" at the rising and falling edges of a control signal 134 (delay of one period), the inverted value of the signal 175 (which is obtained via an inverter 383) is outputted from a status holding circuit 239α via a status holding circuit 239β, and a signal 240 becomes "1". At this time, if the signal 140A is "0" and the signal 140B is "1", the clock stop selecting circuit 235 selects the signal 240. This finally asserts (="1") the temporary clock stop signal 101 which is obtained through the OR gate 377, the AND gate 378, and the pipeline circuit 365, whereby the temporary clock stop operation is performed in the match controller portion 23.

That is, the bit comparison coincident signal 175 has the function of asserting the temporary clock stop signal 101 when the address signal 118 agrees with the error address signal 181. Utilization of circuits relating to such a signal is as follows.

For instance, consider the case where an error sector address needs to be excepted from objects under test in the MGM test of the AND type flash memory. This can be achieved by selecting the signal 240 by the clock stop selecting circuit 235. That is, if the address signal 118 agrees with the error address signal 181, that sector address is excepted by asserting the temporary clock stop signal 101. Only if they disagree, the sector address is included in the objects under test.

In addition, at the rising edge of a control signal 134, an output signal 241 of the status holding circuit 239β is outputted through an AND gate 364 as the arithmetic selection data switching signal 177 (initial value ="0").

Thus, if the coincident signal 175 is "0", the signal 177 becomes "1" and data switching is performed. Since the control signal 131 enters at the reset inputs R of the status holding circuits 239α and 239β, the signal 240 is initialized (="0") when the control signal 131 is "1".

(3-2) Circuits relating to Coincident Signal 175

If the address signal 118 disagree with the error address signal 181, the coincident signal 175 becomes "1".

If the coincident signal 175 is "1" at the rising and falling edges of the control signal 134 (delay of one period), the status of the signal 175 is outputted from a status holding circuit 242α via a status holding circuit 242β, and a signal 243 becomes "1". At this time, if the signal 140A is "1" and the signal 140B is "0", the clock stop selecting circuit 235 selects the signal 243. This finally asserts (="1") the temporary clock stop signal which is obtained through the OR gate 3771 the AND gate 378, and the pipeline circuit 365, whereby the temporary clock stop operation is performed in the match controller portion 23.

That is, the bit comparison coincident signal 175 has the function of asserting the temporary clock stop signal 101 when the address signal 118 disagrees with the error address signal 181. Utilization of circuits relating to such a signal is as follows.

For instance, consider the case where only error sector addresses needs to be tested in the MGM test of the AND type flash memory. This can be achieved by selecting the signal 243 by the clock stop selecting circuit 235. That is, if the address signal 118 disagrees with the error address signal 181, that sector address is excepted from the test by asserting the temporary clock stop signal. If they agree, that sector address is included in the objects under test.

In addition, since an output signal 244 of the status holding circuit 242β becomes "1" at the rising edge of the control signal 134, the circuit 209 is disabled by the counter mask signal 215 obtained through the OR gate 361.

Further, since the control signal 131 enters at the reset inputs R of the status holding circuits 242α and 242β via the OR gate 384, the signals 243 and 244 are initialized (="0") when the control signal 131 is "1".

(4) Circuits relating to Coincident Signal 245

When the signal 218 agrees with the signal 129A, a coincident signal 245 becomes "0".

If the coincident signal 245 is "0" at the rising and falling edges of a control signal 135 (delay of one period), the inverted value of the signal 245 (obtained from the coincident signal 245 through an inverter 385) is outputted from a status holding circuit 246α via a status holding circuit 246β, and a signal 247 becomes "1". This finally asserts (="1") the error signal 100 which is obtained through a pipeline circuit 366, whereby retention of error information, clock stop operation, and forced termination of the test are performed in the match controller portion 23.

In addition, an output signal 248 of the status holding circuit 246β becomes "1" at the rising edge of the control signal 135 which is obtained through an AND gate 386. Accordingly, the circuit 209 is disabled by the counter mask signal 215 obtained through the OR gate 361.

Further, since the forced reset signal 249 from the CPU 142 enters at the reset inputs R of the status holding circuits 246α and 246β through an OR gate 387, the signal 247 is initialized (="0") when the forced reset signal 249 is "1".

The coincident signal 245 is finally outputted as the execution address switching signal 121 of the program counter 18 through an AND gate 367. When the signal 120 of any one memory under test is "0", the signal 98 becomes "0". At this time, if the control signal 135 is "1", the execution address 17 is altered. A signal corresponding to the control signal 135 is also included in the control signal group 99 of the program counter 18.

2-9. Explanation for FIGS. 19–23

The foregoing is the operation of the circuit configuration according to the first preferred embodiment. Next, FIG. 19 through 22 are flow charts showing a test flow including data rewriting processing for preventing excessive erasure by the circuits of the first preferred embodiment; and FIG. 23 shows a test pattern program corresponding to FIGS. 19–22. In the drawings, the same processing is denoted by the same reference character. The instructions of FIG. 23 are shown in TABLEs 2–6. TABLEs 2–6 show the functions of the instructions and TABLEs 7–11 show the operations thereof with the circuits and the signals of FIGS. 1 through 18.

TABLE 2

| Instruction | Function | Significant Bits |
|---|---|---|
| XE = n1 | Specify the number of bits (n1) of address X generated by address generator. (0 × 07 off = 11 bits) | Instruction description and subsequent bits |
| YE = n2 | Specify the number of bits (n2) of address Y generated by address generator. (0 × 03 off = 10 bits) | |
| XM = n3 | Set the initial value (n3) of address X. | |
| YM = n4 | Set the initial value (n4) of address Y. | |
| XCA = n5 | Set the last value (n5) of address X when address X is incremented. | |
| YCA = n6 | Set the last value (n6) of address Y when address Y is incremented. | |
| M/CA @ XM = XM + 1 L + 1 | (a) Continue to increment (+1) address X until XM = XCA and YM = YCA. (b) If address X is incremented when X = n1, address Y is incremented. At this time, address X becomes 0. | |
| REPn | Repeat instruction description bits n times. | |
| STOP | Indicates termination of test pattern program. | |
| NGD | If all DUTs have error, disable the function of forcefully terminating the test. | |
| NGE (*) | If all DUTs have error, enable the function of forcefully terminating the test. | |
| DPC n | Set limited number (n) (comparison resister data). | |
| FMAC @ | (a) Jump to address @ unless all DUTs pass (pass match function). If all DUTs pass or counter comes to limited number, go to the next address when DPCs agree. (b) At CTESTON instruction, increment (+1) loop counter of "error" DUT. (c) In FMAC loop: Bring "pass" DUT to temporary clock stop or cancel temporary clock stop, (CSTPAON, CSTPBON, CSTPCON, CSTPDON) Reset pin error information, Clock stop due to DPC match and error information will not be reset until the end of the test. (d) After FMAC loop, test can be forcefully terminated at NGE instruction. | Instruction description bits |

TABLE 3

| Instruction | Function | Number of Effective Bits |
|---|---|---|
| GCSRST | Cancel temporary clock stop or clock stop on "pass" DUT. | Instruction description bits |
| CSTPAON(*) | Enable only temporary clock stop function out of pass match functions. | Instruction description and subsequent bits |
| CSTPBON | (a) Enable temporary clock stop function out of pass match functions, (b) For each DUT under test, if error address disagrees with address from address generator, enable temporary clock stop function (valid for ERLCOFF instruction). (c) For each DUT under test, if error occurs, enable temporary clock stop function by error latch function (valid for ERLCON instruction) | |
| CSTPCON | (a) Enable temporary clock stop function out of pass match functions. (b) For each DUT under test, if error address agrees with address from address generator, enable temporary clock stop function (valid for ERLCOFF instruction). (c) For each DUT under test, if no error occurs, enable temporary clock stop function by error latch function (valid for ERLCON instruction) | |
| CSTPDON | (a) Enable temporary clock stop function out of pass match functions; (b) For each DUT under test, if address counter value of error catch memory agrees with last address counter value (ELA) latched at ELASET instruction, enable temporary clock stop function. | |
| CSTPDOFF | Disable clock stop function and temporary clock stop function. | |

TABLE 4

| Instruction | Function | Significant Bits |
|---|---|---|
| ECACLR | (a) Clear (= "0") address counter of error catch memory. (b) Initialize (= "0") latch data of error latch function. (c) Initialize functions of MA/EA a b instruction (①–③): ① Select output selection instruction (a), ② Cancel temporary clock stop (stop mode itself is valid), ③ Enable address increment at ECAINC instruction. (d) Initialize functions of ECA/ELA @ instruction (②, ④): ② Cancel temporary clock stop (stop mode itself is valid), ④ Enable address increment at ECAINC instruction. | Instruction description bits |
| ECAINC | Increment (+1) address counter of read-mode error catch memory (error catch memory consists of two banks A and B). | Next bits to instruction description bits |
| ECAINT | Place error catch memory A (or B) into write (or read) mode. | Instruction description bits |
| ECACHG | Change write (or read)-mode error catch memory into read (or write) mode. | |
| ECWRON | If error occurs, write error data and error address to write-mode error catch memory and increment (+1) address counter. | Instruction description and subsequent bits |
| ECWROFF(*) | Disable ECWRON instruction. | |
| ERLCON | Latch error by error latch function, and disable ① and enable ④ of MA/EA a b instruction. | |
| ERLCOFF(*) | Disable ECWRON instruction, and enable ① and disable ④ of MA/EA a b instruction. | |

TABLE 5

| Instruction | Function | Significant Bits |
|---|---|---|
| ERDAON | (a) Enable error data output function of read-mode error catch RAM (output | Instruction description and |

TABLE 5-continued

| Instruction | Function | Significant Bits |
|---|---|---|
| | data is selected at output selection instruction). (b) Error data indicated by output selection instruction = output data of error catch memory. | subsequent bits |
| ERDAOFF | (a) Disable ERADON instruction (i.e., placed in error latch output mode). (b) Error data indicated by output selection instruction = output data of error latch. | |
| RRMD [RRMI] | Select output data (or inverted output data) of data generator. | |
| RERD [PERI] | Select error data (or inverted error data). | |
| RRAE [RRXE] | Select AND (or EXOR) of error data and output data of data generator. | |
| MA/EA a b | ① For each DUT under test, if address (MA) from address generator disagrees with error address (EA) of error catch memory, output selection instruction (a) is used. If they agree, output selection instruction (b) is used. In either case, there's a choice of the above six instructions (RRMD, RRMI . . . ). ② Temporary clock stop function is valid (CSTPBON, CSTPCON). ③ For each DUT under test, if MA ≠ EA, disable address increment at ECAINC instruction. If MA = EA, enable it. ④ If latch data of error latch function is "0", output selection instruction (a) is used thereafter. If it is "1", output selection instruction (b) is used. | Instruction description bits; but for a, b, instruction description and subsequent bits bits |
| ERADON | Enable error address outfut function of read-mode error catch memory. | Instruction description and subsequent bits |
| ERADOFF | Disable ERADON instruction (i.e., placed in address output mode of address generator). | |

TABLE 6

| Instruction | Function | Significant Bits |
|---|---|---|
| ELASET | Latch last error data and address counter (ELA) of error catch memory when address is stored (cf. ECA/ELA @. | Instruction description bits |
| ECA/ELA @ | ① Jump to address @ unless address counter values (ECA) of error catch memories for all DUTs under test agree with last memory address value (ELA). If ECA = ELA or ELA = 0, go to delay bit. ② Temporary clock stop function is valid (CSTODON). If ECA = ELA for all DUTs under test, cancel temporary clock stop. ③ For each DUT under test, if ELA = 0 (i.e., status is held at ELASET instruction), stop the clock (clock stop can be canceled at GCSRST instruction). ④ Address increment at ECAINC instruction is: For each DUT under test, valid if ECA ≠ ELA, For each DUT under test, invalid if ECA = ELA or ELA = 0, Valid if ECA = ELA and ELA ≠ 0 for all DUTs under test. | |

TABLE 6-continued

| Instruction | Function | Significant Bits |
|---|---|---|
| ELC n | Set limited number of errors (n). | Instruction description and subsequent bits |
| ECA/ELC @ | ① Jump to address @ unless address counter value of error catch memory for each DUT under test agrees with limited number of errors (ELC). If ECA = ELC for any one of DUTs, go to the next bit. ② For each DUT, if ECA = ELC, stop the clock and hold error information until the end of the test. Test can be forcefully terminated but this information is not written to error catch memory. ③ For each DUT under test, if ECA ≠ ELC, enable address increment at ECAINC instruction. If ECA = ELC, disable it. | Instruction description |

TABLE 7

| Instruction | Operation | Referred Drawings |
|---|---|---|
| XE = n1, YE = n2 XM = n3, YM = n4 XCA = n5, YCA = n6 M/CA @ XM = XM + 1 L + 1 | Generate test address signal 9 in address generator 10. Address signal 18 used in catch memory circuit 119 is obtained from test address signal 9. | FIGS. 1, 2, 5 |
| REP n | Performed within program counter 18. Execution address 17 remains unchanged until completion of this instruction. | FIGS. 1, 2 |
| STOP | Performed within program counter 18 to stop operation of clock generator 6. | FIGS. 3, 4 |
| NGD | Set control signal 31b to "1" and 31a to "0". Accordingly, test termination signal 59 becomes "0". | |
| NGE | Set control signal 31a to "0" and 31b to "1". Accordingly, test termination signal 59 becomes "1". | |
| DPC n | Latch limited number signal 29 into limited number register circuit 46. | |
| FMAC @ | Control all functions synchronized with match control signal 26 (36) of FIG. 2. | |
| GCSRST | Set control signal 132 to "1" and initialize (= "0") output signals 230, 231 of circuits 228, 229. | FIGS. 6–9, FIGS. 13–18 |

TABLE 8

| Instruction | Operation | Referred Drawings |
|---|---|---|
| CSTPAON | Set control signal 102a to "1" and 102b to "0". Accordingly, signal 108 becomes "1". Set clock stop selection signals 140a and 140b to "0". Accordingly, not (temporary) clock stop signal from error catch memory portion 90 but (temporary) clock stop signals 37 and 50 of the match controller portion 23 are used. | FIGS. 1, 2 FIGS. 3, 4 FIGS. 6–9, FIGS. 13–18 |

TABLE 8-continued

| Instruction | Operation | Referred Drawings |
|---|---|---|
| CSTPBON | Set control signal 102a to "1" and 102b to "0". Accordingly, signal 108 becomes "1". Set clock stop selection signals 140a and 140b to "1". Accordingly, temporary clock stop signal 234 is selected. It is also possible to use (temporary) clock stop signals 37 and 50 of match controller portion 23. | |
| CSTPCON | Set controls signal 102a to "1" and 102b to "0". Accordingly, signal 108 becomes "1". Set clock stop selection signal 140a to "0" and 140b to "1". Accordingly, temporary clock stop signal 240 is selected. It is also possible to use (temporary) clock stop signals 37 and 50 of match controller portion 23. | |
| CSTPDON | Set control signal 102a to "1" and 102b to "0". Accordingly, signal 108 becomes "1". Set clock stop selection signal 140a to "1" and 140b to "0". Accordingly, temporary clock stop signal 243 is selected. It is also possible to use (temporary) clock stop signals 37 and 50 of match controller portion 23. | |
| CSTPOFF | Set control signal 102a to "0" and 102b to "1". Accordingly, signal 108 becomes "0". | |

TABLE 9

| Instruction | Operation | Referred Drawings |
|---|---|---|
| ECACLR | Set control signal 131 to "1" and perform the following processing: Initialize (= "0") counter circuit 213; Initialize circuits 239, 242 and set signals 240, 241(177), 243, 244 to "0"; Initialize circuits 233, 236 and set signals 234, 237, 238 to "0"; Initialize circuits 189, 191 and set signal 190b to "1". | FIGS. 6–9, FIG. 11 FIG. 12 FIGS. 13–18 |
| ECAINC | Set control signal 130 to "1" and counts counter circuit 213 (valid only when control signal 124 is "0"). | FIGS. 6–9, FIGS. 13–18 |
| ECAINT | Set control signal 152 to "1", and signal 154a to "1" and 154b to "0" (valid only when signal 148 is "1"). | |
| ECACHG | Set control signal 152 to "1"; and changes signal 154a from "1" to "0" or "0" to "1" and 154b from "0" to "1" or "1" to "0" (valid only when signal 148 is "1"). | |
| ECWRON | Set control signal 133 to "1" to enable error fetch into catch memory circuit 119. | FIGS. 6–9, 10 FIGS. 13–18 |
| ECWROFF | Set control signal 133 to "0" to disable error fetch into catch memory circuit 119. | |
| ERLCON | Set control signal 138 to "1" to enable error fetch into error latch circuits 189, 191 and signal 190b. | FIGS. 6–9, FIG. 12 |
| ERLCOFF | Set control signal 138 to "0" to disable error fetch into error latch circuits 189, 191 and to enable signal 190a. | |
| ERDAON | Set control signal 161 to "1" to enable bank switching by signals 128a and 128b. | |
| ERDAOFF | Set control signal 161 to "0" and signals 128a, 128b to "0" (selection of signals 11, 13 obtained from data generator 14). | |

TABLE 10

| Instruction | Operation | Referred Drawings |
|---|---|---|
| RRMD [RRMI] RERD [RERI] REAE [REXE] | Perform data selection in circuit 199 on receipt of arithmetic selection signal 139a (where signal 177 is "0"). RRMD: circuit 199   RRMI: circuit 199 (Y = B)             (Y = inverted B) RERD: circuit 199   RERI: circuit 199 (Y = A)             (Y = inverted A) RRAE: circuit 199   RRXE: circuit 199 (Y = A AND B)     (Y = A EXOR B) | FIGS. 6–9, FIG. 12 |
| MA/EA a b | If coincident signal 175 is "0" at the rising edge of control signal 134, set signal 241 (177) to "1" and use arithmetic selection signal 139b for data selection. If signal 177 is "0", use signal 139a. If signal 241 is "0" at the falling edge of control signal 134, set temporally clock stop signal 240 to "1". If coincident signal 175 is "1" at the rising edge of control signal 134, set mask signal 244 to "1". If signal 244 is "1" at the falling edge of control signal 134, set temporary clock stop signal 243 to "1". | FIGS. 6–9, FIG. 11 FIG. 12 FIGS. 13–18 |
| ERADON | Set control signal 160 to "1" to enable bank switching by signals 127a and 127b. | FIGS. 6–9, FIG. 12 |
| ERADOFF | Set control signal 160 to "0" and signals 127a, 127b to "0" (selection of address signal 118). | |

TABLE 11

| Instruction | Operation | Referred Drawings |
|---|---|---|
| ELASET | At the falling edge of control signal 137, latch last memory address 224 into circuit 223. | FIGS. 6–9, FIGS. 13–18 |
| ECA/ELA @ | When control signal 136 is "1" and coincident signal 120 is "0", change execution address 17 in program counter 18. Coincident signal 120 becomes "0" when coincident signal 227 or 232 is "0". If signal 232 is "0" and 227 is "1" at the rising edge of control signal 136, set mask signal 237 to "1". If signal 237 is "1" at the falling edge of control signal 136, set temporary clock stop signal 234 to "1". If signal 122 is "1" at the rising edge of control signal 136, set reset signal 238 to "1" at the falling edge of control signal 136 and | |

TABLE 11-continued

| Instruction | Operation | Referred Drawings |
|---|---|---|
|  | initialize (= "0") temporary clock stop signal 234. If output of circuit 228 is "1" at the rising edge of control signal 136, set mask signal 231 to "1". If mask signal 231 is "1" at the falling edge of control signal 136, set clock stop signal 230 to "1" (signal 230 is initialized when control signal 132 is "1"). |  |
| ELC n | If control signal 164 is "1", latch limited number signal 29 into limited number register circuit 165. | FIGS. 6–9 |
| ECA/ELC @ | If control signal 134 is "1" and coincident signal 245 is "0", change execution address 17 in program counter 18. If signal 245 is "0" at the rising edge of control signal 134, set mask signal 248 to "1". If signal 248 is "1" at the falling edge of control signal 134, set error signal 247 (101) to "1". | FIGS. 6–9, FIGS. 13–18 |

In TABLEs 2–6, a mark (*) indicates the initial state of each function, and "significant bit" indicates a period (bits) in which the function of instruction concerned is valid. "Temporary clock stop" means to temporarily stop the clock of a DUT which meets certain conditions; and "clock stop" means to stop the clock of a DUT which meets certain conditions until the end of the test. The "(temporary) clock stop" function is activated from the next bit to the description bit of an instruction for the clock stop function such as the MA/EA instruction (delay of one period). Instructions for a match test function such as the ECA/ELA instruction tell a readout memory address counter of an error catch memory.

The main points of FIGS. 19–23 are as follows:

(1) In each erase operation (step S62), every address of a plurality of memories under test 8 is scanned to fetch error address and error data into the catch memory (step S253).

(2) In each erase operation, on the basis of the error information (error address and data), data is written on every memory cell of the plurality of memories under test 8.

Write data varies according to the comparison result between the address signal 118 and the error address signal 181 (rewriting subroutine of steps S257–S267):

If they disagree, a "0" is written on every memory cell of an address concerned (step S261);

If they agree, a "0" is written on a "pass" memory cell and a "1" is virtually written on a "fail" memory cell (step S260).

Each data I/O is rewritable since the error information is fetched for each data I/O (bit).

The pattern program of FIG. 23 is constituted of a pin pattern 270 which indicates a pattern of a test signal applied to each pin of the memory under test; a timing group number 271 which indicates a group of timing conditions such as a test period; and a micro instruction portion 272 which describes a group of instructions as shown in TABLEs 2–6. Here the reference numeral 17 of FIG. 23 corresponds to the address 17 indicated by the program counter 18.

Referring now to FIGS. 19 through 22, we will describe an erase test flow according to the first preferred embodiment. First, step S250 is to select clock stop A (CSTPAON) (signal 140), enable a fetch of error information (signal 133), and set an address at a header address.

Then, a loop counter X of each DUT (memory under test 8) is initialized (="0") in step S61; and an erase mode such as erase time is set in step S62.

In step S251, bank switching (signal 152) and the address counter circuit 213 are initialized. The processing of step S251 is performed only once in the first operation.

The next step S64 is to set an erase verification mode such as address and latency.

Then, whether erasing has been completed or not is checked in step S67. If it has been completed, the flow directly goes to step S73. If not, before going to step S73, the flow goes to step S253 wherein an error address and error data are fetched into the catch memory circuit 119 and the address counter circuit 213 indicating a memory address of the catch memory circuit 119 is incremented. If the DUT under test has any one erase failure address with at least one failure bit, the error address and information specifying a failure bit of that error address are fetched as an error address and error data, respectively. That is, the error address is common to bits of the DUT at the same address.

S73 is to check whether the address signal 118 is the last address or not. If it is the last address, the flow goes to step S63. If not, the address is incremented (shifted to the next address) in step S74 and the flow returns to step S64.

The processing of steps S73 and S74 after the rewriting subroutine is performed on the error addresses.

In step S63, the loop counter of each DUT is incremented (X=X+1). Then, whether erasing of all addresses has been completed or not is checked in step S256. If it has not been completed yet even in small part, the flow goes to step S65. The flow goes to step S268, otherwise.

Step S268 comprises steps S268A and S268B. Step S268A is to check whether all DUTs under test has passed or not. If all of them have passed, the processing is terminated with recognition of "all DUT pass". If not, the clock of the "pass" DUT is stopped until the end of the test in step S268B so that no further erase operation is performed on the "pass" DUT.

In step S65, the number of retries (up to 1000) is checked for each DUT. If the number reaches to 1000, the flow goes to step S269. If not, the flow goes to the rewriting subroutine of steps S257 through S267.

If all DUTs are judged as "fail" in step S269, the processing is terminated with recognition of "all DUT fail". If not, the processing is terminated with recognition of "some DUT pass".

Now, we will describe the processing of the rewriting subroutine.

First, an address is set in a header position in step S257, and such processing as to latch the last address signal 224, to enable the output of the error data (signal 161), to disable the output of the error address (signal 160), to perform switching between memory banks (signal 151), and to initialize the counter circuit 213 is performed in step S258.

Then, the address signal 118 and the error address signal 181 are compared in step S259. If they agree (erase failure address), data rewriting of step S260 is performed. If they disagree (erase good address), rewriting of step S261 is performed.

In step S261, a "0" is rewritten to every data I/O (bit). The flow then goes to step S265.

In step S260, on the other hand, a "0" is rewritten to the data I/O (bit) of the "pass" DUT and a "1" is virtually rewritten to the data I/O of the "fail" DUT on the basis of the error information.

Then, the address counter circuit 213 is incremented in step S262 and whether all error addresses are finished or not is checked in step S263. If they are finished, the counter circuit 213 is stopped in step S264 and the flow goes to step S265. If not, the flow directly goes to step S265.

Step S265 is to check whether the address is the last address or not. If it is not the last address, the address is incremented (shifted to the next address) in step S266 and the flow returns to step S259. Thereafter, the processing of steps S259 through S264 is repeated until the last address is recognized in step S265.

If the last address is recognized in step S265, the flow goes to step S267. Step S267 is to select clock stop D (CSTPDON) (signal 140), enable the output of the error address (signal 160), and initialize the address counter circuit 213. This is the end of the subroutine and the flow returns to step S62.

Figure 19:
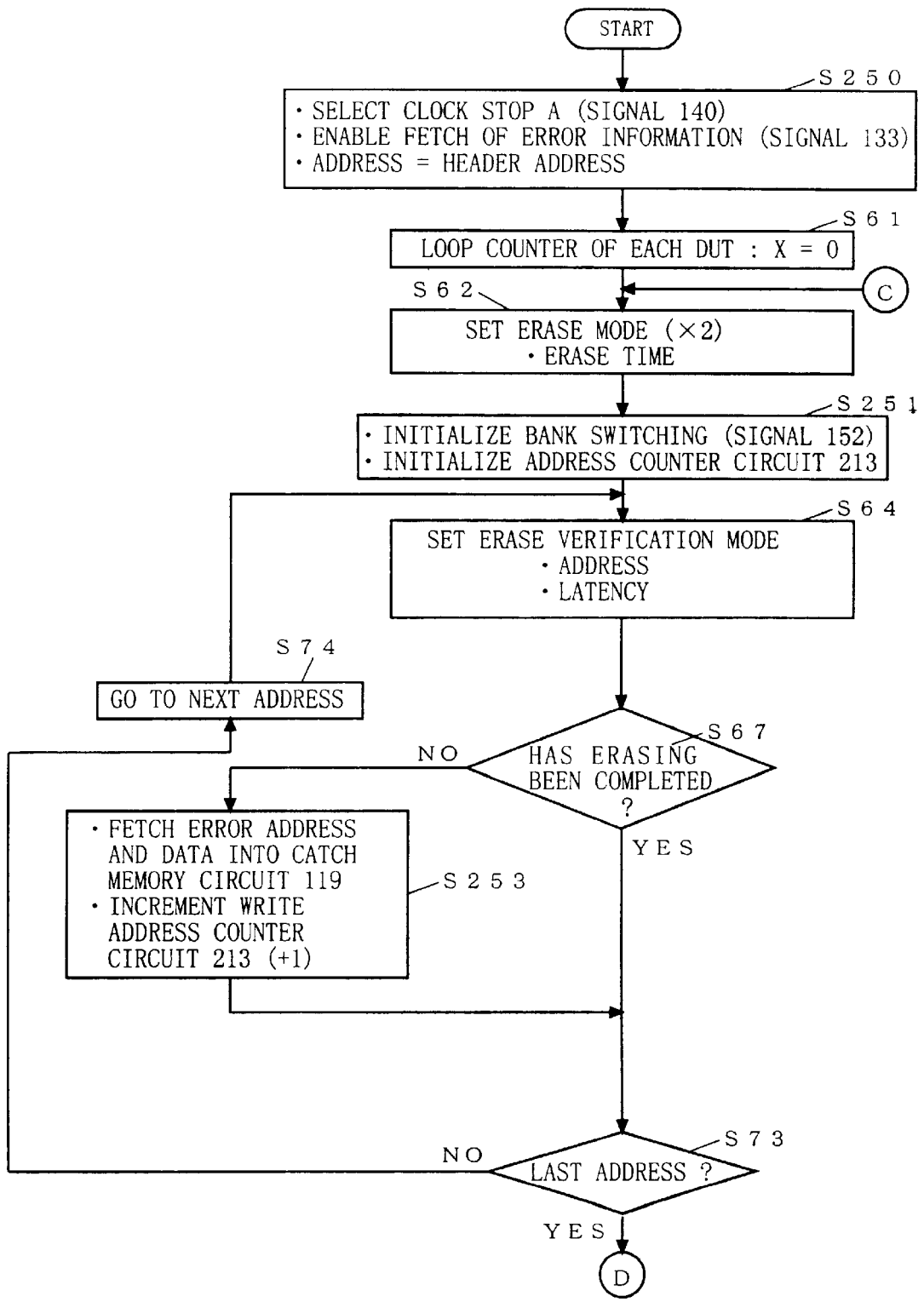
FIGS. 19 through 22 are flow charts of a test method according to a first preferred embodiment.
Figure 20:
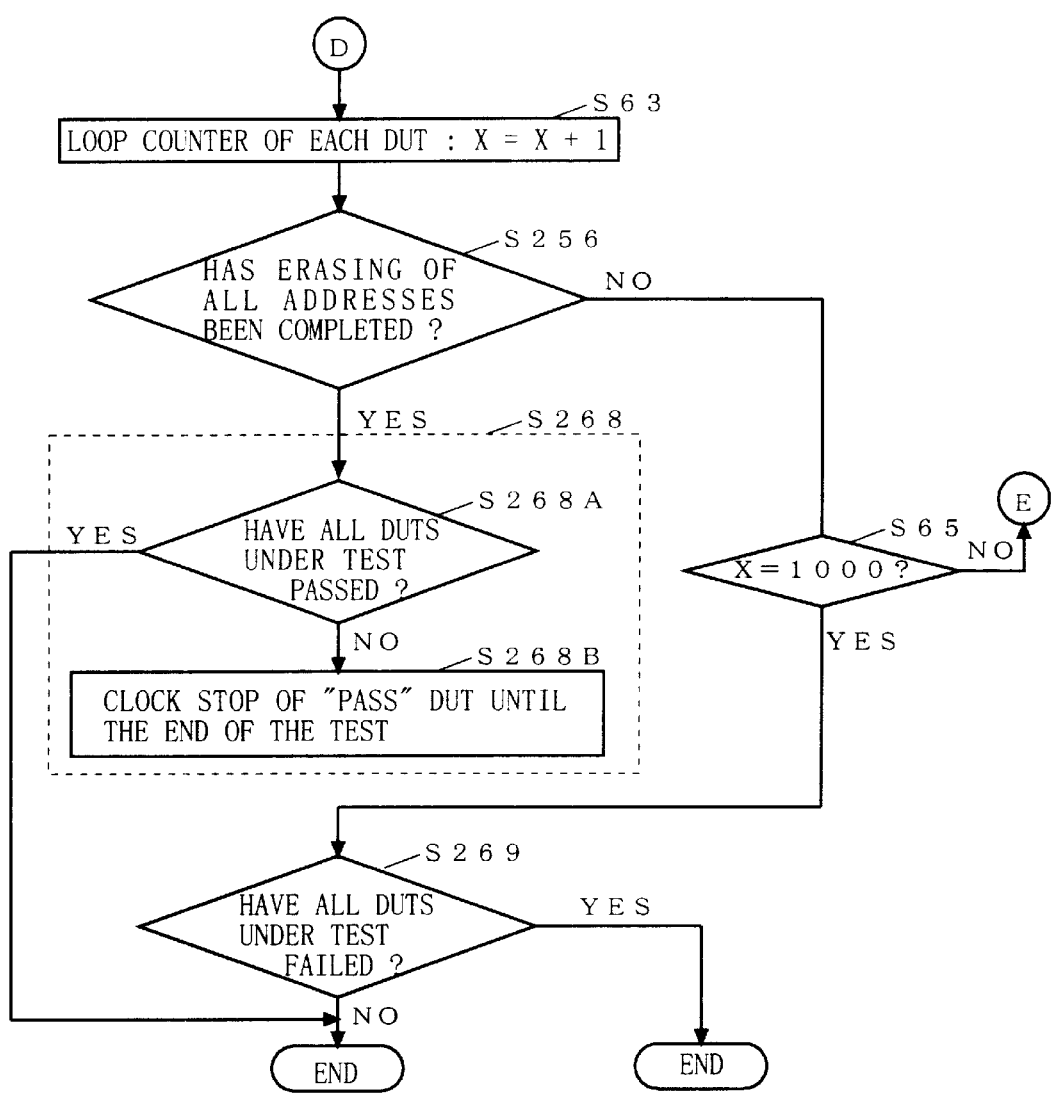
Figure 21:
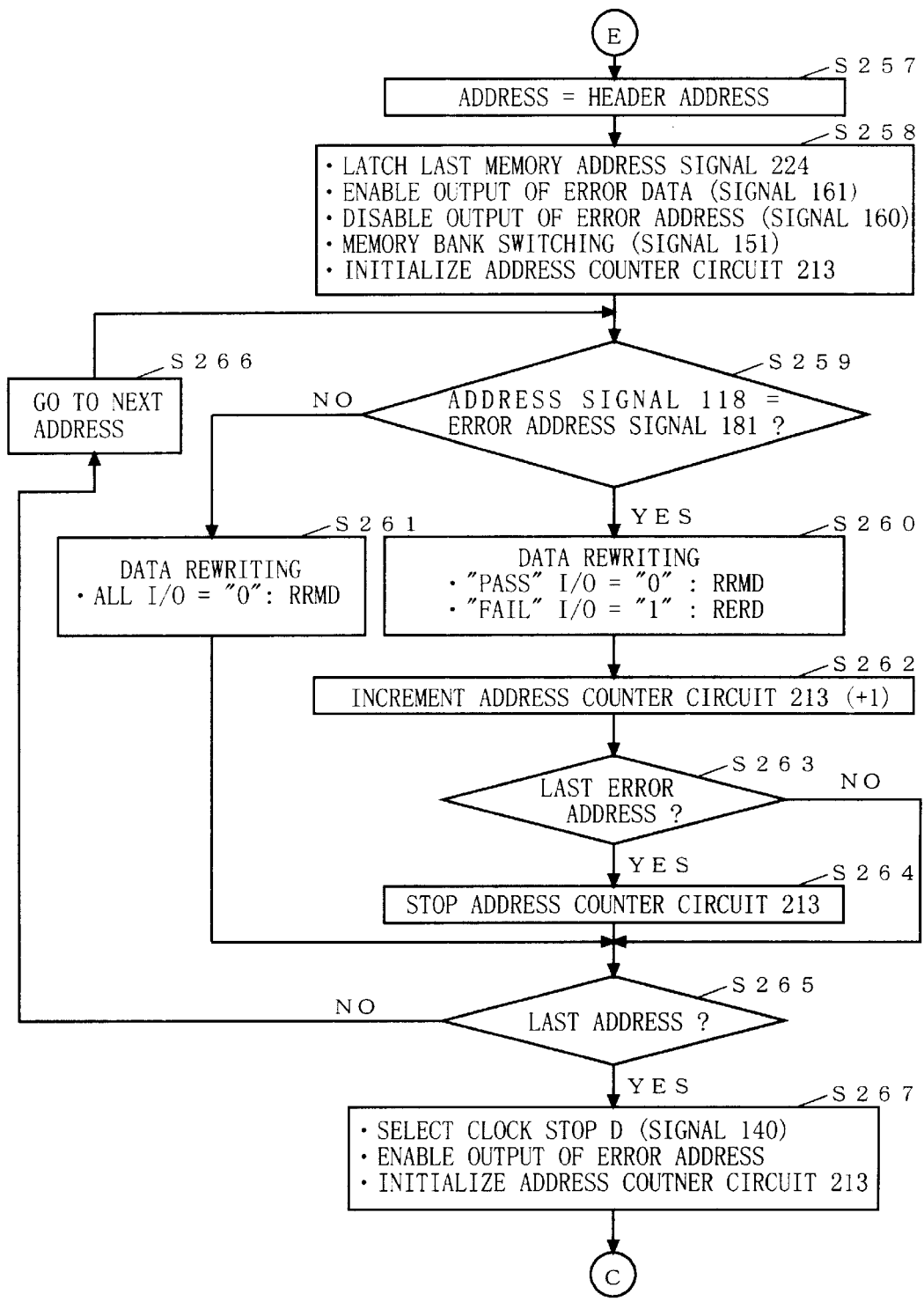
Figure 22:
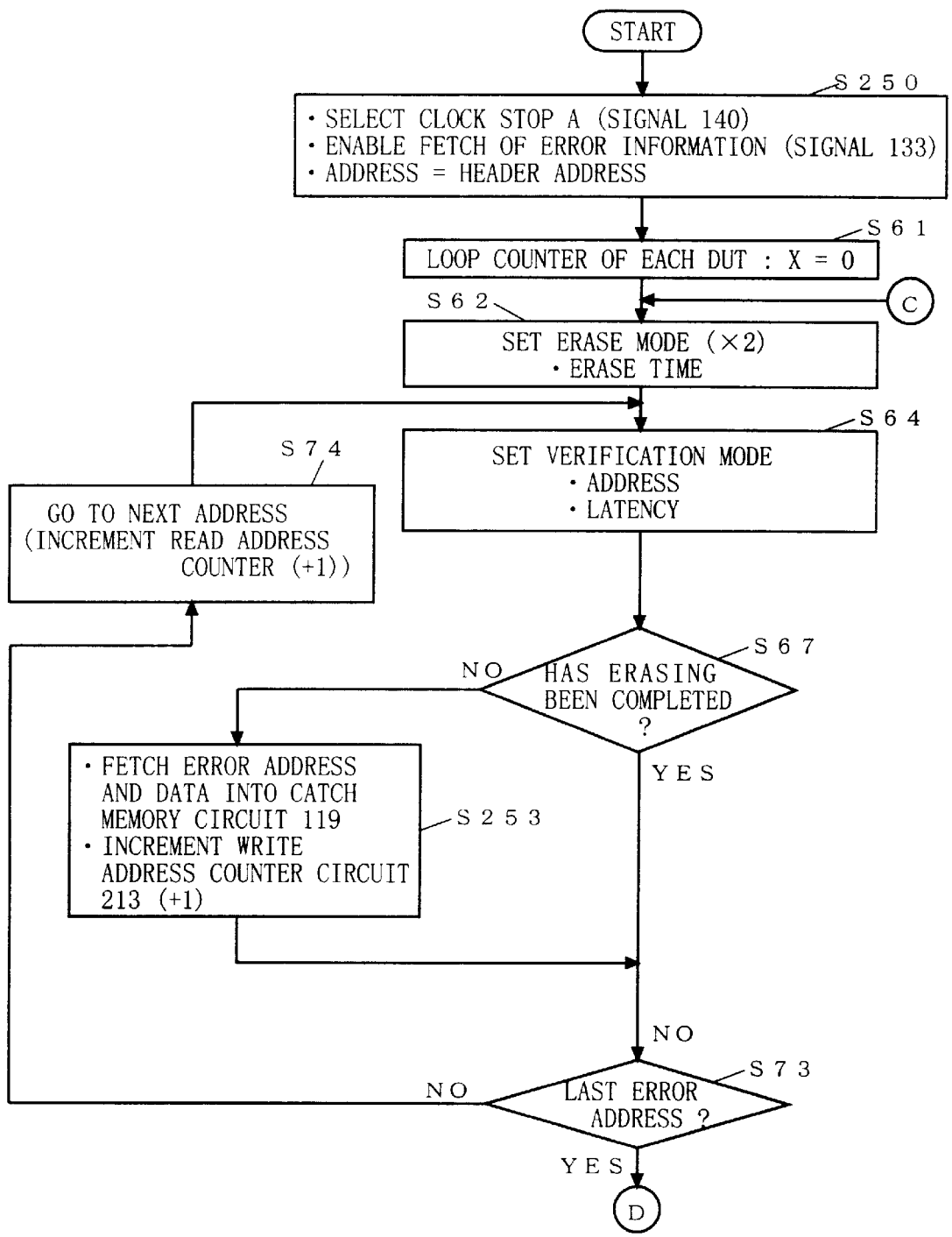

The processing of steps S62 through S73 after the execution of the rewriting subroutine is performed on the basis of the error address signal 181 as shown in FIG. 22. This considerably shortens a test time as compared with the case where all addresses are scanned. That is, the processing of steps S62 through S72 shown in FIG. 19 is performed only once in the first operation.

In step S62, an erase mode such as erase time is set.

Next, an erase verification mode such as address and latency is set in step S64.

Then, whether erasing has been completed or not is checked in step S67. If it has been completed, the flow goes directly to step S73. If not, before going to step S73, the flow goes to step S253 wherein an error address and data are fetched into the catch memory circuit 119 and the write address counter circuit 213 is incremented.

Step S73 is to check whether the error addresses are finished or not. If they are finished, the flow goes to step S63. If not, the read address counter circuit 213 is incremented (the next error address) in step S74 (cf. increment in step S253 is performed on the write address counter 213), and the flow returns to step S64.

2-10. Effects of First Preferred Embodiment

With the circuits of FIGS. 1 through 18 and the erase test flow of FIGS. 19 through 22 according to the first preferred embodiment, a "0" is surely rewritten to the bit which has been erased normally. This prevents excessive erasing of the NOR type flash memory. In addition, the fact that a "0" is not rewritten to the bit which has been erased improperly contributes to improvement in yield of the memory.

Further, the circuit configuration described can be used not only as means for storing the error information but also as means for storing the status of each signal when normal erasing has been performed. This allows easy construction of an analysis system such as a logic signal analyzer. Thus, the area of utilization of this circuit may extend over a wide range.

3. Second Preferred Embodiment 3-1. Explanation for FIGS. 24–26

Figure 24:
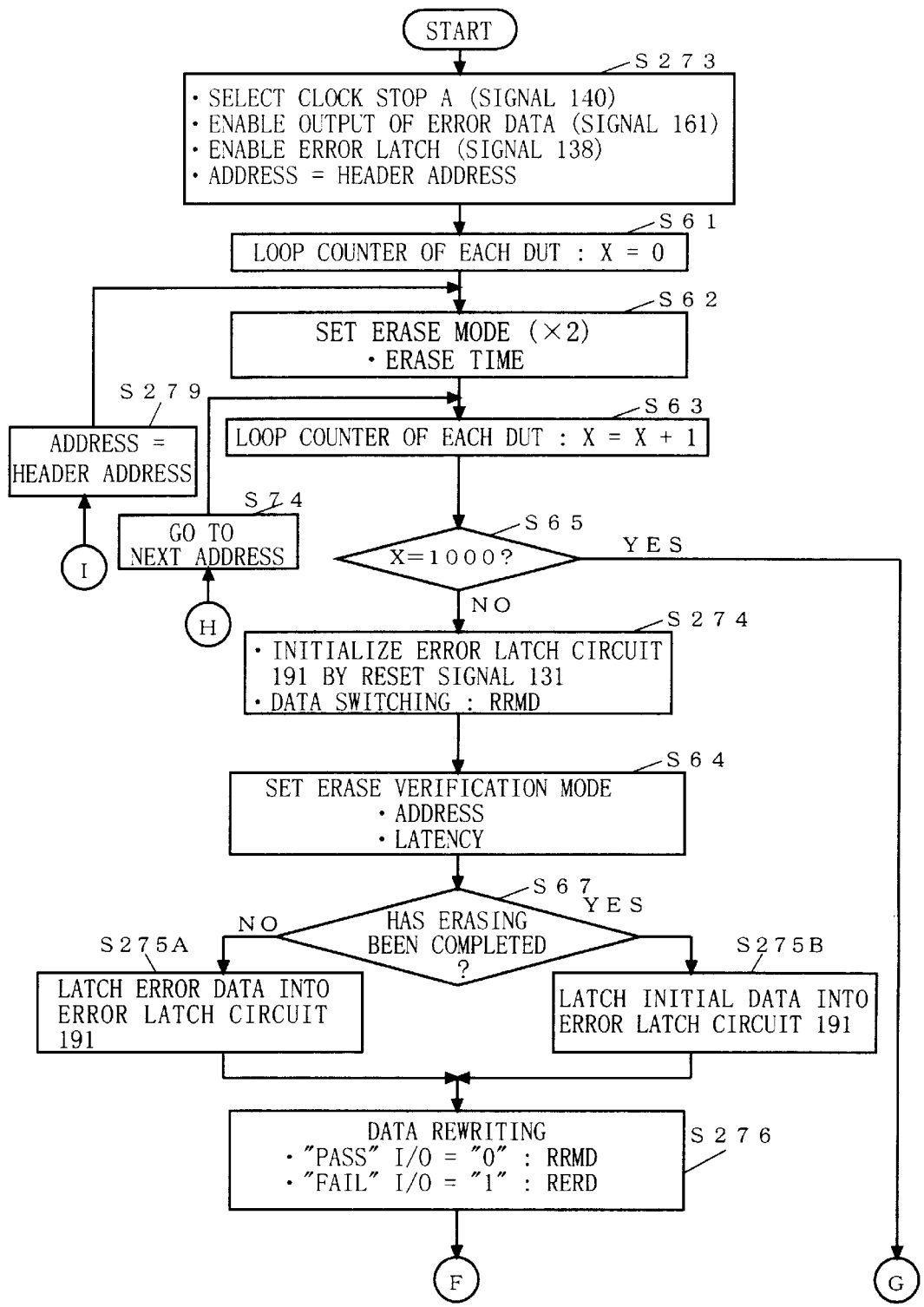
FIGS. 24 and 25 are flow charts of a test method according to a second preferred embodiment.
Figure 25:
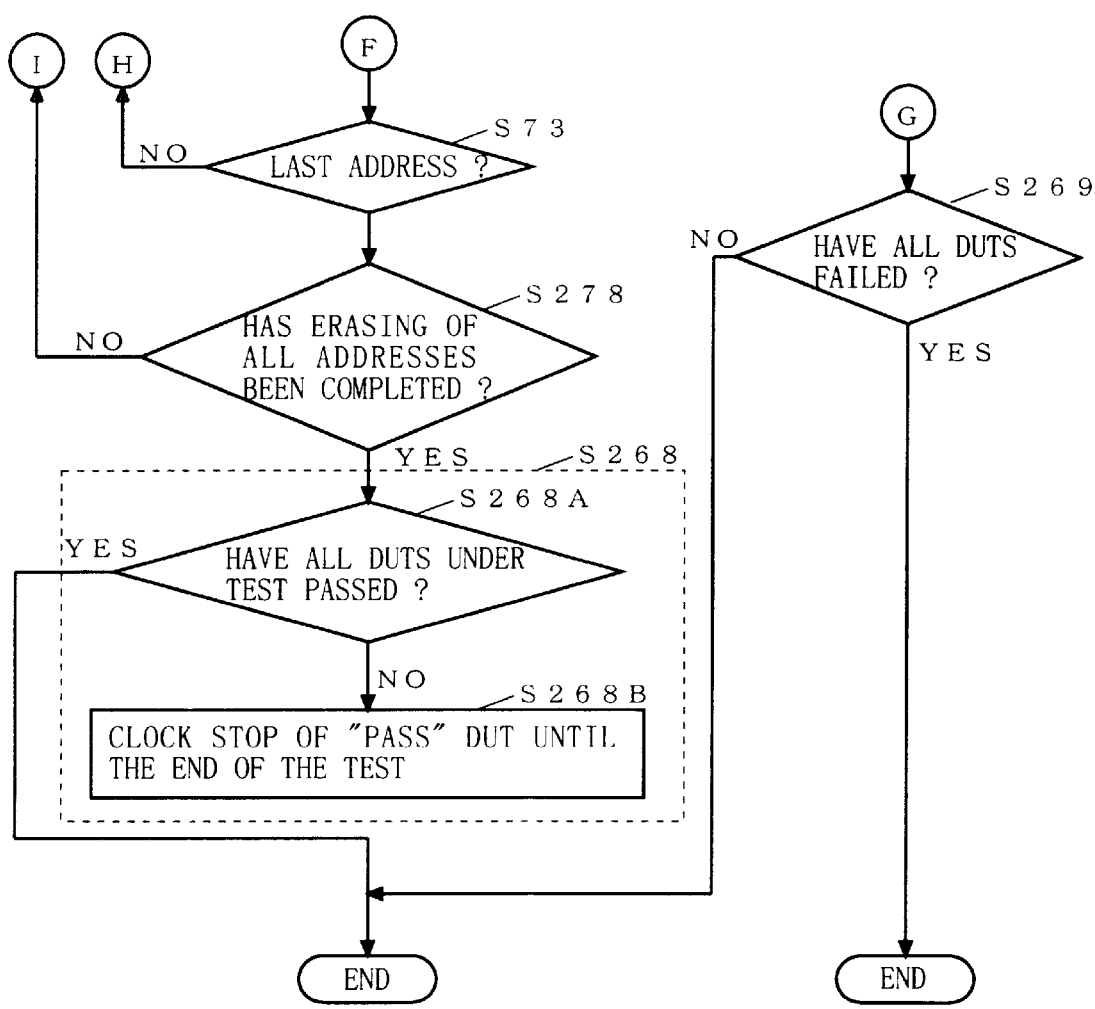

FIGS. 24 and 25 are flow charts showing a test flow including the data rewriting processing for prevention of excessive erasing, using not the catch memory circuit 119 but the error latch circuit 191 (cf. FIG. 12) in the circuit configuration of FIGS. 1 through 18 according to the first preferred embodiment. FIG. 26 shows a test pattern program corresponding to FIGS. 24 and 25. In FIGS. 19 through 26, the same processing is denoted by the same reference character. Further, the group of instructions shown in TABLEs 2–11 is used. The main points of FIGS. 24 through 26 are as follows:

(1) In each erase operation (step S62), the judgment result (error signal) of the present address is latched into the error latch circuit 191 (step S275).

(2) In each erase operation, on the basis of the above error signal, data is written on every memory cell indicated by the present address (step S276). Here write data is as follows:

A "0" (the output "0" of the circuit 191) is written to the "pass" memory cell.

A "1" (the output "1" of the circuit 191) is written to the "fail" memory cell.

Each data I/O (bit) is rewritable since the error signal is fetched for each data I/O.

Referring now to FIGS. 24 and 25, we will describe an erase test flow according to a second preferred embodiment. First, step S273 is to select clock stop A (signal 140), enable the output of the error data (signal 161), enable error latch (signal 138), and set an address at a header address.

Then, the loop counter X of each DUT is initialized (="0") in step S61, and an erase mode such as erase time is set in step S62. Subsequently, the loop counter of each DUT is incremented (X=X+1) in step S63.

The next step S65 is to check the number of retries (up to 1000) for each DUT. If the number reaches to 1000, the flow goes to step S269. If not, the flow goes to step S274.

In step S274, initialization of the error latch circuit 191 and data switching are performed by the control signal 131. Then, a verification mode such as address and latency is set in step S64.

After that, whether erasing has been completed or not is checked in step S67. If it has not been completed yet, the flow goes to step S275A before step S276. Otherwise, the flow goes to step S275B before step S276.

In step S275A, error data is latched into the error latch circuit 191 storing the error information. In step S275B, initial data (that the data I/O passes) is latched into the initialized error latch circuit 191.

Then, a "0" is rewritten to the "pass" data I/O and a "1" is virtually rewritten to the "fail" data I/O in step S276.

After that, whether the address is the last address or not is checked in step S73. If it is the last address, the flow goes to step S278. If not, the address is incremented (shifted to the next address) in step S74 and the flow returns to step S63.

Step S278 is to check whether all addresses has been erased or not. If it has been completed, the flow goes to step S268. If not, the address is set back at a header address and the flow returns to step S62.

In step S268A of step S268, whether all DUTs under test have passed or not is checked. If all of them have passed, the processing is terminated with recognition of "all DUTs pass". If not, the clock of the "pass" DUT is stopped until the end of the test in step S268B so that no further erase operation is performed on the "pass" DUT.

Now, if the number of retries reaches to 1000 in step S65, the flow goes to step S269. If all DUTs are judged as "fail" in step S269, the processing is terminated with recognition of "all DUT fail". If not, the processing is terminated with recognition of "some DUT pass".

3-2. Effects of Second Preferred Embodiment

The circuit of FIGS. 1 though 18 and the erase test flow according to the second preferred embodiment allow prevention of excessive erasing of the NOR type flash memory. This contributes to improvement in yield of the memory.

In addition, since the judgement about the erase failure address and the rewriting processing are performed by the address, the error latch circuit 191 only has to store failure address information on a single address. This simplified the circuit configuration.

Further, the as-is error information can be utilized as rewrite data. Accordingly, excessive erasing can be prevented without the catch memory circuit 119. This reduces the cost of H/W (hardware).

4. Third Preferred Embodiment

Figure 27:
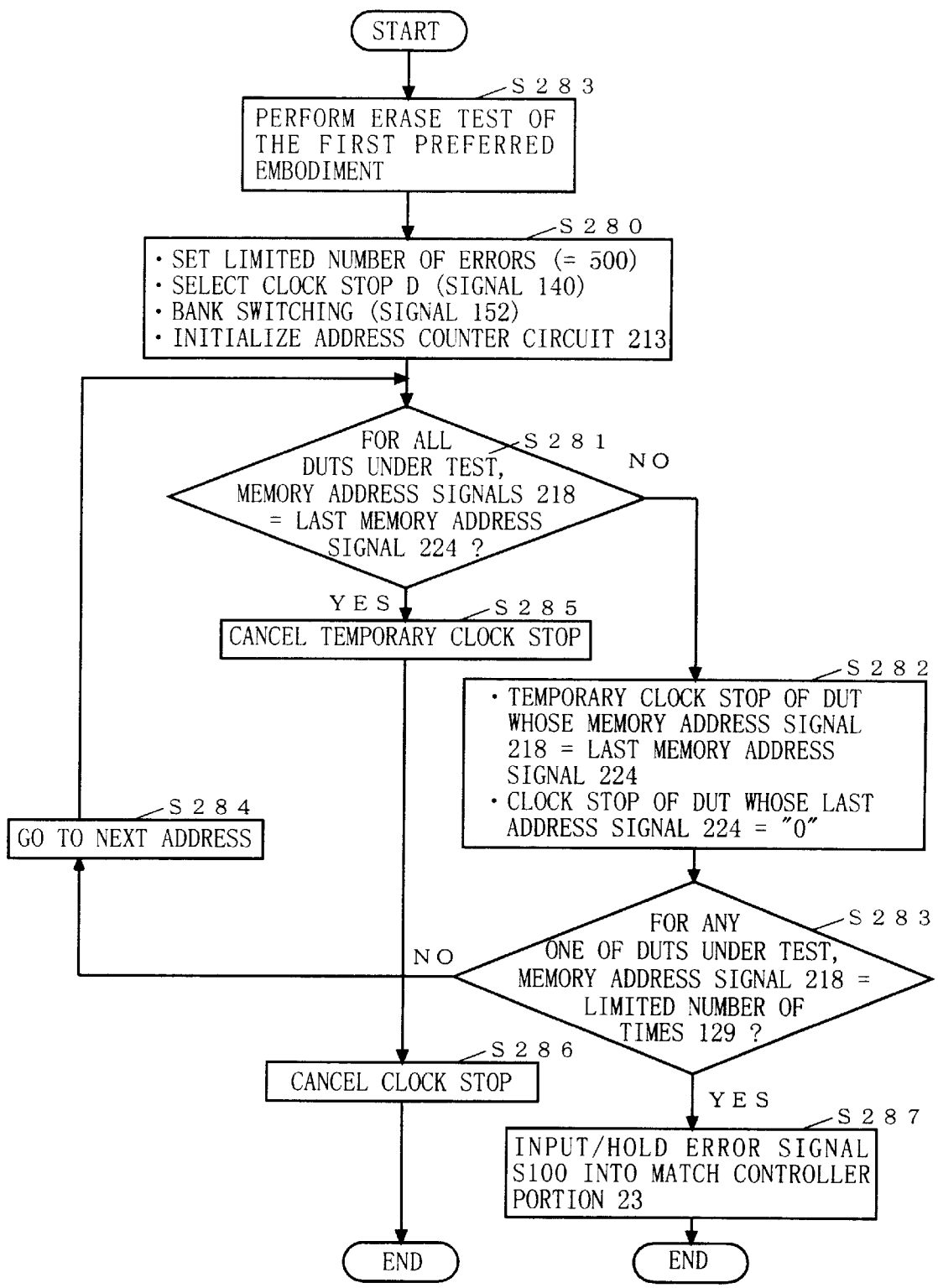
FIG. 27 is a flow chart of a test method according to a third preferred embodiment.

FIG. 27 is a flow chart and FIG. 28 is an illustration of the method of the MGM test using the bit comparator 226 (cf. FIGS. 13 to 18) in the circuit configuration of the first preferred embodiment (cf. FIGS. 1 through 18). The test flow of FIG. 27 according to a third preferred embodiment is additionally performed after the erase test flow of the first preferred embodiment (cf. FIGS. 19 through 21) has been completed.

A pattern program of the flow is shown in FIG. 28. The main points of FIGS. 27 and 28 are as follows. The signal 218 is altered (incremented by one) while comparing the last address signal 224 and the address signal 218 by the bit comparator 225, to determine if there is a match between the address signal 218 and the limited number data 129. If any one of the memories under test has a match, the test is terminated (step S283).

At this time, the memory under test having a match can be excepted from the MGM test (i.e., judged as a "fail" DUT) in the match controller portion 23 by generating the error signal 100. In such a configuration, somewhat information is written to an error memory cell of the memory under test while a match is scanned.

Referring now to FIG. 27, we will describe the MGM test flow according to the third preferred embodiment. First, the erase test flow of the first preferred embodiment (other than step S269) is performed in step S100.

Step S280 is to set the limited number of errors (e.g., at 500), select clock stop D (signal 140), perform bank switching, and initialize the address counter circuit 213.

Then, whether the address signals 218 of all DUTs under test agree with the last address signal 224 or not is checked in step S280. If they agree, the flow goes to step S285. If any one of them disagrees, the flow goes to step S282.

In step S228, the clock of the DUT whose address signal 218 agrees with the last address signal 224 is temporarily stopped. Further, the clock of the DUT whose last address signal 224 is "0" is stopped.

If the address signal 218 of any one of the DUTs under test reaches to the limited number data 129 in step S283, the error signal 100 is fed and held in the match controller portion 23 in step S287 and the test on all the DUTs under test is forcefully terminated. If not, the address is shifted to the next address in step S284 and the flow returns to step S281.

In the case where a plurality of DUTs under test do not function even with one "fail" DUT under test, the execution of step S287 allows speedy termination of the test on the other DUTs under test. Accordingly, the test can be conducted effectively. Alternatively, after the test procedure has forcefully been stopped by the execution of the step S287, a retest can be carried out as the contents of the test are changed.

In step S285, on the other hand, the temporary clock stop is cancelled. Subsequently, the clock stop is cancelled in step S286 and the processing is terminated.

4-1. Effect of Third Preferred Embodiment

The circuits shown in FIGS. 1 through 18 and the MGM test flow of the third preferred embodiment allow high-speed judgement independent of the analysis result of an analyzer such as a failure bit memory device.

5. Fourth Preferred Embodiment

Figure 29:
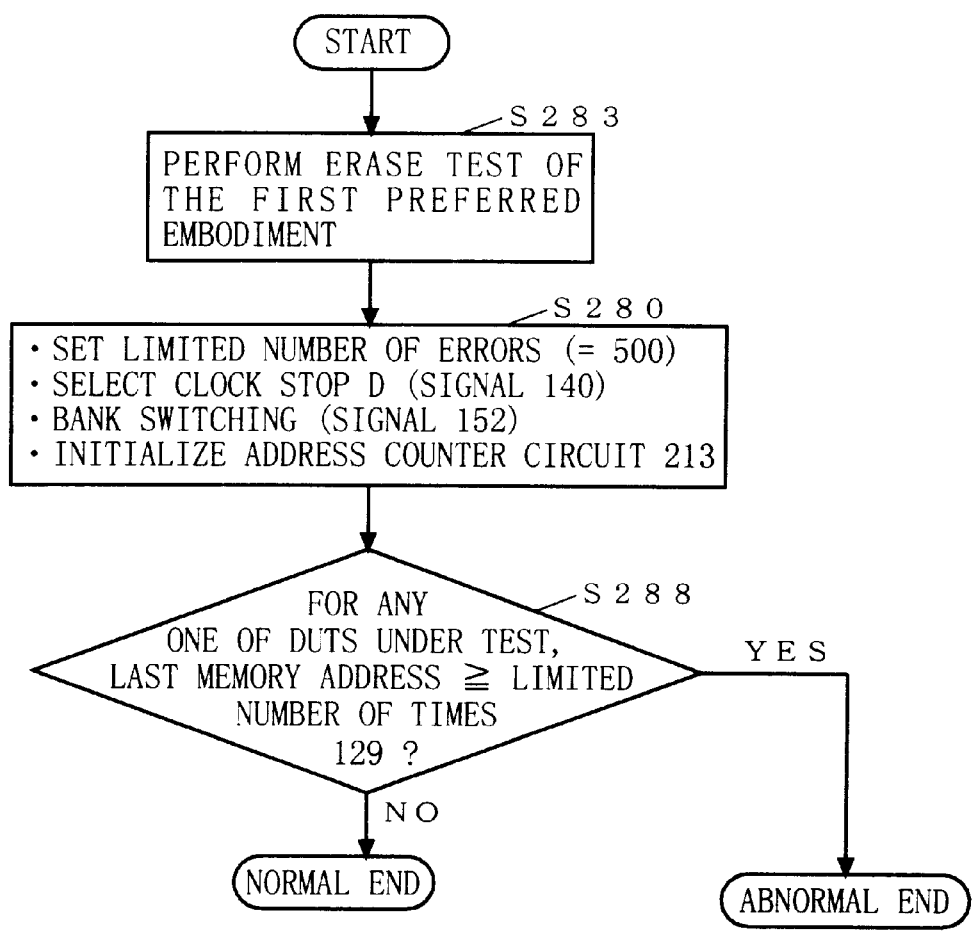
FIG. 29 is a flow chart of a test method according to a fourth preferred embodiment.

5-1. Explanation for and Effect of FIGS. 29, 30

When the MGM test flow of the third preferred embodiment is used only to make a pass/fail judgement on the MGM, a magnitude comparator (size comparator) for comparing the last address signal 224 and the limited number data 129 can be substituted for the bit comparator 226 (cf. FIGS. 13–18). This allows a single-period judgement, thereby increasing the test speed (step S288 of FIG. 29).

If the last address signal 224 of any one of the DUTs under test reaches to the limited number 129 in step S288 of FIG. 19, the error signal 100 is fed and held in the match controller portion 23 in step S287 and the test is terminated. If not, the test is immediately terminated.

At this time, "ELA/ELC" is an instruction to make a comparison between the last address signal 224 and the limited number data 129. In the circuit configuration of this preferred embodiment, the control signal 135 corresponds to the instruction ELA/ELC and the size comparator is substituted for the comparator 226 as described above (the control over the coincident signal 121 is not performed in this preferred embodiment).

6. Fifth Preferred Embodiment

6-1. Explanation for FIGS. 31–33

Figure 31:
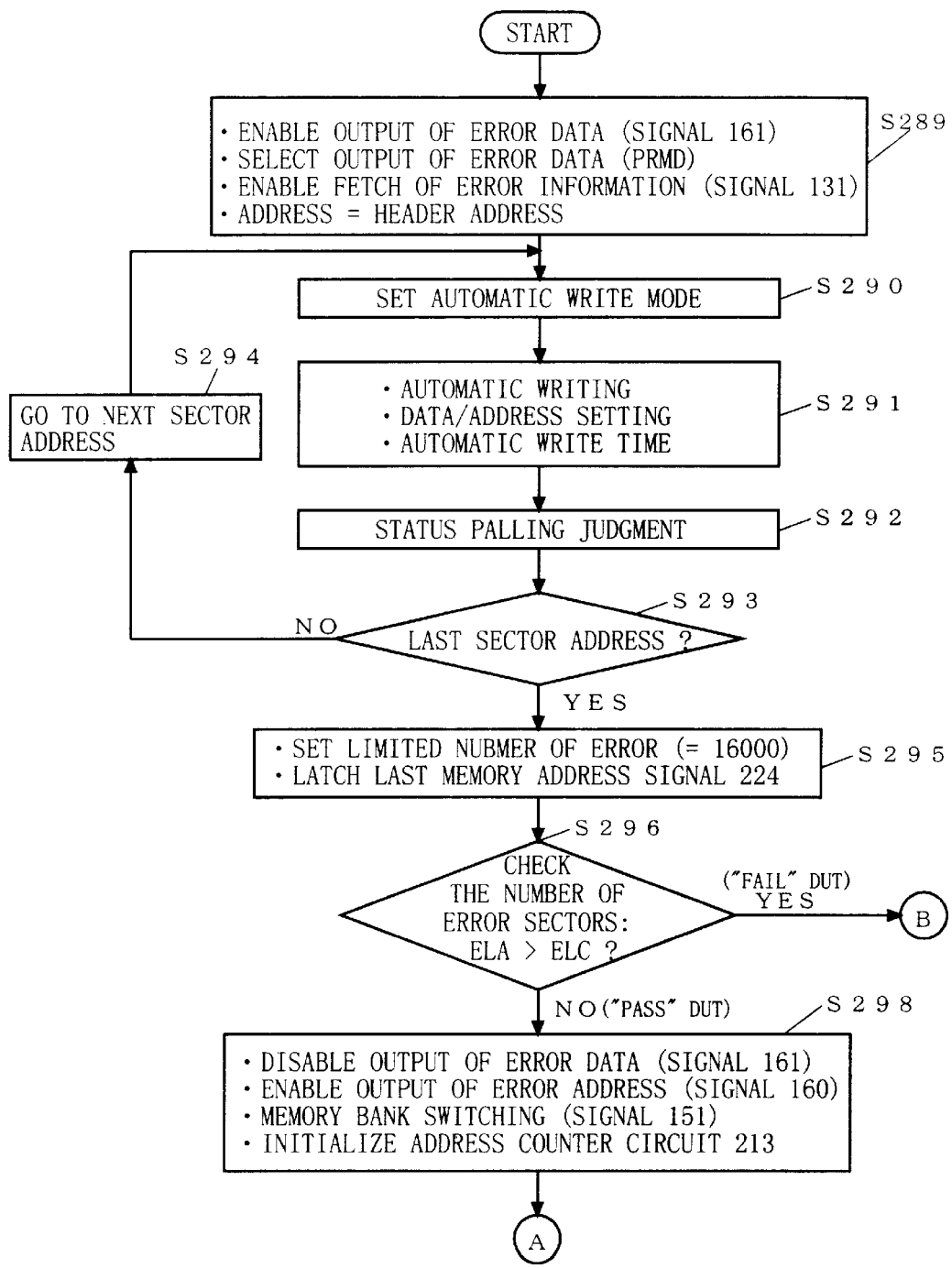
FIGS. 31 and 32 are flow charts of a test method according to a fifth preferred embodiment.
Figure 32:
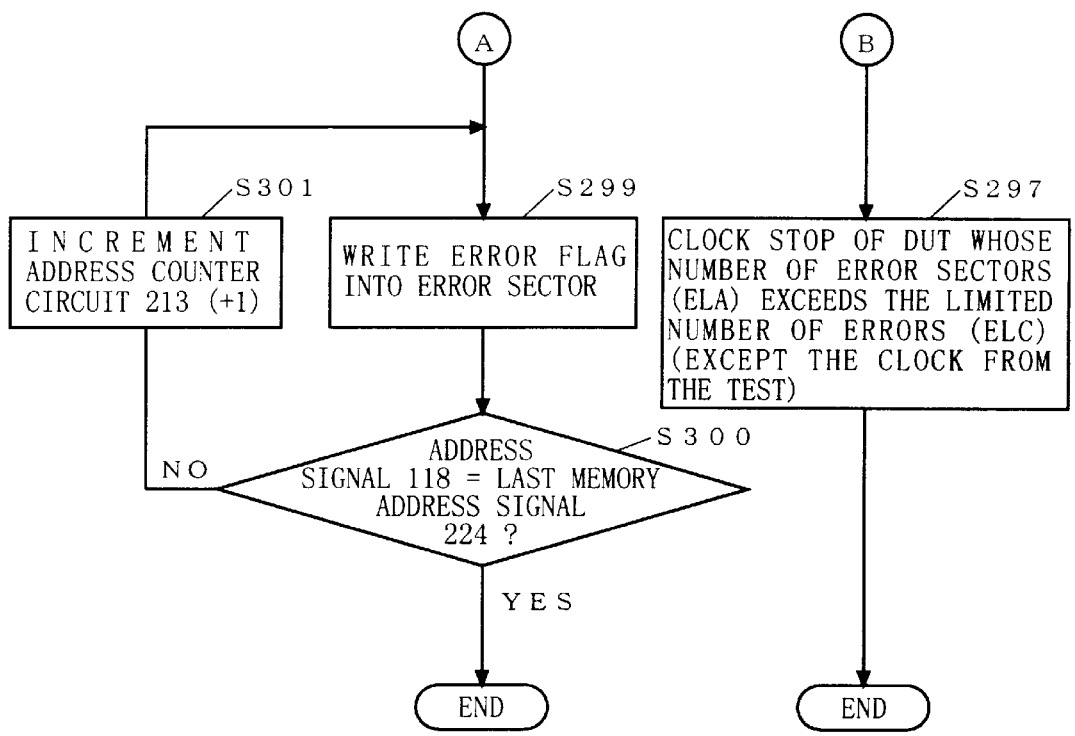
Figure 34:
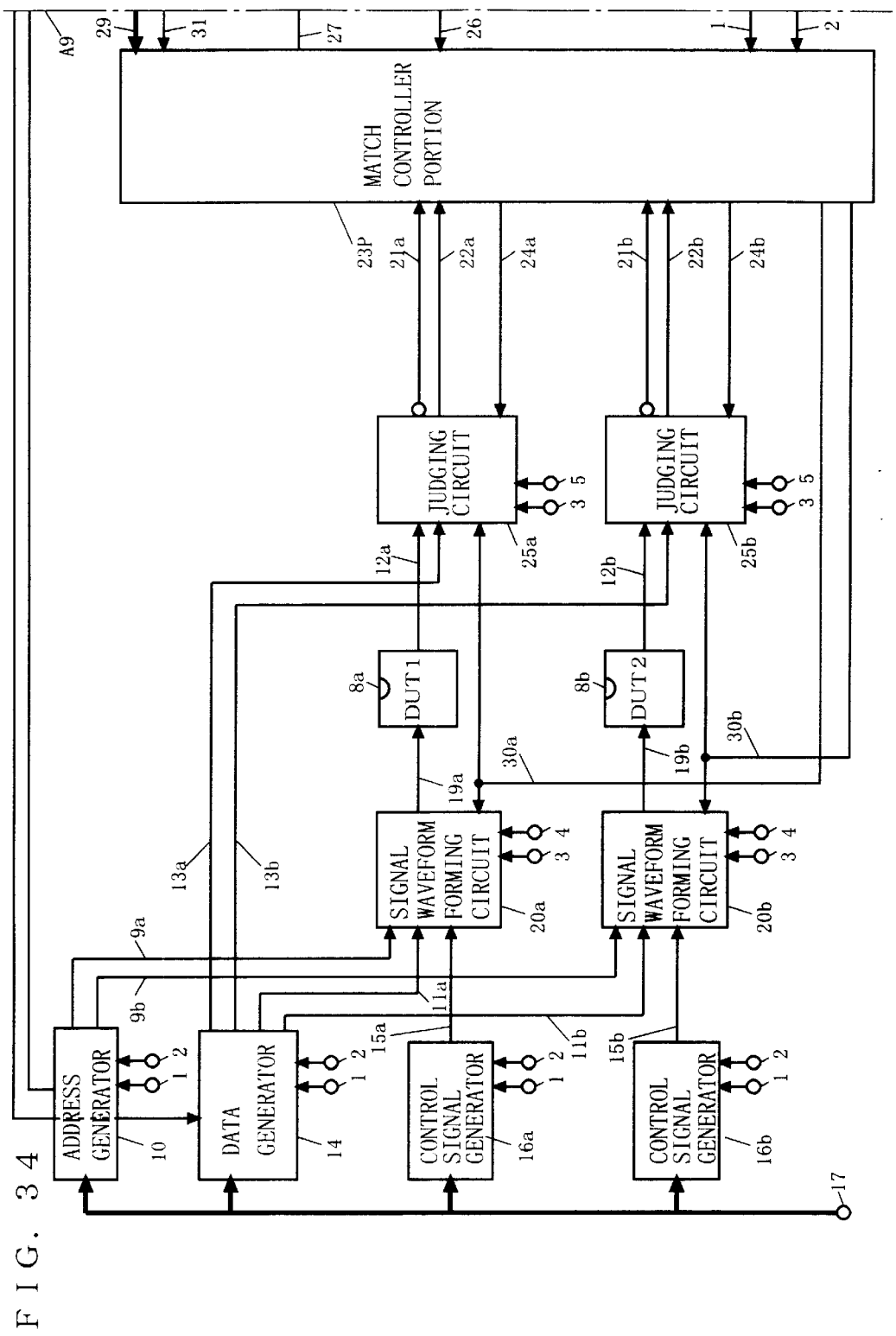
FIGS. 34 and 35 are schematic circuit diagrams showing a general structure of a conventional semiconductor test apparatus.
Figure 35:
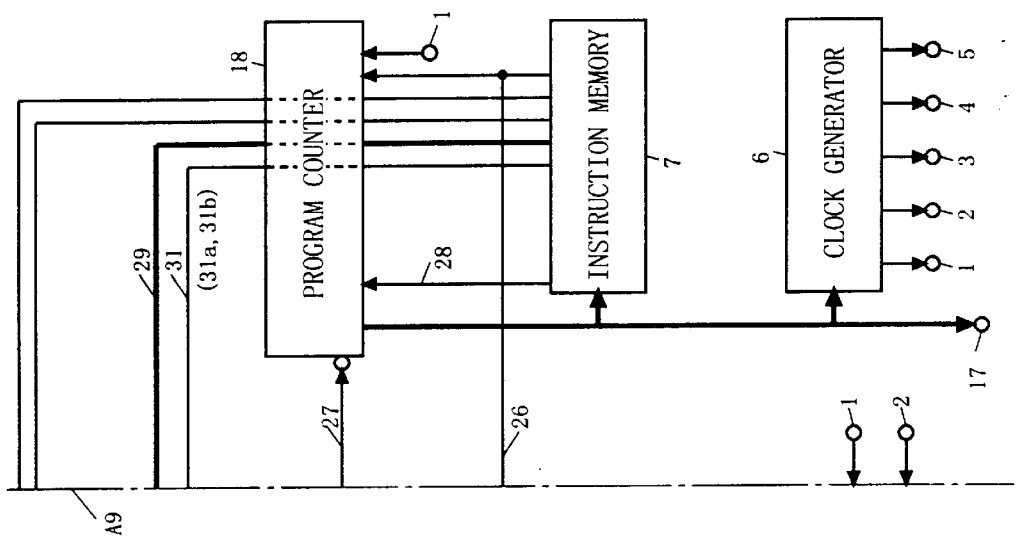

In this preferred embodiment, the MGM test on a memory which employs the sector method of FIG. 40 is conducted in the circuit configuration of the first preferred embodiment. FIGS. 31 and 32 are flow charts showing an MGM test flow according to a fifth preferred embodiment, and FIG. 33 is an illustration of a test pattern program corresponding to FIGS. 31 and 32. In the drawings, the same processing is denoted by the same reference character.

The main points of the fifth preferred embodiment shown in FIGS. 31 through 33 are as follows.

(1) Memory cells of every bit are scanned, and only the address signal 118 with write error is fetched into the catch memory circuit 119. In the selector selecting circuit 117, a test is conducted with only the selector address (X address) selected (steps S290–294).

(2) The number of error addresses fetched into the catch memory circuit 119 is compared with the limited number of errors (using the circuits of the fifth preferred embodiment) to make a pass/fail judgement. Then, a "fail" DUT is excepted from the test by stopping the clock of that DUT (steps S295–297).

(3) An error flag is written in the control region of the sector address with error. At this time, only an error sector address is scanned (steps S298–S301).

Referring now to FIGS. 31 and 32, we will describe the MGM test flow according to the fifth preferred embodiment. First, step S289 is to enable the output of error data (control signal 161), select the output of the error data (PRMD instruction), enable a fetch of error information (control signal 133), and set an address at a header address.

Then, an automatic write mode is set in step S290. In step S291, automatic writing and settings of automatic write data address and automatic write time are performed.

After that, in step S293, a status spalling judgement is made to write a write failure address to the catch memory circuit 119 while performing write verification.

In the next step S293, whether the address is the last sector address or not is checked. If it is the last sector address, the flow goes to step S295. If not, the address is shifted to the next address in step S294 and the flow returns to step S290.

Step S295 is to set the limited number of errors ELC and latch the last address signal 224 to obtain the number of error sectors ELA.

Then, the number of error sectors ELA is compared with the limited number of errors ELC in step S296. If ELA>ELC, the flow goes to step S297. If not, the flow goes to step S298. At this time, "ELA/ELC" is an instruction to make a comparison between the last address signal 224 and the limited number data 129. In the circuit configuration (cf. FIGS. 13–18) of this preferred embodiment, the control signal 135 corresponds to the ELA/ELC instruction and a size comparator is substituted for the comparator 226 as previously described.

In step S297, the clock of the DUT whose number of error sectors ELA exceeds the limited number of errors ELC is excepted from the test by stopping the clock of that DUT. Then, the processing is terminated with recognition of the "fail" DUT.

On the other hand, step S298 is to enable the output of the error data (signal 161), disable the output of the error address (signal 160), perform memory bank switching (signal 151), and initialize the counter circuit 213.

Then, an error flag is written into the error sector in step S299. Next, whether the address signal 118 agrees with the last address signal 224 or not is checked in step S300. If they agree, the processing is terminated with recognizing of the "pass" DUT. If not, the address counter circuit 213 is incremented in step S301 to update the sector address, and the flow returns to step S299. The processing of steps S299 through S301 is as follows: a predetermined program stored in the instruction memory 7 is started by the execution address switching signal 121 switched by the size comparator 226 so that information about the error (sector) address from the error catch memory portion 90 is written into the control region of the memory under test 8.

This allows the DUT under test to prevent the use of sector addresses with error flag, thereby achieving normal operations using only good sector addresses.

6-2. Effects of Fifth Preferred Embodiment

The circuits of FIGS. 1 through 18 and the MGM test flow according to the fifth preferred embodiment allow high-speed judgement independent of the analysis result of an analyzer such as a failure bit memory device, for example, in the test on the AND type flash memory employing the sector method.

While the invention has been described in detail, the foregoing description is in all aspects illustrative and not restrictive. It is understood that numerous other modifications and variations can be devised without departing from the scope of the invention.

What is claimed is:

1. A semiconductor test apparatus comprising:
    a control signal generating unit configured to supply a control signal to at least one semiconductor memory under test so as to initiate a predetermined operation, said at least one semiconductor memory under test having a plurality of cells, said predetermined operation including an erase operation of setting each of said plurality of cells to a first value and a subsequent rewrite operation of setting a subset of said plurality of cells to a second value different from the first value;
    a judging unit configured to make a pass/fail judgment on each of said plurality of cells after said erase operation, where a cell having been set to said first value is judged as having passed and a cell not having been set to said first value is judged as having failed; and
    an error information storage unit configured to sequentially assign a semiconductor memory test address corresponding to each of said plurality of cells and to store a plurality of semiconductor memory test results, said semiconductor memory test results including a semiconductor memory error address corresponding to a cell judged by said judging unit as having failed, and corresponding error data, wherein
        said subset of said plurality of cells comprising a cell judged by said judging unit as having passed.

2. The semiconductor test apparatus according to claim 1, further comprising:
    an address generating unit configured to sequentially generate a semiconductor memory generated-test address, wherein
        said error information storage unit includes a test address selecting portion configured to select either said semiconductor memory generated-test address or said semiconductor memory error address as a test address given to said semiconductor memory under test.

3. The semiconductor test apparatus according to claim 2, further comprising:
    a test data generating unit configured to generate test data for said at least one semiconductor memory under test on the basis of contents of a test content switching signal;
    a test control unit configured to stop, upon receipt of a test operation stop signal, a test on one of said at least one semiconductor memory under test without stopping a test on another of said at least one semiconductor memory under test, wherein
        said error information storage unit stores a number of fetched error addresses and a plurality of semiconductor error addresses each corresponding to one of said at least one semiconductor memory under test, and
        said error information storage unit includes a plurality of error information storage portions, each of said plurality of error information storage portions configured to store a corresponding semiconductor memory error address, to determine a test output end, and to generate said test operation stop signal and said test content switching signal.

4. The semiconductor test apparatus according to claim 3, wherein
    said test content switching signal indicates switching the contents of a test on the basis of a comparison result between said semiconductor memory generated-test address and said semiconductor memory error address.

5. The semiconductor test apparatus according to claim 1, further comprising:
    a first data generating unit configured to generate first data for each semiconductor memory test address, wherein
        said error information storage unit includes a data arithmetic portion configured to process said first data with said corresponding error data to obtain a second data and a test value supplying portion configured to supply one of said first data and said second data to said at least one semiconductor memory under test.

6. The semiconductor test apparatus according to claim 5, wherein said error information storage unit further includes:
  a selection signal output portion configured to output a selection signal on the basis of a comparison result between said semiconductor memory generated-test address and said semiconductor memory error address, wherein
  said data arithmetic portion is configured to obtain said second data by an operation based on said selection signal.

7. The semiconductor test apparatus according to claim 1, further comprising:
  a test control unit configured to stop, upon receipt of a test operation forced stop signal, a test on one of said at least one semiconductor memory under test, without stopping a test on another of said at least one semiconductor memory under test, wherein
  said error information storage unit stores a number of fetched error addresses and a plurality of error addresses each corresponding to one of said at least one semiconductor memory under test, and
  said error information storage unit includes a plurality of error information storage portions, each of said plurality of error information storage portions configured to store a corresponding error address and to generate said test operation stop signal if a number of error addresses is more than a predetermined number.

8. A semiconductor test method configured to determine whether a semiconductor memory has been successfully erased by a semiconductor test apparatus, including
  a control signal generating unit configured to supply a control signal to at least one semiconductor memory under test so as to initiate a predetermined operation, said at least one semiconductor memory under test having a plurality of cells, said predetermined operation including an erase operation of setting each of said plurality of cells to a first value and a subsequent rewrite operation of setting a subset of said plurality of cells to a second value,
  a judging unit configured to make a pass/fail judgement on each of said plurality of cells after said erase operation, where a cell having been set to said first value or successfully erased is judged as having passed and a cell not having been set to said first value or not having been successfully erased is judged as having failed, and
  an error information storage unit configured to sequentially assign a semiconductor memory test address corresponding to each of said plurality of cells and to store a plurality of semiconductor memory test results, said semiconductor memory test results including a semiconductor memory error address corresponding to a cell judged by said judging unit as having failed and corresponding error data,
  said semiconductor test method comprising the steps of:
    (a) performing said erase operation;
    (b) determining whether each of said plurality of cells was set to said first value so as to identify one of a successfully-erased cell and an unsuccessfully-erased cell;
    (c) storing said plurality of semiconductor memory test results; and
    (d) performing said rewrite operation only on said subset of said plurality of cells judged to have been successfully erased.

9. The semiconductor test method according to claim 8, further comprising:
    (e) immediately after said step (c), judging whether all of said plurality of cells have been successfully erased, and if so, terminating an erase test and if not, performing said step (a) again, wherein
      a first execution of said step (c) is performed on all of said plurality of memory cells, and a second and later executions of said step (c) is performed on, out of said plurality of cells, only a cell corresponding to said semiconductor memory error address in the next previous execution.

10. The semiconductor test method according to claim 9, wherein
  in said step (e), said erase test is also terminated if a number of times that all of said plurality of cells are judged as not having been successfully erased exceeds a predetermined number of times.

11. The semiconductor test method according to claim 10, wherein
  said semiconductor memory test results contain total error information including the number of fetched error addresses, and
  said steps (a) through (d) of said erase test are performed independently for each of said at least one semiconductor memory under test,
  said semiconductor test method further comprising the step of:
    (f) making a pass/fail judgement on said at least one semiconductor memory under test on the basis of said total error information, and if said at least one semiconductor memory under test is judged as having failed, forcefully stopping every processing of said erase test on said at least one semiconductor memory,
  said step (f) being performed after completion of said erase test on said at least one semiconductor memory under test in said step (e).

12. The semiconductor teat method according to claim 8, further comprising the steps of:
    (g) obtaining a specified address of said at least one semiconductor memory under test;
    (h) determining whether said specified address agrees with said semiconductor memory error address, and if so, obtaining said error data from said error information storage unit;
    (i) performing a rewrite operation of setting a cell corresponding to said specified address to said second value; and
    (j) repeating said steps (g) through (i) while incrementing said specified address for each address, and immediately after completion of the repetition of said steps (g) through (i), terminating the test if all of said plurality of cells has been successfully erased, and if not, performing said step (a) again.

13. A semiconductor test method configured to determine whether a semiconductor memory has been successfully erased by a semiconductor test apparatus, including
  a control signal generating unit configured to supply a control signal to at least one semiconductor memory under test so as to initiate a predetermined operation, said at least one semiconductor memory under test having a plurality of cells, said predetermined operation including an erase operation of setting each of said plurality of cells to a first value and a subsequent rewrite operation of setting a subset of said plurality of cells to a second value different from the first value said subset of said plurality of cells being a set of cells judged by said judging unit as having passed, a judging unit configured to make a pass/fail judgment on each of said plurality of cells after said erase operation, where a cell having been set to said first value is judged as having passed and a cell not having been set to said first value is judged as having failed, and an error information storage unit configured to sequentially assign a semiconductor memory test address corresponding to each of said plurality of cells and to store a plurality of semiconductor memory test results, said semiconductor memory test results including a semiconductor memory error address corresponding to a cell judged by said judging unit as having failed, corresponding error data, and total error information including a number of fetched error addresses, said semiconductor test method comprising the steps of:
(a) performing said erase operation;
(b) acquiring said total error information from said error information storage unit;
(c) making a pass/fail judgment on said at least one semiconductor memory under test on the basis of said total-error information; and
(d) writing information about said semiconductor memory error address into said at least one semiconductor memory under test if said at least one semiconductor memory under test is judged to have passed in said step (c).

* * * * *